United States Patent
Tanaka

(10) Patent No.: US 6,339,266 B1
(45) Date of Patent: Jan. 15, 2002

(54) PLANAR MOTOR DEVICE, STAGE UNIT, EXPOSURE APPARATUS AND ITS MAKING METHOD, AND DEVICE AND ITS MANUFACTURING METHOD

(75) Inventor: Keiichi Tanaka, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/665,055

(22) Filed: Sep. 19, 2000

Related U.S. Application Data

(63) Continuation of application No. PCT/JP99/01345, filed on Mar. 18, 1999.

(30) Foreign Application Priority Data

Mar. 19, 1998 (JP) .......................................... 10-090720
Mar. 19, 1998 (JP) .......................................... 10-090721
Mar. 20, 1998 (JP) .......................................... 10-092678

(51) Int. Cl.$^7$ .............................................. H02K 41/00
(52) U.S. Cl. ........................................ 310/12; 310/91
(58) Field of Search .............................. 310/12, 13, 14, 310/91, 68 R, 68 B

(56) References Cited

U.S. PATENT DOCUMENTS

| | | | |
|---|---|---|---|
| 5,138,206 A | 8/1992 | Schmidt | 310/12 |
| 5,352,946 A | * 10/1994 | Hoffman et al. | 310/12 |
| 6,114,781 A | * 9/2000 | Hazelton et al. | 310/12 |

FOREIGN PATENT DOCUMENTS

| | | |
|---|---|---|
| JP | 56-44375 | 4/1981 |
| JP | 64-85561 | 3/1989 |
| JP | 1-291691 | 11/1989 |
| JP | 3-178747 | 8/1991 |
| JP | 5-162040 | 6/1993 |
| JP | 5-60175 | 8/1993 |
| JP | 7-131966 | 5/1995 |

* cited by examiner

*Primary Examiner*—Tran Nguyen
(74) *Attorney, Agent, or Firm*—Oblon, Spivak, McClelland, Maier & Neustadt, P.C.

(57) ABSTRACT

An armature unit is made up of a matrix of armature coils each having a rectangular current path. A magnetic pole unit is made up of thrust generating magnets arranged in a matrix at arrangement periods each of which is an integral multiple of each of the arrangement periods at which the armature coils are arranged and having a rectangular magnetic pole surface, interpolating magnets for reinforcing the magnetomotive force, and a magnetic member. A mover is supported by air levitation above a guide surface by the pressure of pressurized gas, and the current supplied to the armature coils is controlled, thus driving the mover. An armature coil is housed in a closed space within a base, and a coolant is supplied from a cooling device into the closed space, thereby cooling the armature coils. Therefore, a substrate mounted on a substrate table integrated with the mover is precisely positioned.

64 Claims, 44 Drawing Sheets

PLANAR MOTOR DEVICE, STAGE UNIT, EXPOSURE APPARATUS AND ITS MAKING METHOD, AND DEVICE AND ITS MANUFACTURING METHOD

CROSS-REFERENCE TO RELATED APPLICATIONS

This is a continuation of International Application PCT/JP99/01345, with an international filing date of Mar. 18, 1999, the entire content of which is hereby incorporated by reference.

BACKGROUND OF THE INVENTION

1. Field of the Invention

The present invention generally relates to a planar motor device, a stage unit, an exposure apparatus and its making method, and a device and its manufacturing method. More particularly, the present invention relates to a planar motor device that has a mover and a stator and operates to drive the mover in a noncontacting manner in two-dimensional directions by electromagnetic force, a stage unit including a movable body to which the mover of the planar motor device is integrally attached, and an exposure apparatus incorporating the stage unit, and a method of making the exposure apparatus, and a device to be manufactured by using the exposure apparatus, and a device manufacturing method using the exposure apparatus.

2. Description of the Related Art

Conventionally, in a lithographic process for manufacturing semiconductor devices and liquid crystal display devices, an exposure apparatus that transfers a pattern formed on a mask or a reticle (hereunder generically referred to as a "reticle") through a projection optical system onto a substrate such as a wafer or a glass plate (hereunder generically referred to as a "substrate or wafer"), on which a resist is coated, has been used. This exposure apparatus is required to position the wafer at an exposure position with high precision. Thus, the wafer is held on a wafer holder by vacuum chucking, and the wafer holder is fixed onto a wafer table (that is, movable body) which structures a stage unit.

Recently, to position the wafer more quickly and with high precision without being affected by the mechanical accuracy of a guide surface, as well as to avoid mechanical friction and to prolong the life of the stage unit, a stage unit is being developed. This stage unit performs positional control of the wafer by supporting the movable body on which the wafer is placed above a supporting member by levitation and drives the movable body in a non-contacting manner. To accomplish such a stage unit, the key technology is the technique of levitating a mover above a stator of a planar motor device, and driving the mover in a predetermined direction (including a rotational direction) in an XY plane in order to move the mover. On driving such a planar motor device, a variable reluctance driving method and a Lorentz (electromagnetic) force method can be employed.

As a planar motor device used in the variable reluctance driving method, a motor as in a Sawyer motor, which has a structure of linear pulse motor s using the variable reluctance driving method respective to two axes being combined with each other, is the current mainstream. With the linear pulse motor using the variable reluctance driving method, it has a stator structured of; for instance, a plate-shaped magnetic substance having a gear tooth port ion (with an uneven shape) arranged along the longitudinal direction in equivalent intervals. It also has a mover that has a plurality of armature coils having an uneven portion different in phase with the gear tooth portion of the stator. The plurality of armature coils are arranged opposing the tooth portion of the stator, and are connected via a permanent magnet. And, the mover is driven by utilizing a force generated so as to minimize the magnetic reluctance between the stator and the mover at each point. That is, by adjusting and controlling the value and phase of pulse current supplied to each armature coil, the mover can be driven stepwise in a stepping operation.

Such a Sawyer type motor is configured of combining linear pulse motors that respectively correspond to 2 axes, on a moving plane. The driving portion which drive the mover movable in a plane in each axis direction, however, is separated from each other, thus making the mover heavy. To improve such inconvenience, an improved planar motor that can be moved on a plane by a single driving portion is being developed.

Also, with the planar motor device based on the Lorentz force method, the driving force is obtained by utilizing a Lorentz force F. This force is generated in the direction determined according to Fleming's left hand law in the presence of an electric current I and a magnetic flux density B, which are perpendicular to each other, and expressed by the following equation:

$$F = I \times B \times L \tag{1}$$

In this equation, F designates a force generated on a current path; and L denotes the length of the current path. A conventionally proposed Lorentz force driving planar motor device is disclosed in, for example, the U.S. Pat. No. 5,196,745. With this planar motor device, magnets are respectively arranged so that the adjacent pairs of magnetic arrays alternately have the opposite polarity in the X-axis direction on a mover (or a stator). The magnets in the Y-axis direction are arranged in the Y-axis direction so that the adjacent pairs of magnetic arrays alternately have the opposite polarity, without the array intersecting that of the X-axis direction. Also, on a stator (or a mover), multi-phase coils for driving operations in the X-axis direction are arranged along the X-axis while multi-phase coils for the Y-axis direction are arranged along the Y-axis direction without the array intersecting with those of the X-axis direction. Thus, the thrust in the X-axis direction is generated by generating a Lorentz force, by sending an electric current to the multi-phase coil oppositely facing the magnets used for driving operations in the X-axis direction. And, the thrust in the Y-axis direction is also generated by generating a Lorentz force, by sending an electric current to the multi-phase coil oppositely facing the magnets used for driving operations in the Y-axis direction.

Among the conventional planar motor devices described above, the planar motor devices employing the variable reluctance method obtained high thrust between magnetic substances or between a magnetic substance and a permanent magnet by magnetic attraction or by repulsive force. It was, however, essentially difficult to reduce thrust variation, that is thrust cogging, when the current was not supplied to create a magnetized state. Furthermore, thrust generated by current excitation varies with the movable position. Therefore, to stabilize the thrust force that varies with the movable position, a higher level of a current pattern was required.

Also, the variable reluctance motor usually is configured of what is called an iron core coil, which is formed of winding an armature coil around a magnetic substance.

Since it has a high armature coil inductance, the response time is slow; therefore a high voltage power supply is required to increase the response time, depriving the motor of its efficiency.

Furthermore, with the iron core coil, magnetic saturation of the iron core is caused due to the current flowing through it, so it is difficult to obtain the thrust linearity in a high current region making the design of the control system complex.

Meanwhile, with the conventional Lorentz force driving planar motor device, it excels in controllability, thrust linearity, and positioning ability. However, due to the limitation of the magnetic and coil array, the number of magnets and coils that are used for driving operations cannot be increased, therefore, it is difficult for this planar motor device to increase the thrust to be generated. Accordingly, it is difficult to move the mover, which carries an object of a certain weight such as a wafer holder or a substrate table, at a high speed.

Also, in order to use the planar motor device based on the variable reluctance driving method for precise positioning and to achieve high speed positioning, a large driving force is necessary. Naturally, a large current needs to be supplied to the armature coil. This, however, results in increasing the amount of heat generated in the armature coil. Such an increase in the amount of heat generated in the armature coil similarly occurs in the case of the planar motor device employing the Lorentz force method, in which the armature coil has to be supplied with a large current so as to obtain high thrust. Therefore, in consideration of the environment for a precise positioning system, it is essential for the planar motor to have a cooling system designed, and reduce thermal influence caused by the motor.

Furthermore, in the case of structuring a precise positioning stage with a planer motor device using a variable reluctance driving method, bearings, such as air bearings, to levitate the stage are essential. However, the planer motor device employing a variable reluctance driving method has a driving principle utilizing magnetic attraction as a driving force. The distance between the mover and the stator, therefore, is set at a very small value. The magnetic attraction force between the mover and stator serves as a reaction force against the stage levitation force by the air bearings. As a result, the amount of air supplied to levitate the stage and the power consumption of the air pump that supplies the air, are increased. In the case of using a planar motor device employing the Lorentz force driving method, when it is used for the driving source of the stage, it is desirable that the power consumption for levitating the stage is reduced.

SUMMARY OF THE INVENTION

The present invention has been made in view of the conditions above. Accordingly, a first object of the present invention is to provide a planar motor device that excels in controllability, thrust linearity, and positioning ability.

A second object of the present invention is to provide a stage that can perform and control high precision positioning of an object mounted on stage.

Also, a third object of the present invention is to provide an exposure apparatus that can perform high precision exposure by performing high precision positioning of a substrate and.

Finally, a fourth object of the present invention is to provide a device on which a fine pattern is formed with high accuracy.

To achieve the foregoing objects, according to a first aspect of the present invention, there is provided a first planar motor device comprising: an armature unit including a plurality of armature coils arranged in a matrix shape along a guide surface, which have a rectangular current path; and a magnetic pole unit arranged opposing the armature unit with respect to the guide surface, which has a plurality of thrust generating magnets having a rectangular magnetic pole surface with a side length longer than an arrangement period of the armature coil and is not equal to an integral multiple of the arrangement period, the plurality of thrust generating magnets arranged in a matrix shape in an arrangement period of an integral multiple of the arrangement period of the armature coils and having a different adjacent polarity of the magnetic pole surface in a row direction and a column direction, and the armature unit and the magnetic pole unit relatively move in a direction along the guide surface.

In the case of the first planar motor device of the present invention, to generate an efficient magnetic flux, that is to generate a magnetic circuit with a high magnetic density, a magnetic circuit which reluctance is low is structured. This is structured, by arranging the thrust generating magnets in a magnetic pole unit in the shape of a matrix, so that the polarities of adjacent magnet pole surfaces alternately differs from each other. And, in the armature coil unit, the armature coils are arranged in the shape of a matrix, and the amount and direction of the Lorentz force generated in the armature coils are changed by changing the amount and direction of the current being supplied to the armature coils. Accordingly, there are no exclusive driving direction of the respective thrust generating magnets arranged in the magnetic pole unit, and the respective armature coils arranged in the armature unit. Consequently, when the magnetic pole unit an d the armature unit relatively move in a desired direction, every thrust generating magnets and armature coils opposing these magnets can be used for moving them in the desired driving direction. This allows motor driving by a high thrust.

With the first planar motor device of the present invention, the matrix-shaped arrangement period of the thrust generating magnets of the magnetic pole unit is determined at a value that is an integral multiple of the arrangement period of the armature coils of the armature unit. Therefore, when the arrangement direction of the thrust generating magnets is parallel to that of the armature coils, the positional relationship between a thrust generating magnet and an armature coil opposing this magnet is similar to that of another thrust generating magnet and an armature coil opposing this magnet. Accordingly, when the magnetic pole unit and the armature unit are relatively moved to perform a translation in a desired direction, the direction of electric current supplied to the armature coil depends on the polarity of the magnetic pole surface opposing the armature unit. Basically, however, when an electric current is supplied to an armature coil opposing a thrust generating magnet to generate a thrust in the desired driving direction, the driving unit can similarly supply current other armature coils opposing the thrust generating magnets, which simplifies the control of motor driving.

Also, with the first planar motor device of the present invention, the side length of the magnetic pole surface of the thrust generating magnet is determined at a value longer than the arrangement period of the armature coils. It is also a value that is not equal to the integral multiple of the arrangement period of the armature coils. Accordingly, the positional relationship between the thrust generating magnet and the armature coil in which the thrust becomes zero in regardless of the current supplied to the armature coil does not exist. The thrust becomes zero, when the side length of the magnetic pole surface of the thrust generating magnet is an integral multiple of the arrangement period of the armature coils.

Therefore, according to the first planar motor device of the present invention, by utilizing the merits of the Lorentz force driving method that excels in controllability, thrust linearity, and positioning ability, a stable and high powered thrust can be generated by a simple control of the current supplied.

In the first planar motor device of the present invention, the magnetic pole unit can be structured further comprising an interpolating magnet arranged on a magnetic flux path formed on a magnetic pole surface side of the thrust generating magnet opposing the armature unit, the path formed between the thrust generating magnets which are adjacent in the row direction and the column direction, the interpolating magnet being a part of a magnetic circuit, and reinforcing a magnetomotive force. In such a case, on structuring a magnetic circuit, both the thrust generating magnets and the interpolating magnet serve as a magnetomotive source. This result in increasing in the absolute value of the magnetic flux density B of the magnetic flux formed on the current path of the armature coil due to the magnetic pole unit.

In general, in the case of increasing the numbers of the rows and columns of the arrangement of the thrust generating magnets, when the magnetic pole unit and the armature unit relatively moves and the position where the magnetic flux is created on the armature unit side also move, the polarity of the magnetic pole surfaces adjacent in the row direction and column direction alternately differ. This causes the direction of the magnetic flux to be frequently reversed. So, for example, in the case of using magnetic members to reduce the reluctance at the armature unit side, the direction of the magnetic flux is frequently reversed, in turn generating an eddy current in the magnetic member. As a result, the reluctance is increased, which prevents a high-density magnetic flux from being generated, increasing the energy loss.

Thus, according to the first planar motor device of the present invention, with consideration to this view, the thrust generating magnets can be arranged in a shape of a two-by-two matrix. In such a case, the frequency of the direction of the magnetic flux reversing at the armature unit side while the magnetic pole unit and the armature unit are relatively moving is minimized. Therefore, the magnetic circuit can keep a low reluctance, thus, making it possible for a high thrust to be generated and reducing the loss. Also, in such a case, with the magnet pole unit in which the thrust generating magnets are arranged in a square matrix shape so as to symmetrically generate a magnetic flux with a high magnetic flux density, the number of thrust generating magnets is minimized, naturally, simplifying the configuration.

With the first planar motor device of the present invention, the external shape of the magnetic pole surface of the armature unit opposing the magnetic pole unit or the magnetic pole surface of the thrust generating magnet may be of various shapes. However, the external shape of a surface of the armature coil which opposes the magnetic pole unit can be a square, and the magnetic pole surface of the thrust generating magnets can be of a square shape. In such a case, when the magnetic pole unit and the armature unit move relatively in one of two directions being perpendicular, electric current can be supplied to the armature coils arranged along in the moving direction similarly, as when these units move relatively in the other direction. That is, in the two directions perpendicular to each other, electric current can be symmetrically supplied to the armature coils. Accordingly, the magnetic pole unit and the armature unit can be relatively moved in the two-dimensional direction by a simplified control.

In the first planar motor device, various relations can be considered on the shape and arrangement of the armature coils, and the shape and arrangement of the thrust generating magnets. The current path length on an outer side of the armature coil can be respectively around 3 times longer than a current path on an inner side, a magnetic pole surface length of one side of the thrust generating magnets can be respectively 4 to 5 times longer than the current path on the inner side, and the arrangement period of the thrust generating magnets can be around 6 times longer than the current path on the inner side. In such a case, the arrangement period of the thrust generating magnets is twice, that is, the smallest integral multiple of the arrangement period when the armature coils are closely arranged in the shape of a matrix. Also, the length of one side of the thrust generating magnet may be determined so as to be a non-integral multiple of the length of, for instance, 4/3 to 5/3 times the length of the external of the armature coil.

And, with the first planar motor device of the present invention, the first planar motor device may further comprise a first magnetic member to support the armature coils at a side opposite to the magnetic pole unit. In such a case, the magnetic circuit is structured at the side opposite to the magnetic pole unit of the armature coils via the first magnetic member. Thus, a stable magnetic circuit with low reluctance can be structured, and the magnetic flux can be confined within the first magnetic member. Consequently, a magnetic flux having a high-density can be generated at the position where the armature coils are arranged, as well as prevent the members arranged at the side opposite to the magnetic pole unit of the armature coils from being magnetically affected.

According to the first planar motor device of the present invention, it can be structured to further comprise a second magnetic member to support the thrust generating magnets at a side opposite to the armature unit. In such a case, the magnetic circuit is structured at a side opposite to the armature unit via the second magnetic member. Thus, a stable magnetic circuit having a low reluctance can be configured, as well as confine a magnetic flux in the second magnetic member. Consequently, a magnetic flux having a high-density can be generated at positions where the armature coils are arranged. And the members arranged at the side opposite to the magnetic pole unit of the armature coils can be kept from being magnetically affected.

Also, with the first planar motor device in the present invention, it may further comprise at least one guide member arranged between the armature unit and the magnetic pole unit which is made of a material non-magnetic and non-conductive and forms the guide surface. A non-magnetic material, in this case, is a material which has permeability sufficiently small compared with that of magnetic materials, such as iron, and is almost equal to that of air. And, a non-conductive material, in this case, is a material, which has conductivity sufficiently low compared with that of conductive materials, such as copper, and is almost equal to that of air. In such a case, the magnetic pole unit levitated so that it is not in direct contact with the guide member by the exhausted air from the magnetic unit side to the guide member, and this state is maintained. Since the guide member is non-magnetic and non-conductive, it does not affect the magnetic flux generated by the magnetic pole unit. Accordingly, the magnetic pole unit and the guide member (thus, the armature unit) can easily be put into a noncontact state while the thrust of the planar motor device is maintained, thus, a high-speed relative movement by a low thrust can easily be achieved.

And, with the first planar motor device of the present invention further having the guide member, it may have a structure of further comprising a supporting member attached to the magnetic pole unit and has a first vent portion to exhaust a pressurized gas to the guide surface, the supporting member being adapted to support the magnetic pole unit by air levitation via a predetermined air gap. In such a case, the magnetic pole unit is supported by air levitation above the guide surface by the exhausting pressure of the pressurized air blown from the vent portion of the supporting member attached to the magnetic pole unit to the guide surface, that is, the static pressure of the pressurized air in the air gap between the supporting member and the guide surface. Then, by supplying electric current to a plurality of armature coils of the stator, the magnetic unit and the supporting member are integrally driven along the guide surface by the Lorentz force generated. It is preferable that the vent portion of the supporting member is arranged in the vicinity of the magnets of the magnetic pole unit, so as to support the magnetic pole unit more efficiently by air levitation.

The first planar motor device, which has the guide member and the supporting member, may further comprise a base which includes the guide member and forms a closed space in its interior where the plurality of armature coils are arranged. In such a case, since the armature coils which generates heat by the electric current supplied are housed in the closed space in the base, the thermal influence to the surrounding environment is reduced. In this case, the base is preferably made of a high heat insulating material.

In this case, the first planar motor device may have a structure of further comprising a cooling device which supplies a coolant to the closed space and cools the armature coils. In such a case, by supplying the coolant into the closed space by the cooling device the respective armature coils can be efficiently cooled. Thus, the armature coils are efficiently cooled, the thermal influence upon the surrounding environment is reduced, and the power consumption for cooling can be decreased.

With the first planar motor device, which has the guide member and the supporting member, it may have a structure further comprising a plurality of cases which respectively house the plurality of armature coils. In such a case, compared with when cases are not provided in the motor, the thermal influence on the surrounding environment by the heat generated by the coils can be reduced. In the case of this motor having such cases, the cases and the guide member are preferably made of a high heat insulating material.

It is preferable for the first planar motor device, to further comprise a cooling device to respectively cool an interior of the plurality of cases. In such a case, the armature coils which are respectively arranged in each case, can be individually and effectively cooled.

Also, the first planar motor device may be configured so that an upper surface of the cases respectively structure the guide surface. In such a case, since the cases serve as the guide member, there is no need to provide a guide member in addition to the cases, simplifying the configuration of the planar motor device.

Regardless of whether the first planar motor further having the guide member, includes the supporting member, this planar motor may further comprise a base which includes the guide member and forms a closed space in its interior where the plurality of armature coils are arranged. In such a case, as well, since the armature coils generating the heat by the current supplied are housed in the closed space of the base, the thermal influence on the surrounding environment by the heat generated by the coils can be reduced. In this case, as well, the first planar motor device may have a structure further comprising a cooling device which supplies a coolant to the closed space and cools the armature coils.

Also, with the first planar motor device further compring the guide member, regardless of whether it may have a supporting member, the first planar motor device may have a structure further comprising a plurality of cases which respectively house the plurality of armature coils. In this case, the thermal influence on the surrounding environment is reduced, in comparison with the case when cases are not provided in the motor. In the case of the planar motor device having such cases, this motor may preferably have a structure further comprising a cooling device to respectively cool an interior of the plurality of cases. Moreover, this motor may be configured so that an upper surface of the cases respectively structure the guide surface.

According to a second aspect of the present invention, there is provided a second planar motor device, comprising: an armature unit including a plurality of armature coils arranged in a matrix shape along a guide surface, which have a rectangular current path; and a magnetic pole unit arranged opposing the armature unit with respect to the guide surface including a plurality of thrust generating magnets which have a rectangular magnetic pole surface and are arranged so as to have a different polarity of an adjacent magnet pole surfaces alternately, and interpolating magnet to reinforce a magnetomotive force, which is arranged on a magnetic flux path formed on a magnetic pole surface side of the thrust generating magnet opposing the armature unit, the path formed between the thrust generating magnets which are adjacent, and the armature unit and the magnetic pole unit relatively move in a direction along the guide surface.

With the second planar motor device, since the magnetomotive force source becomes both the thrust generating magnets and the interpolating magnets on structuring the magnetic circuit, the absolute value of the magnetic flux density B of the magnetic flux generated on the current path of the armature coils due to the magnetic pole unit can be increased. Therefore, while reducing the power consumption of the armature unit, a high thrust can be stably generated by utilizing the merits of the Lorentz force driving method that excels in controllability, thrust linearity, and positioning ability.

Similarly as in the case of the first planar motor device of the present invention, with the second planar motor device of the present invention, it may have a structure in which an external shape of a surface of the armature coil which opposes the magnetic pole unit is a square, and the magnetic pole surface of the thrust generating magnets is of a square shape. Furthermore, a current path length on an outer side of the armature coil can be respectively around 3 times longer than a current path on an inner side, a magnetic pole surface length of one side of the thrust generating magnets can be respectively 4 to 5 times longer than the current path on the inner side, and the arrangement period of the thrust generating magnets can be around 6 times longer than the current path on the inner side.

And, similarly as in the case of the first planar motor device of the present invention, with the second planar motor device of the present invention, it may have a structure further comprising a first magnetic member to support the armature coils at a side opposite to the magnetic pole unit. Also, the second planar motor device of the present invention may further comprise a second magnetic member to support the thrust generating magnets at a side opposite to the armature unit. And, the second planar motor device may have a structure further comprising at least one guide member arranged between the armature unit and the magnetic pole unit which is made of a material non-magnetic and non-conductive and forms the guide surface.

Similarly as in the case of the first planar motor device of the present invention, with the second planar motor device of the present invention having the guide member, it may have a structure further comprising a supporting member attached to the magnetic pole unit and has a first vent portion for exhausting a pressurized gas to the guide surface, the supporting member being adapted to support the magnetic pole unit by air levitation via a predetermined air gap. Furthermore, the second planar motor device may have a structure, further comprising a base which includes the guide member and forms a closed space in its interior where the plurality of armature coils are arranged. And, the planar motor may further have a plurality of cases, which respectively house the plurality of armature coils individually.

In the case of the second planar motor device having the base, it may have a structure further comprising a cooling device which supplies a coolant to the closed space and cools the armature coils. And, with the second planar motor device, which further comprises a plurality of cases may further comprise a cooling device to respectively cool an interior of the plurality of cases. Further, this planar motor device may be configured so that an upper surface of the cases respectively structure the guide surface.

With the second planar motor device of the present invention which has the restricting elements or additional elements similar to the first planar motor device of the present invention, the restricting elements and additional elements in the second planar motor device act similarly, producing similar effects as of the first planar motor device.

According to a third aspect of the present invention, there is provided a third planar motor device, comprising: a magnetic pole unit which has at least one magnet and moves along a predetermined guide surface in two-dimensional directions; a supporting member attached to the magnetic pole unit and has a first vent portion to exhaust a pressurized gas to the guide surface, the supporting member being adapted to support the magnetic pole unit by air levitation via a predetermined air gap; and a stator including a plurality of armature coils arranged at a side opposite to the magnetic pole unit in respect to a guide surface in two-dimensional directions along the guide surface.

With the third planar motor device, the magnetic pole unit is supported by air levitation above the guide surface by the blowing pressure of the pressurized air blown from the vent portion of the supporting member attached to the magnetic pole unit to the guide surface, namely, the static pressure of the pressurized air in the air gap between the supporting member and the guide surface. Then, the magnetic unit and the supporting member are integrally driven along the guide surface by the Lorentz force which is generated by electric current being supplied to a plurality of armature coils of the stator.

That is, in this case, compared with the variable reluctance driving planar motor device which employs a magnetic attraction force as a driving force based on a driving principle, the magnetic attraction force acting between the magnet of the magnetic pole unit and the stator-side yoke is lower due to the fact that the armature coil is arranged between the magnet structuring the magnetic pole unit and the stator-side yoke. Therefore, the power consumption of the gas source which is required to supply the pressurized gas used to levitate the stator (that is, the magnetic pole unit and the supporting member), can be reduced. It is preferable that the vent portion of the supporting member is arranged in the vicinity of the magnets of the magnetic pole unit, to support the magnetic pole unit more efficiently by air levitation.

The third planar motor device of the present invention may be structured so that the magnetic pole unit is freely attachable to and detachable from the supporting member. In such a case the magnetic pole unit can be separated from the supporting member, therefore, the maintainability of the motor is enhanced.

The third planar motor device may be structured so that the supporting member has a second vent portion which exhausts a pressurized gas to the magnetic pole unit so as to support the magnetic pole unit by air levitation against a downward force when the magnetic pole unit is attached to the supporting member, the downward force acting in a direction of gravity and is a sum of a magnetic attraction force of the magnetic pole unit, the armature coil, and the stator and a weight of the magnetic pole unit itself. In such a case, when the magnetic pole unit is attached (or assembled) to the supporting member, the magnetic pole unit is supported by air levitation by the exhausting pressure of the pressurized gas released from the second vent portion of the supporting member. Thus, the magnetic pole unit can be prevented from being rapidly attracted to the supporting member by the magnetic attraction force acting between the magnetic pole unit and the stator. This simplifies the attachment of the magnetic pole unit to the supporting member. And, also in the case of detaching the magnetic pole unit from the supporting member, the exhausting pressure of the pressurized gas released from the second vent portion of the supporting member accelerates this separation operation. As a result, the attachment/detachment of the magnetic pole unit to the supporting member can be simplified, thus, the maintainability of the motor is enhanced even more.

In this case, needless to say, the first vent portion and the second vent portion may be connected separately to the supplying source of the pressurized air, and the pressurized gas may be released from the first vent portion individually from the second vent portion. However, with the third planar motor device of the present invention, the supporting member may further comprise a switching mechanism which switches an exhaustion of a gas between an exhaustion of a pressurized gas from the first vent portion and an exhaustion of a pressurized gas from the second vent portion. In such a case, the first vent portion and second vent portion of the pressurized gas can be connected to the same source, and the gas exhausting from the vent portion can be switched by the switching mechanism between the two vent portions. Therefore, the structure of the device can be simplified.

With the third planar motor device of the present invention, it is preferable that the supporting member further comprises a suction portion to vacuum chuck the supporting member to the guide surface, the supporting member being able to control a dimension of the predetermined air gap by adjusting an exhaustion pressure of the pressurized gas released from the first vent portion and a vacuum suction force of the suction portion. In such a case, even when there is an uneven portion on either the guide surface or the surface opposing the guide surface of the supporting member, by suppressing vibrations, the air gap between the guide surface and the surface opposing the guide surface of the supporting member (what is called a bearing gap) can be maintained at a desired dimension.

Furthermore, with the third planar motor device the supporting member can have an attachment/detachment mechanism to have the magnetic pole unit attached and detached. In such a case, the magnetic pole unit can be attached to and detached from the supporting member by the attaching/detaching mechanism, therefore, simplifies the attachment/detachment operation of the magnetic pole unit with the supporting member.

Also, the third planar motor device of the present invention may further have a structure comprising a base which forms the guide surface as well as form a closed space in its interior where the plurality of armature coils are arranged. In such a case, since the armature coils which generates heat by the electric current supplied are housed in the closed space in the base, the thermal influence to the surrounding environment is reduced. In this case, preferably, the base is made of a high heat insulating material.

The third planar motor device may have a structure further comprising a cooling device which supplies a coolant to the closed space and cools the armature coils. In such a case, the armature coils can respectively be cooled efficiently by the coolant supplied into the closed space by the cooling device. Thus, the armature coils are efficiently cooled, which reduces the thermal influence upon the surrounding environment, and the power consumption for cooling can also be reduced.

And, the third planar motor device may have a structure further comprising a plurality of cases which respectively house the plurality of armature coils. In such a case, the thermal influence on the surrounding environment due to the heat generation by the coils can be reduced compared with the case of not having the cases arranged in the device. When the device is provided with the cases, the cases and the guide member are preferably made of a high heat insulating material.

It is preferable for the third planar motor device to further comprise a cooling device to respectively cool an interior of the plurality of cases. In such a case, the armature coils, arranged in each case, can be individually and effectively cooled.

Also, the third planar motor device may be structured so that an upper surface of the cases respectively structure the guide surface. In such a case, the cases serve as the guide member, therefore making it possible to omit a separate guide member in addition to the cases, simplifying the structure.

According to a fourth aspect of the present invention, there is provided a fourth planar motor device, comprising: a magnetic pole unit which has at least one magnet and moves along a predetermined guide surface in two-dimensional directions; a base which forms the guide surface and has a closed space formed in its interior; an armature unit including a plurality of armature coils housed in the closed space of the base which are arranged in two-dimensional directions along the guide surface at predetermined intervals; and a cooling device which supplies a coolant into the closed space to respectively cool the armature coils.

With the fourth planar motor device, among the plurality of armature coils, electric current is supplied to the armature coil opposing the magnet of the magnetic pole unit. The magnetic pole unit is driven along the guide surface by the Lorentz force generated according to the amount and direction of the electric current supplied to the armature coil. In the case of continuously driving the magnetic pole unit in a certain direction, electric current is supplied to the armature coil opposing the magnet at each movement position of the magnetic pole unit. Therefore, the armature coil supplied with the electric current generates heat. However, the armature coils are housed in the closed space in the base, and the coolant is supplied to this closed space by the cooling device to cool the respective coils. Thus, the armature coil can be efficiently cooled, and the thermal influence to the surrounding environment is reduced. The power consumption for cooling, can also be reduced.

The fourth planar motor of the present invention may be configured so that the closed space is divided by a dividing member arranged on an opposite side to the guide surface of the plurality of armature coils into a first chamber where the plurality of armature coils are housed, and a second chamber formed by a remaining space, and an inlet opening and an outlet opening are respectively formed in the dividing member, and a coolant path is formed in the base in which a coolant supplied from the cooling device flows into the first chamber via the inlet opening and then flows out to the second chamber via the outlet opening. In such a case, the path of the coolant is formed in the base so that the coolant supplied from the cooling device flows into the first chamber via the inlet opening and then flows out into the second chamber via the outlet opening. Thus, not only can the first chamber in which the plurality of armature coils are housed be directly cooled by the coolant, but the dividing member can also be cooled in the second chamber. Consequently, the armature coils can be cooled more efficiently.

In this case, it is preferable for the fourth planar motor device to further comprise secondary cooling fins respectively made of a high thermal conductive material and arranged on the path of the coolant which flows out through the outlet opening. In such a case, the cooling efficiency of the path of the armature coil can be improved.

Also, the fourth planar motor device of the present invention may be configured so that the closed space formed within the base is divided into a plurality of small chambers which respectively house the armature coils, and the plurality of small chambers respectively have an inlet opening and an outlet opening to supply the coolant from the cooling device. In such a case, the armature coils are individually and respectively housed in the small chambers, and an outlet opening and an inlet opening for a coolant supplied from the cooling device are formed in each of the small chambers. Thus, the coolant supplied from the cooling device flows into the respective small chambers through the inlet opening and flows out through the outlet opening. Consequently, the small chambers, thus, the armature coils can be cooled individually and efficiently. In this case, the fourth planar motor device may have a structure of further comprising a plate-shaped non-magnetic member which serves as the guide surface and is arranged so as to cover the plurality of small chambers. In this case, a space may be arranged between the small chamber and the non-magnetic member.

Furthermore, needless to say, the small chambers may be formed, by dividing the closed space within the base by the dividing members. However, the fourth planar motor device may be configured so that the small chambers are respectively structured of a plate-shaped member arranged at a side opposite to the guide surface of the plurality of armature coils, and a plurality of box-shaped cases which respectively have an opening on a surface opposing the plate-shaped member and have an opposite side of the surface formed as the guide surface, and an inlet opening and an outlet opening to respectively supply a coolant to the small chambers are formed in the plate-like member in respect to the plurality of cases. In such a case, by arranging the plate-shaped member in the internal space of the base, and arranging the plurality of cases in which armature coils are already housed, at a predetermined position on the plate-shaped member, a plate (the guide surface) which appears to be a single plate, is formed on a surface opposite to the plate-shaped member. Accordingly, each of the small chambers, namely, the armature coils arranged in each case can be individually and efficiently cooled, as well as the base side (namely, the stator side) being easy to attach from a certain direction.

In this case, the fourth planar motor device may be structured so that terminals of the armature coils are exposed from an open end of the case, and a socket portion where the terminal is fitted is provided in a corresponding part of the plate-shaped member. In such a case, by simply attaching the respective cases to the plate-shaped member, the wiring for supplying electric current to each of the armature coil is also completed.

Also, the fourth planar motor device may be configured so that an additional chamber is arranged in an opposite side to the guide surface of the small chambers within the base, and a coolant path is formed in the base in which a coolant supplied from the cooling device flows into the case respectively via the inlet opening and then flows out to the additional chamber via the outlet opening. In such a case, the path of the coolant is formed in the base so that the coolant supplied from the cooling device flows into each case via the inlet opening and then flows out into the additional chamber via the outlet opening. Thus, not only can each case in which the plurality of armature coils are respectively housed be directly cooled by the coolant, but the plate-shaped member can also be cooled in the additional chamber side. Consequently, the armature coils can be cooled more efficiently.

And, it is preferable for the fourth planar motor device to further comprise secondary cooling fins respectively made of a high thermal conductive material and arranged on the path of the coolant which flows out through the outlet opening. In such a case, the cooling efficiency of the path of the armature coil can be improved.

Moreover, the fourth planar motor device of the present invention may be configured so that the armature coils are respectively a ring-shaped coil with a space formed in its central portion, and the cooling device supplies the coolant to each of the armature coils via the space formed in its central portion from an opposite side of the guide surface of the armature coils. In such a case, the side surface of the space formed in the central portion of the armature coil and the side surface facing the guide surface of the armature coils can be efficiently cooled, therefore, at least the thermal influence on the guide surface side can be reduced.

In this case, the fourth planar motor may further comprise straightening fins to regulate a path of the coolant which flows from the space formed in its central portion to its surroundings. In such a case, the straightening fins can regulate the path of the coolant flowing from the space in the central portion of the armature coils along the surface side of the guide-surface of the armature coil to the outlet opening formed at a predetermined position. Thus, by setting the path so that the coolant flowing along the surface side of the guide-surface of the armature coils uniformly as much as possible, the surface side of the guide-surface of the armature coils can be cooled evenly.

The fourth planar motor device of the present invention may be configured so that the base has a plurality of coolant injecting joints and at least one coolant discharging joint attached, and the cooling device has an end respectively connected the coolant injecting joint via a coolant supplying pipe, and also has another end connected to the coolant discharging joint via a coolant discharging pipe. In such a case, the coolant is supplied into the base through the cooling device, the coolant supplying pipe, and the plurality of coolant supplying joints. This coolant flows through the coolant passage in the base and cools each of the armature coils. Then, the coolant which temperature has risen as a result of this cooling operation, returns to the cooling device through the coolant discharging joint and the coolant discharging pipe, and cooled in the cooling device to be supplied again into the base to cool the armature coils. Thus the coolant is recycled through the cooling device and the base. That is, the armature coils can always be cooled by a predetermined amount of coolant, resulting to be an economical device.

According to a fifth aspect of the present invention, there is provided a fifth planar motor device comprising: a magnetic pole unit which has at least one magnet and moves along a predetermined guide surface in two-dimensional directions; a plurality of armature coils arranged with respect to the guide surface at predetermined intervals in two-dimensional directions along the guide surface at a side opposing the magnetic pole unit; and a plurality of cases which individually house the plurality of armature coils.

With the fifth planar motor device according to the present invention, among the plurality of armature coils, electric current is supplied to the armature coil opposing the magnet of the magnetic pole unit. The magnetic pole unit is driven along the guide surface by the Lorentz force generated according to the amount and direction of the electric current supplied to the armature coil. In the case of continuously driving the magnetic pole unit in a certain direction, electric current is supplied to the armature coil opposing the magnet at each movement position of the magnetic pole unit. Therefore, the armature coil supplied with the electric current generates heat. However, the armature coils are housed in the closed space in the base, and the coolant is supplied to this closed space by the cooling device to cool the respective coils. Thus, the armature coil can be efficiently cooled, and the thermal influence to the surrounding environment is reduced. In this case, preferably, the cases and the guide surface are made of high heat insulating materials.

The fifth planar motor device of the present invention may have a structure further comprising a cooling device to respectively cool an interior of the plurality of cases. In such a case, the armature coils provided in each cases can be individually and efficiently cooled.

Also, the fifth planar motor device of the present invention may be structured so that an upper surface of the cases respectively structure the guide surface. In such a case, the cases serve as the guide member. Thus, it is unnecessary to provide a guide member separately, in addition to the cases, simplifying the structure of the device.

According to a sixth aspect of the present invention, there is provided a stage device, comprising: a planar motor device according to the present invention; a movable body which moves integrally with one of a magnetic pole unit and an armature unit; and a controller which controls at least one of an amount and direction of electric current supplied respectively to the armature coils of the armature unit.

With this aspect, the controller controls at least one of the amount and direction of the electric current supplied to the armature coils of the planar motor device so as to relatively move the magnetic pole unit and the armature units in a desired direction of translation or rotation. Accordingly, the stage device excels in controllability, thrust linearity, and positioning ability, as well as being able to move the movable body with good accuracy.

The stage device of the present invention may have a structure further comprising: a position detecting system which detects a positional relationship between the magnetic pole unit and the armature unit; and the controller can control at least one of the amount and direction of electric current supplied respectively to the armature coils of the armature unit according to a detecting result of the position detecting system. In such a case, based on the accurate positional relationship between the magnetic pole unit and the armature unit the controller which is detected by the position detecting system, the controller controls at least one of the amount and direction of electric current supplied to the respective armature coils of the planar motor device. Consequently, the position of the movable body can be controlled with extremely high precision.

In this case, the stage may be configured so that the controller specifies respectively an intersection area between a magnetic flux path due to the magnetic unit and the armature coils based on the detection result of the position detecting system, and controls at least one of the amount and direction of electric current supplied respectively to the armature coils according the specified intersection area. In such a case, the controller first specifies an intersection area between the magnetic flux path due to the magnetic pole unit and the current path of electric current for the armature coil from the detection results of the position detecting system. Subsequently, in accordance with the specified intersection area, the controller then determines at least one of the amount and direction of the electric current to be supplied to each of the armature coil so as to provide the desired driving force in the desired direction. Then, based on the results, the controller controls at least one of the amount and direction of the electric current supplied to each of the armature coils, resulting in moving the movable body with high accuracy.

When the magnetic flux density distribution due to the magnets of the magnetic pole unit (namely, the thrust generating magnets) is almost uniform at the position where the corresponding armature coils are arranged, and the current density of the electric current flowing through each armature coils is almost uniform, the controller can obtain at least one of the amount and direction of the electric current supplied to the respective armature coils according to the volume of the specified intersection area. Moreover, if the shape of the current path of electric current supplied to the armature coils is approximately uniform with respect to the direction of the magnetic flux, the controller can obtain at least one of the amount and direction of the electric current supplied to each armature coils according to the area of the intersection area between the magnetic flux due to the magnetic pole unit and the surface, which faces the magnetic pole unit, of the armature coils.

According to a seventh aspect of the present invention, there is provided an exposure apparatus, comprising: an illumination system which emits an energy beam for exposure; and a stage device according to the present invention, which mounts an object to be arranged on a path of the energy beams. Thus, an object arranged on the path of the energy beam is mounted on the stage device of the present invention. Accordingly, the position of this object is controlled with good precision, resulting in an exposure with high precision.

The exposure apparatus of the present invention may be structured so that the object is a substrate onto which a predetermined pattern is transferred by exposing the energy beams. In such a case, positional control of the substrate to be exposed is performed with high accuracy by using the stage device of the present invention. Consequently, the predetermined pattern can be transferred onto the substrate with high precision.

According to an eighth aspect of the present invention, there is provided a making method of an exposure apparatus comprising: providing a planar motor device according to the present invention; providing a movable body which moves integrally with one of a magnetic pole unit and an armature unit; and providing a control unit which controls at least one of the amount and direction of electric current supplied respectively to the armature coils of the armature unit. According to this aspect, the exposure apparatus of the present invention can be made by mechanically, optically, and electrically combining the illumination system, the planar motor device, the movable body, the controller, and various other components with one another and adjusting these constituent elements.

The making method of the exposure apparatus of the present invention may further comprise providing a position detecting system which detects a positional relationship between the magnetic pole unit and the armature unit. In such a case, an exposure apparatus can be made which can control the position of the movable body in accordance with the accurate positional relationship of the magnetic pole unit and the armature unit detected by the detecting system.

Additionally, in a lithographic process, by using the exposure apparatus to transfer a predetermined pattern onto a substrate, a device having a fine pattern can be manufactured. Thus, according to another aspect of the present invention, there is provided a device manufactured by the exposure apparatus of the present invention. And in a lithographic process, the present invention is a device manufacturing method, in which a predetermined pattern is transferred onto the substrate by using the exposure apparatus that is made by the exposure apparatus making method of the present invention.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DESCRIPTION OF THE PREFERRED EMBODIMENTS

Figure 1:
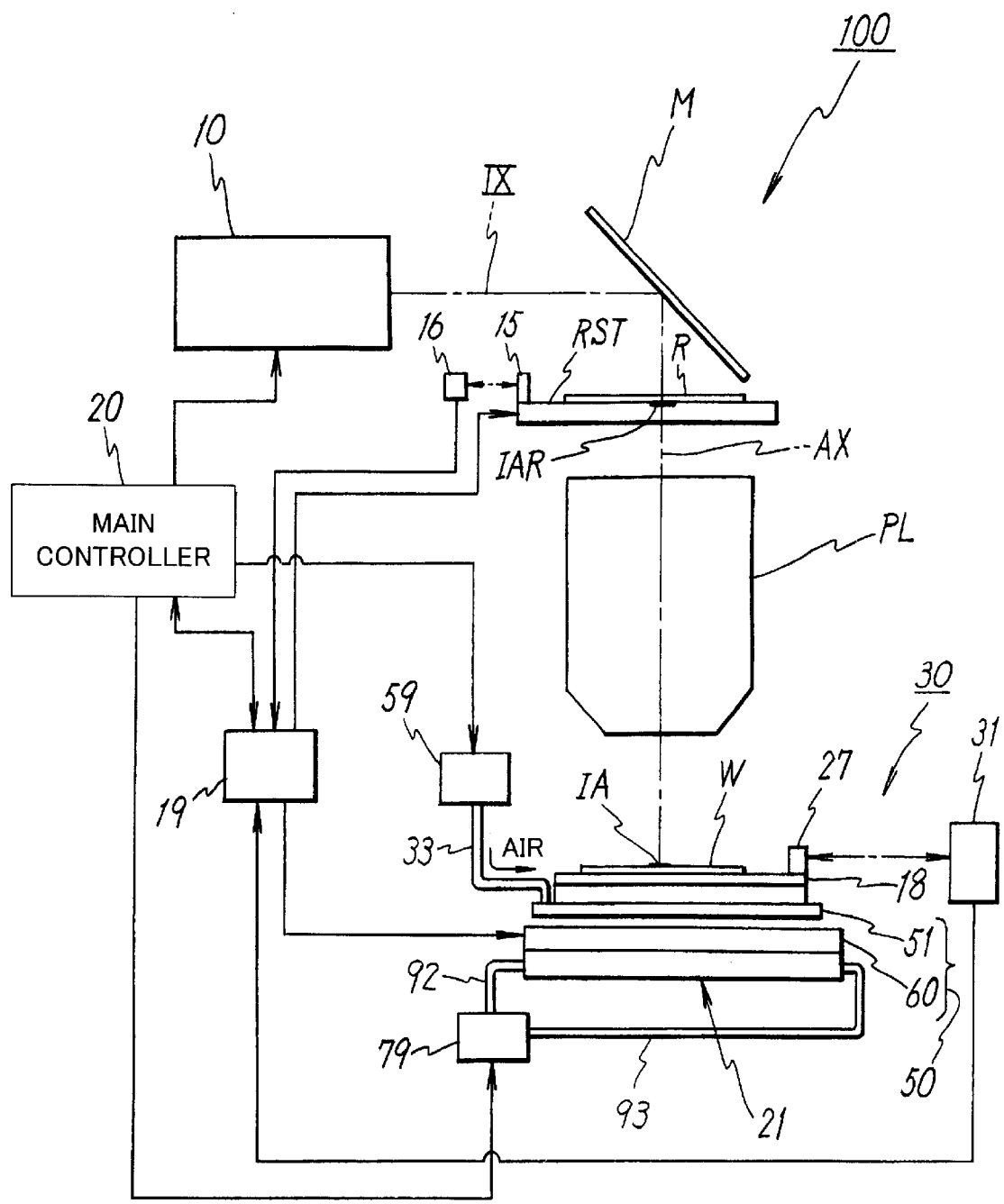
FIG. 1 is a diagram illustrating the general configuration of an exposure apparatus that is an embodiment of the present invention.

An embodiment of the present invention will be described in detail by referring from FIG. 1 to FIG. 38. FIG. 1 illustrates the entire configuration of an exposure apparatus 100 that is an embodiment of the present invention. The exposure apparatus 100 is a so called a scanning exposure apparatus based on the step and scan exposure method.

The exposure apparatus 100 has: an illumination system 10; a reticle stage RST holding a reticle R on which a predetermined pattern is formed; a projection optical system PL; a stage unit 30 serving as a substrate stage adapted to drive a wafer W in two-dimensional directions, that is, in the X-axis direction and the Y-axis direction on an XY-plane; and a control system for controlling these elements.

The illumination system 10 comprises: a light source unit; a shutter; a secondary light source forming optical system; a beam splitter; a light collecting lens system; a reticle blind; and an image forming lens system (each of which is not shown in FIGS.). This illumination system emits an illuminating light for exposure, which has an almost uniform illumination distribution, onto a mirror M of FIG. 1. The mirror M deflects the optical path of the illuminating light vertically downward. The illuminating light then illuminates a rectangular (or arc-shaped) illumination area IAR (see FIG. 17) on the reticle R with a uniform illumination.

On the reticle stage RStar marketicle R is fixed onto the stage by, for example, vacuum chucking. The reticle stage RST can be moved in a predetermined scanning direction (in this case, the Y-axis direction) at a designated scanning speed, driven on a reticle base (not shown in FIGS.) by a reticle driving portion (not shown in FIGS.) structured of a linear motor.

On the reticle stage RST, a movable mirror 15 is fixed so as to reflect the laser beams emitted from a reticle laser interferometer (hereunder referred to as a "reticle interferometer") 16. And the position of the reticle stage RST within a moving surface is detected at all times by the reticle interferometer 16 with a resolution of 0.5 to 1 nm.

Positional information of the reticle stage RST from the reticle interferometer 16 is sent to a stage control system 19 and then to a main controller 20. The stage control system 19 drives the reticle stage RST via a reticle driving portion (not shown in FIGS.) in respect to the instructions the main controller 20 based on the positional information of the reticle stage RST.

The projection optical system PL is arranged under the reticle stage ST as shown in FIG. 1, and the optical axis AX (coinciding with the optical axis IX of the illumination optical system) is set as the Z-axis direction. In this embodiment, a refraction optical system is employed which is structured of a plurality of lenses disposed along the optical axis AX at a predetermined interval, so as to make a double telecentric optical arrangement. The projection optical system PL is a reduction optical system having a predetermined magnification of, for example, ⅕ (or ¼). Therefore, when the illuminating light emitted by the illumination system 10 illuminates the illumination area IAR of the reticle R, a reduced image (a partially inverted image) of a circuit pattern of the reticle R is formed on an exposure area IA on a wafer W. The image is formed on the wafer W that has a photoresist coated on its surface, through the projection optical system PL by the illumination light, which passes through the reticle R.

The stage unit 30 comprises: a base 21; a substrate table 18 supported by air levitation with an air slider (to be described later) above the upper surface of this base 21 via a clearance of several microns or so; and a driving unit 50 for driving the substrate table 18 within the XY-plane in two-dimensional directions. As the driving unit 50, a planar motor device configured of a stator 60 (embedded) in the upper portion of the base 21 to and a mover 51 fixed to the bottom portion (the surface side opposing the base) of the substrate table 18, is used. In the following description, the driving unit 50 will be referred to as the planar motor device 50 for the sake of convenience.

Figure 2A:
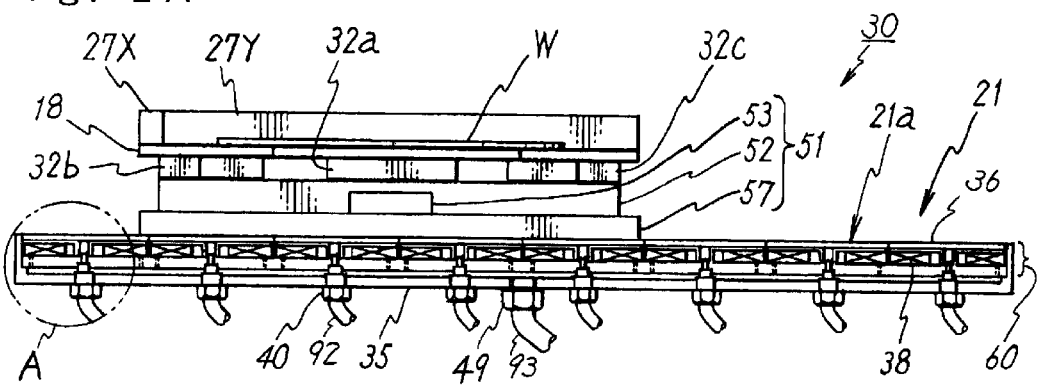
FIGS. 2A and 2B are diagrams illustrating the configuration of a stage device of FIG. 1.
Figure 2B:
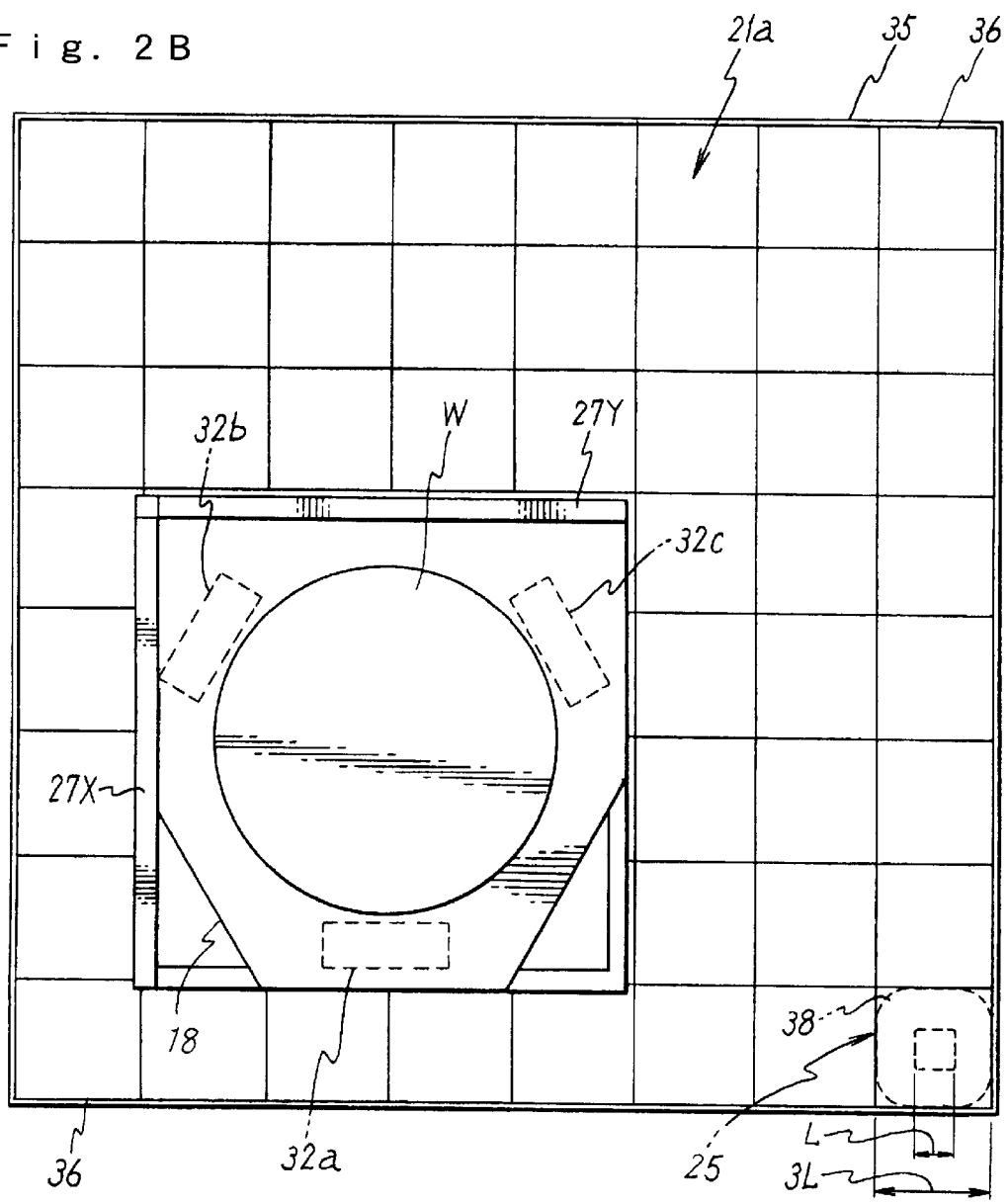

On the substrate table 18, the wafer W is fixed onto the substrate table by, for example, vacuum chucking. Also on the substrate table 18, a movable mirror 27 is arranged so as to reflect the laser beams from a wafer laser interferometer (hereunder referred to as "wafer interferometer") 31. And the position of the substrate table 18 in the XY-plane is detected at all times by the wafer interferometer 31 arranged externally with a resolution of 0.5 to 1 nm or so. In the actual case, as shown in FIG. 2B, a movable mirror 27Y having a reflection surface perpendicular to the Y-axis direction which is the scanning direction is arranged on the substrate table 18. A movable mirror 27X having a reflection surface perpendicular to the X-axis direction which is the non-scanning direction is also arranged on the substrate table 18. One of the wafer interferometer 31 is arranged in the scanning direction in respect to one axis, whereas two wafer interferometers are arranged in the non-scanning direction in respect to two axes. In FIG. 1, however, these are illustrated representatively as the movable mirror 27 and the wafer interferometer 31. The positional information (or velocity information) of the substrate table 18 is sent to the stage control system 19 and the main controller 20 via the stage control system 19. The stage control system 19 controls the movement of the substrate table 18 within the XY-plane in accordance with instructions from the main controller 20 based on the positional information (or velocity information), by controlling the planar motor device 50 through the current driving unit 22.

Further, arranged in the exposure apparatus 100 shown in FIG. 1, a multiple focal position detection system which is one of a focus detecting system (or focal point detecting system) based on the oblique incidence method is provided. The system is for detecting the position within the exposure area IA on the wafer surface W, and for detecting the Z-axis direction (namely, the direction of the optical axis AX) position of the area around the exposure area IA. This multiple focal position detection system is structured of an illumination optical system (not shown in FIGS.) and a light receiving system (not shown in FIGS.). The detailed configuration of the multiple focal position detection system is disclosed in, for example, the U.S. Pat. No. 5,448,332. The disclosure of this multiple focal position detection system in the United States Patent described above is fully incorporated by reference herein.

The constituent parts of the stage unit 30 will be described next, in detail with particular emphasis on the planar motor device 50 and its surrounding constituent parts by referring to FIGS. 2A to 16. FIG. 2A is a schematic front view of the stage unit 30, partially cut to show the base 21. FIG. 2B is a planar view of the stage unit 30.

As illustrated in FIGS. 2A and 2B, the substrate table 18 is supported at three different points by supporting mechanism 32a, 32b, and 32c including voice coil motors on the top surface (on the opposite surface of the surface facing the base) of the mover 51. The substrate table 18 can be tilted in respect to the XY-plane, and in the Z-axis direction. The supporting mechanism 32a to 32c are omitted in FIG. 1; however, these supporting mechanism are actually driven and controlled independently by the stage control system 19 in FIG. 1 through the driving mechanisms also omitted in the FIGS.

Figure 3:
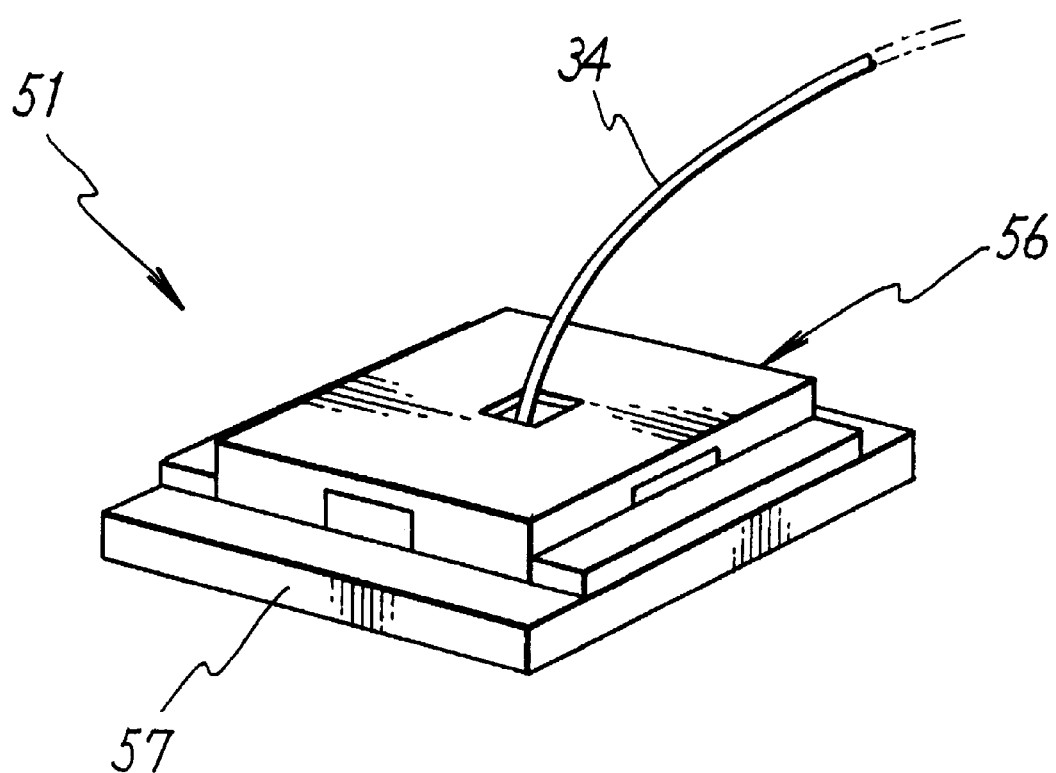
FIG. 3 is a perspective diagram illustrating a mover of a planar motor of the stage device of FIG. 1.
Figure 4:
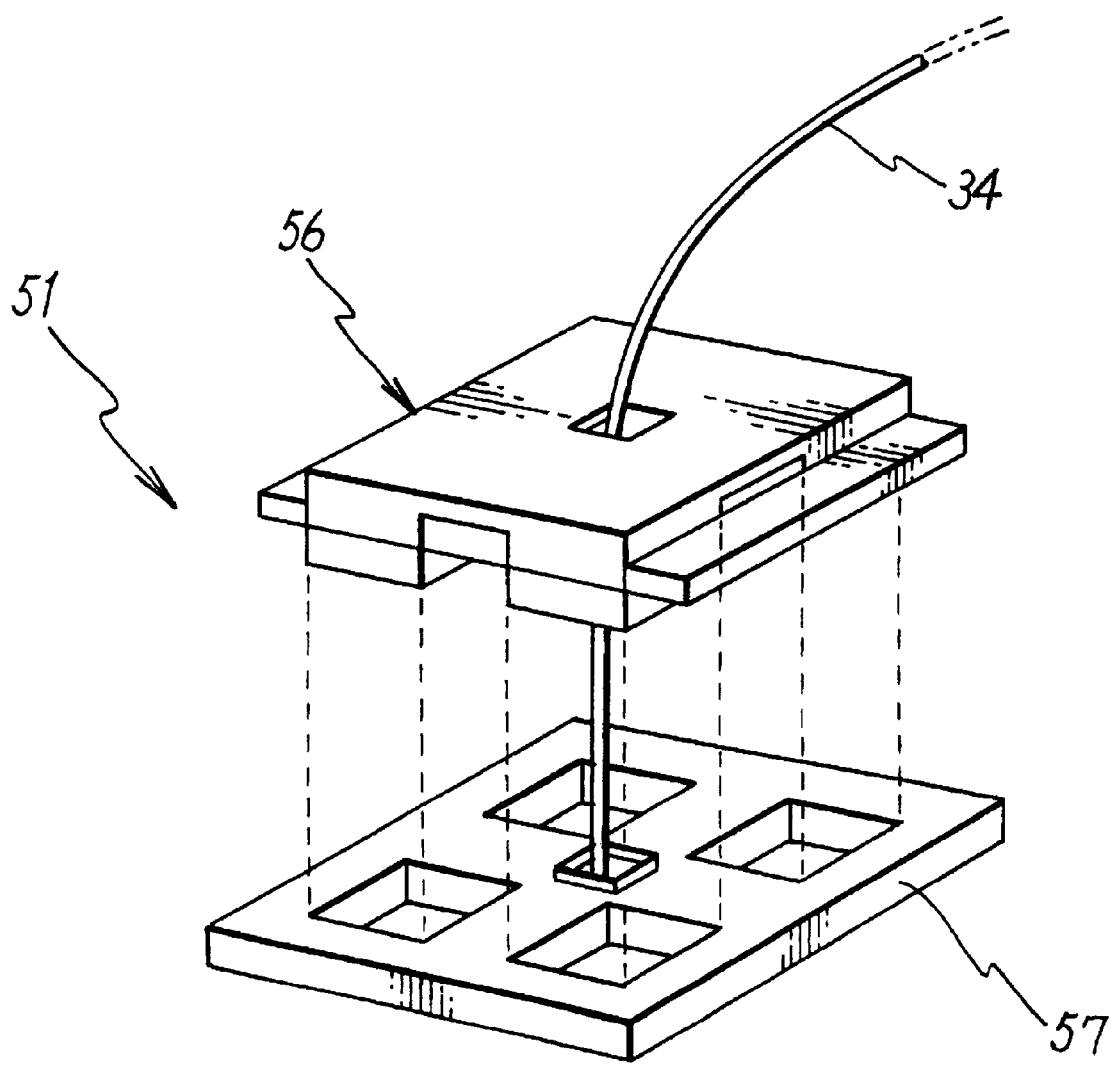
FIG. 4 is a perspective diagram illustrating a state device of the mover of FIG. 3.

As illustrated in FIGS. 3 and 4, the mover 51 of the planar motor device 50 is structured of an air slider 57 serving as a supporting member, which is a kind of an aero-hydrostatic bearing device, and a magnetic pole unit 56 attached to the air slider 57.

Figure 5:
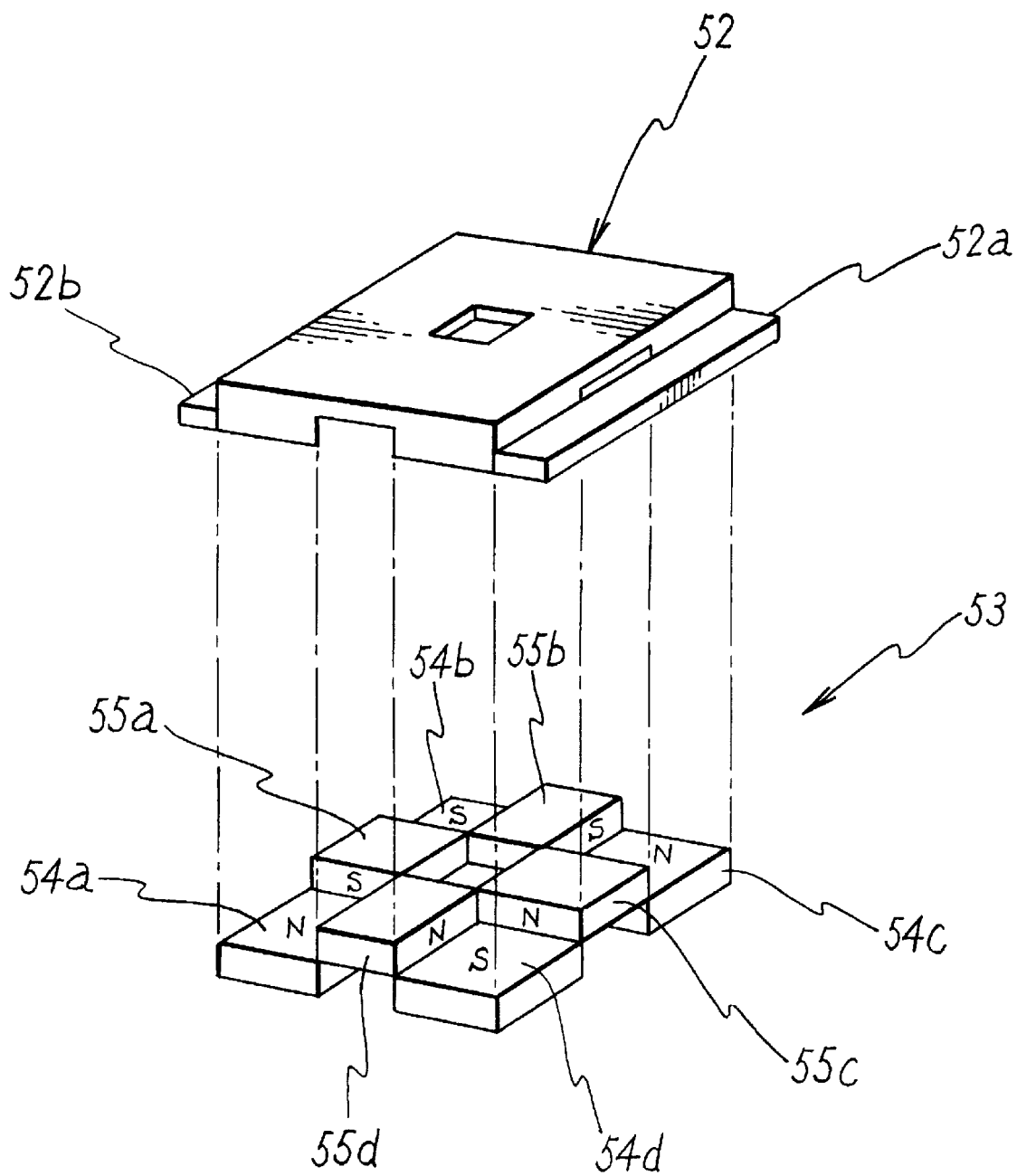
FIG. 5 is an exploded perspective diagram illustrating a magnetic pole unit of the mover of FIG. 4.

As shown in the exploded perspective view of FIG. 5, the magnetic pole unit 56 is structured of a magnet assembly 53 and a magnetic member 52 made of a magnetic material, which engages with the magnet assembly 53 from above. The substrate table 18 is provided on the top surface of the magnetic member 52 via the supporting mechanism 32a to 32c. Furthermore, collar portions 52a and 52b are provided at both margins in the X-axis direction of the magnetic member 52.

The magnet assembly 53 is structured of 4 thrust generating magnet 54a, 54b, 54c, and 54d arranged in the shape of a two-by-two matrix so that the polarities of the adjacent magnetic pole surfaces differ from each other. It also has interpolating magnets 55a, 55b, 55c, and 55d, each of which is arranged along a magnetic flux path formed by adjacent pairs of thrust generating magnets (54a, 54b), (54b, 54c), (54c, 54d) and (54d, 54a) on the side of the magnetic member 52.

Figure 6A:
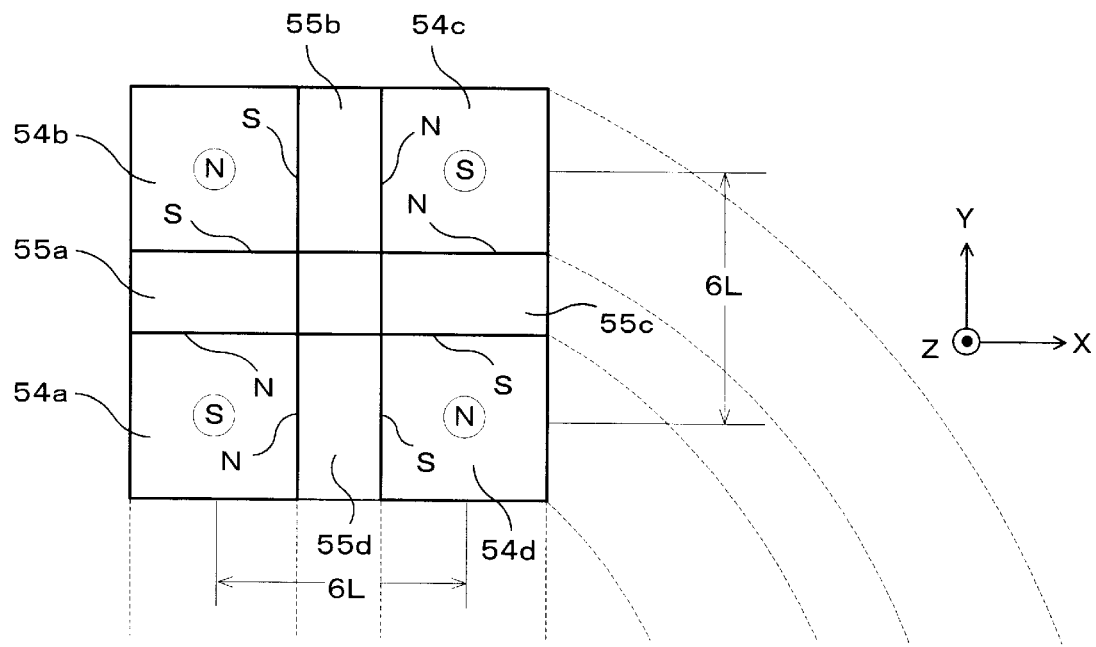
FIGS. 6A to 6C are diagrams illustrating the configuration of a magnet assembly of FIG. 5.
Figure 6B:
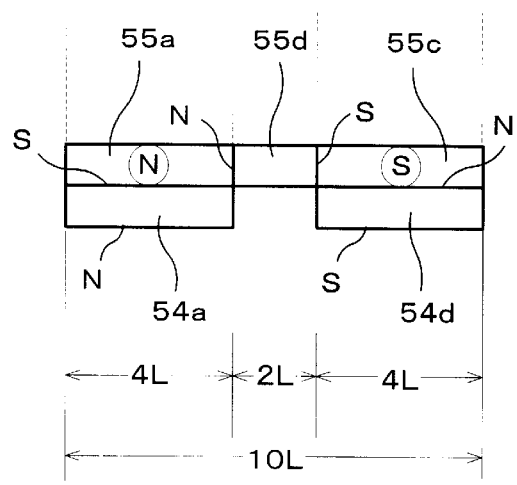
Figure 6C:
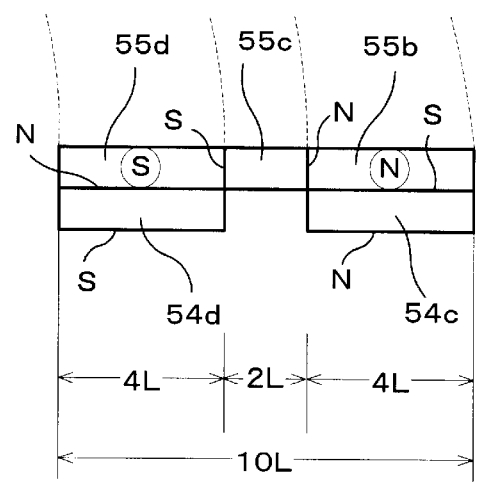
Figure 6C:
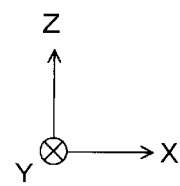
Figure 6C:
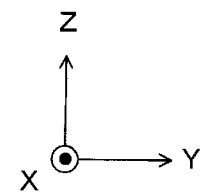

FIGS. 6A to 6C are diagrams illustrating the structure and dimensions of the respective magnets of the magnet assembly 53. Among these figures, FIG. 6A is a planar view of the magnet assembly 53, FIG. 6B is a side view taken from a (−Y) direction of FIG. 6A, and FIG. 6C is a side view taken from a (+X) direction of FIG. 6A. Also, in FIGS. 6A to 6C, the characters N and S are circled so as to indicate the polarities of magnetic pole surfaces when the magnetic pole surfaces can be viewed. On the contrary, when the magnetic pole surfaces cannot be viewed, the leader lines show such magnetic pole surfaces with the polarities indicated by the characters N or S. As illustrated in FIGS. 6A to 6C, the thrust generating magnet 54a to 54d are respectively structured by permanent magnets of the same shape and same thickness, and have a square magnetic pole surface which length of one side is 4L. And the thrust generating magnet 54a to 54d are arranged in the shape of a two-by-two matrix on the same plane, having a gap in between the adjacent magnet, and the width of the gap being 2L in the X-direction and the Y-direction. Also, with the thrust generating magnets adjacent in the X-direction as in the pairs (54a, 54d) and (54b, 54c), the polarities of the adjacent magnetic pole surfaces oppose each other. Similarly, with the thrust generating magnets adjacent in the Y-direction as in the pairs (54a, 54b) and (54c, 54d), the polarities of the adjacent magnetic pole surfaces oppose each other. In this embodiment, the polarity of the respective magnetic pole surfaces of the thrust generating magnet 54a and 54c which is on the side of the magnetic member 53, is the south pole, S. The polarity, whereas, of the respective magnetic pole surfaces of the thrust generating magnets 54b and 54d which is on the side of the magnetic member 53, is the north pole, N.

The interpolating magnets 55a to 55d respectively have the same thickness, and are each structured of a permanent magnet in a rectangular shape having the size of 4L×2L in a planar view. They are respectively arranged so as to fill in the gap between the adjacent thrust generating magnets (54a, 54b), (54b, 54c), (54c, 54d), (54d, 54a) being 2L in width, and also on the imaginary plane created on the upper surface of the thrust generating magnets when viewed from a side. Each of these interpolating magnets 55a to 55d have a magnetic pole surface perpendicular to the magnetic pole surface of the thrust generating magnet 54a to 54d. The respective magnetic pole surfaces of the interpolating magnets are arranged so that the polarity of each magnetic pole surface oppose the polarity of the magnetic pole surface of the adjacent thrust generating magnet 54a to 54d, in a planar view.

Referring back to FIG. 4, the air slider 57 has a shape of a cross being enclosed by a square in a planar view, and is made of a low thermal expansion ceramic material. The air slider 57 will now be described in more detail.

Figure 7:
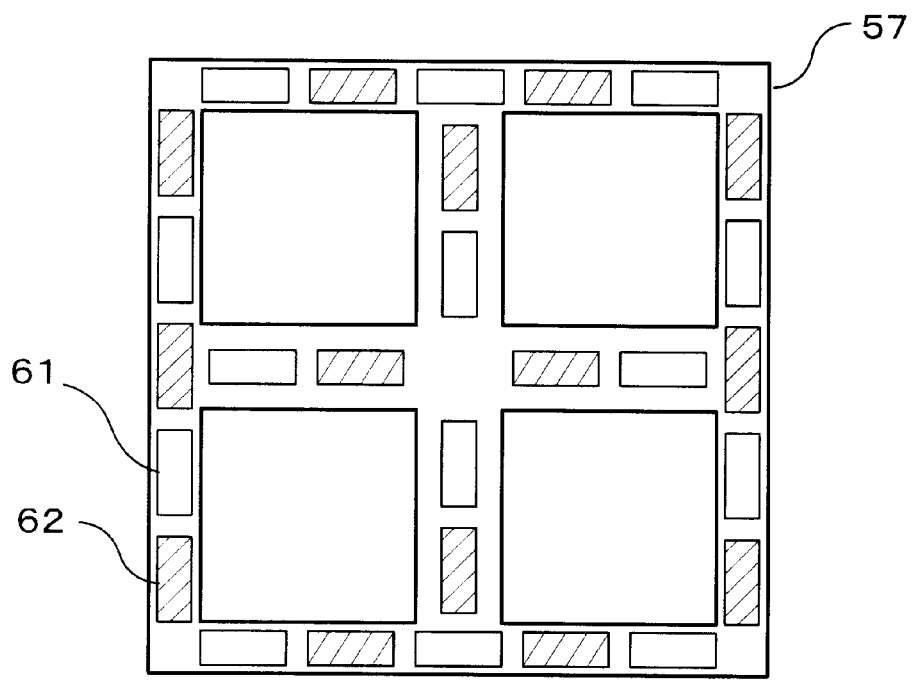
FIG. 7 is a bottom diagram illustrating an air slider of the mover of FIG. 3.
Figure 8A:
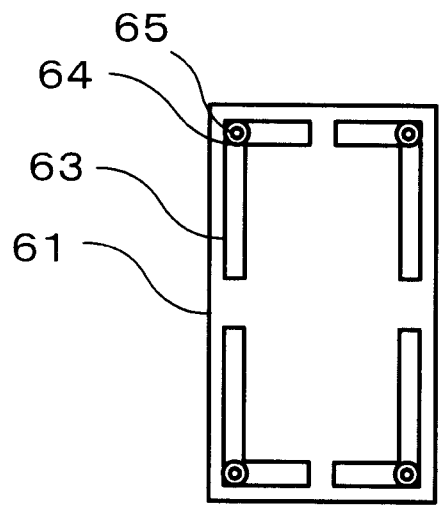
FIGS. 8A and 8B are diagrams illustrating examples of an air pad of FIG. 7.

FIG. 7 is a bottom diagram illustrating the air slider 57. On the bottom surface (the surface opposing the base 21) of the air slider 57, an air pad 61 serving as a first vent portion and an air pockets 62 serving as suction portion are alternately arranged at predetermined intervals, as shown in FIG. 7. The air pad 61 used, as shown in FIG. 8A, is of a rectangular shape which has an L-shaped groove 63 of a predetermined depth, a depth of 10 microns or so in this case, formed in each corner. On the cornering point of the grooves 63, a circular recess portion 64 which is slightly deeper in depth than that of the groove 63, is formed. And in the center of the recess portion 64, a round hole 65 acting as a nozzle for exhausting air as the pressurized gas, is formed.

Figure 8B:
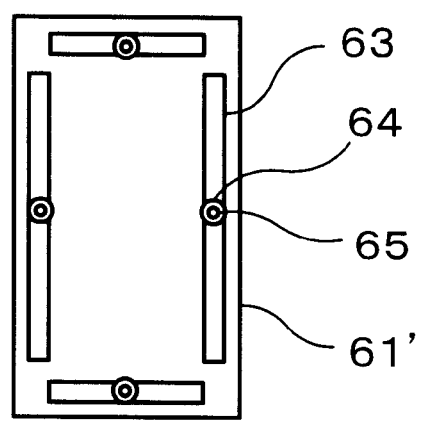

As the air pad, alternatively, an air pad 61' which is a type having the groove 63 arranged along the four sides, as shown in FIG. 8B, may be used.

Figure 9:
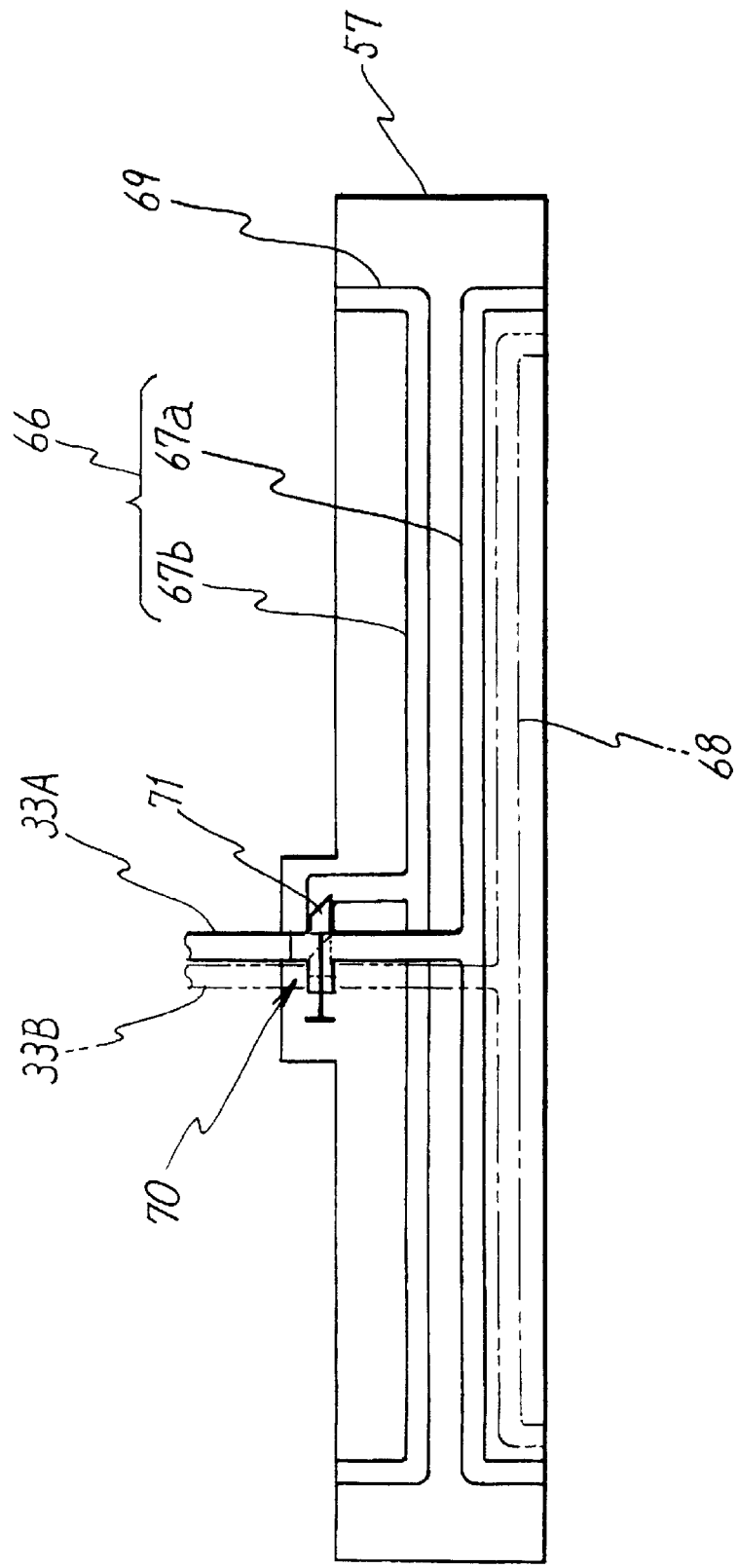
FIG. 9 is a schematic diagram illustrating pressurized air supply path and a vacuuming passage, which are provided in the air slider.

As schematically shown in FIG. 9, in the air slider 57, an air pressure supply path 66 and a vacuuming passage 68, are formed. Of the air pressure supply path 66 and the vacuuming passage 68, one end of the air pressure supply path 66 is connected to an end of a tube 33A. The end of the tube 33A is inserted into the air slider 57 through an opening formed in the central part of the top surface portion of the air slider 57. The other end of the tube 33A is connected to an air pump 59 (see FIG. 1).

The air pressure supply path 66 is divided into a first passage 67a and a second passage 67b. The first passage 67a is a passage to supply air to each of the air pads 61, and the outlet side reaches the bottom surface of the air slider 57 and is connected each of the air pads 61. The second passage 67b has an outlet side leading to the top surface of the air slider 57. The end portion opening on the top surface side serves as a kind of a nozzle for upwardly exhausting the pressurized air, and will be hereunder referred to as a nozzle 69. The second vent portion is structured by this nozzle 69.

On the diverging point of the first passage 67a and the second passage 67b, a passage switching valve 70 is arranged as the switching mechanism. When a valve member 71 is arranged at a first position indicated by a solid line as in FIG. 9, the pressurized air supplied from the air pump 59 flows through the first passage 67a to each of the air pads 61. And, when the valve member 71 is arranged at a second position indicated by an imaginary line (or a dotted line) in FIG. 9, the pressurized air supplied from the air pump 59 is upwardly exhausted through the second passage 67b from the nozzle 69. Furthermore, when the valve member 71 is arranged at a third position, which is between the first and second positions, the pressurized air is prevented from flowing into neither the first passage nor the second passage. The switching operation of the passage switching valve 70 is performed manually. However, the main controller 20 can also perform the switching operation.

The vacuuming passage 68 has one end connected to the other end of a tube 33B. One end of the tube 33B is connected to a vacuum pump not shown in FIGS, while the other end of the tube 33B is inserted into the air slider 57 through an opening formed in the central part of the top surface portion of the air slider 57. The other end portion of the vacuuming passage 68 is connected to each of the air pockets 62 arranged in the bottom surface portion of the air slider 57. As described above, the tubes 33A and 33B are actually connected to the air slider 57, however, in FIGS. 3 and 4, these tubes are representatively illustrated as the tube 34.

Next, as illustrated in FIG. 4, operation of the respective structuring portions when attaching the magnetic pole unit 56 onto the air slider 57 is described, with reference to FIGS. 10A to 10D.

Figure 10A:
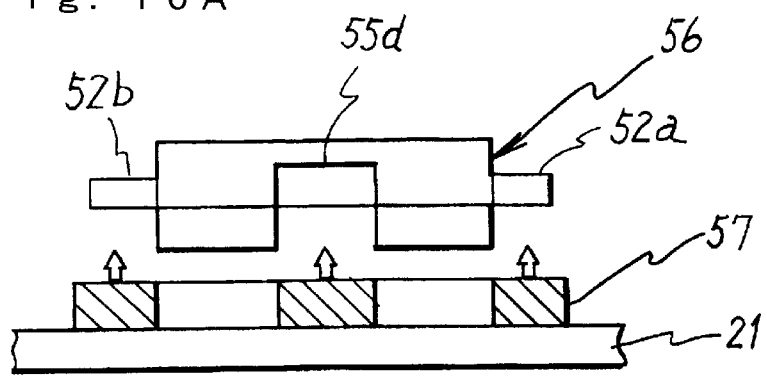
FIGS. 10A to 10D are diagrams illustrating a procedure to attach the magnetic pole unit to the air slider in which the sectional view is shown.
Figure 10B:
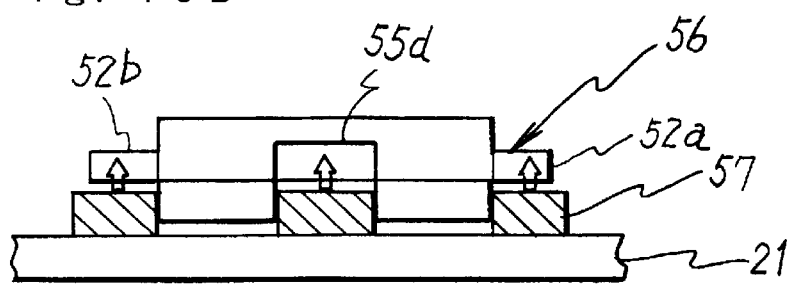

First, as shown in FIG. 10A, with the air slider 57 placed on the base 21, the passage switching valve 70 is arranged at the second position so as to exhaust the pressurized air upwardly from the nozzle 69 (as indicated by white arrows). In this state, the magnetic pole unit 56 is transferred upward to a position above the air slider 57. The magnetic pole unit 56 is then moved downward by a predetermined distance, so that the bottom edges of the four thrust generating magnet 54a to 54d of the magnetic pole unit 56 are fitted to the openings of the air slider 57 from above. Then, as shown in FIG. 10B, the pressurized air is exhausted to the collar portions 52a and 52b of the magnetic pole unit 56 and to the bottom surface of the interpolating magnets 55a to 55d. The exhausting pressure (the upward force) of the pressurized air supports the magnetic pole unit 56 by air levitation in a noncontacting manner. That is, a magnetic attraction force is working between the magnetic pole unit 56 and the stator yoke (to be described later) within the base 21. Therefore, an upward force (or air levitation force) which is equivalent to the downward force being the total sum of the magnetic attraction force and the force caused by the weight of the magnetic pole unit 56, is generated.

Figure 10C:
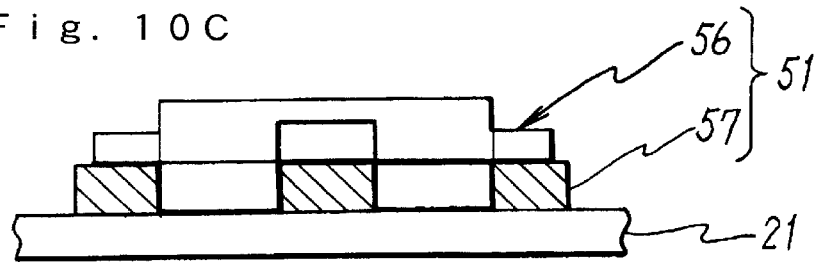

Then, by applying pressure from above, the magnetic pole unit 56 is completely fitted into the air slider 57. And, as illustrated in FIG. 10C, by changing the passage switching valve 70 to the third position, the magnetic pole unit 56 is attached to the air slider 57. Consequently, the mover 51 of FIG. 3 is assembled.

For the sake of simplicity, only the magnetic pole unit 56 being attached to the air slider 57 has been described. However, needless to say, the magnetic pole unit 56 can be attached to the air slider 57, with the substrate table 18 fixed to the magnetic pole unit 56. In this case, as well, the magnetic pole unit 56 can be identically attached as described above.

Figure 10D:
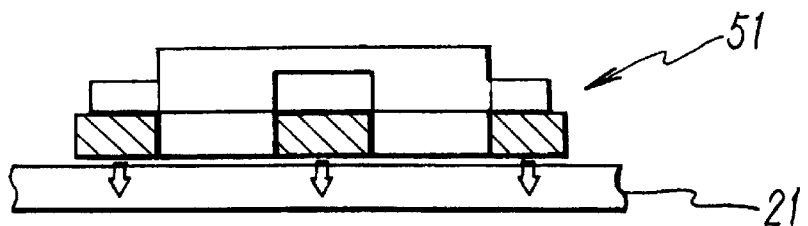

After completing the assembly of the mover 51, the passage switching valve 70 is switched to the first position, and the vacuum pump (not shown in FIGS.) is turned on. As a result, as illustrated in FIG. 10D, the entire set of the mover 51 and the substrate table 18 is supported by air levitation above the top surface of the base 21 via a clearance of 5 microns or so. That is, the thickness of an air layer, in other words, the bearing gap, is maintained at a desired value by balancing the downward force and the upward force. In this case, the downward force is equivalent to the total sum of the force caused by the entire weight of the mover 51 and the substrate table 18, the magnetic attraction force, and the vacuum chucking force (or pressurizing force) of the vacuum pump (not shown in FIGS.). And the upward force, is equal to the pressure of the pressurized air supplied from the air pump 59 and exhausted to the top surface of the base 21 via the air pad 61, that is, the static pressure of the air layer between the bottom surface of the mover 51 and the upper surface of the base 21 (the pressure within the gap). Accordingly, in this embodiment, the air slider 57 structures a kind of a vacuum pressurizing type air hydrostatic bearing device.

Referring back to FIG. 2A, the base 21 has a thin hollow box type container 35, which in a planar view has a square shape, with an opening on the upper surface, and a stator 60 embedded in the internal space of the container 35. On the upper surface of the base 21 (the surface opposing the mover 51), a guide surface 21a of the mover 51 is formed. The guide surface 21a, in this embodiment, is structured of an upper surface of case 36 made by ceramics arranged closely in a shape of a matrix (in this case a matrix of eight rows and eight columns) in the internal space of the container 35. The case 36, in a planar view, each have a square shape and amounts up to 8×8=64, as shown in FIG. 2B. The reason for using a ceramic material as the material of the case 36 is due to its low thermal expandability, and because the ceramic material is substantially a non-magnetic and non-conductive material and does not substantially cut off the magnetic flux. Alternatively, as the material of the case 36, other than ceramic materials, a material, which has: a low thermal expansion; permeability sufficiently smaller in compared with that of magnetic materials such as iron; a substantially non-magnetic material almost equal to that of air; a substantially non-conductive material which conductivity is sufficiently lower than that of conductive materials such as copper and is almost equal to that of air, may be used.

Each of the case 36 is in a shape of a hollow box, which have an opening in the bottom surface. In the interior of each case, a plurality of armature coil 38, each of which has a predetermined thickness, are housed. As the armature coil 38, as illustrated in FIG. 2B, a square shaped coil having a hollow center, which is almost in contact with the inner surface of each of the cases 36, is used. The central space of this coil is almost shaped in a square, each of the sides of which has the length of L. In FIG. 2B, although only one armature coil 38 is shown, in actual, each case structuring the case 36 house one armature coil 38 (see FIG. 2A) . The plurality of armature coil 38 structure an armature unit 25.

Figure 11:
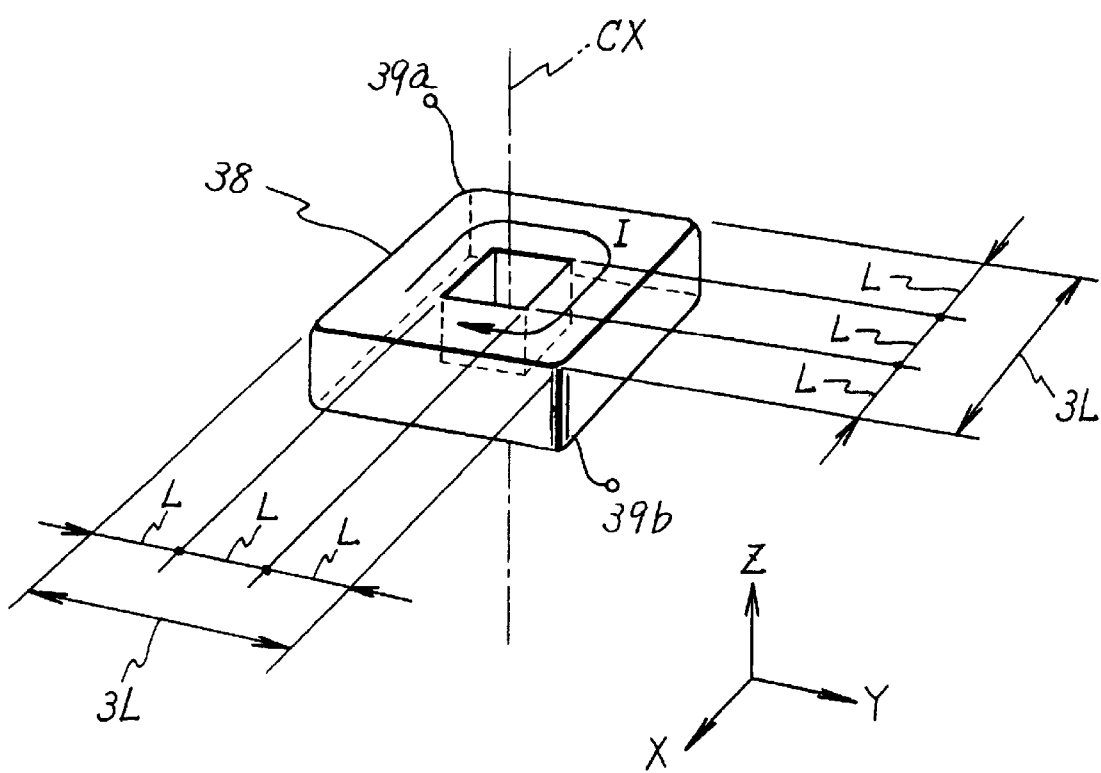
FIG. 11 is a perspective diagram illustrating an armature coil of the stator of the planar motor of FIG. 2.

As shown in FIG. 11, the armature coil 38 has a square shaped bottom surface (the surface parallel to the XY-plane) and one side has the length of 3L. The proximity of the center axis CX is parallel to the Z-axis, and the armature coil 38 is also structured like a prism having a hole penetrating the hollow center portion in the Z axis direction. The hollow center portion has a square shape in section, and one side has a length of L. Electric current is supplied from a current driving unit (not shown in FIGS.) through terminals 39a and 39b to the armature coil 38. Then, the supplied current flows around the center axis CX at a nearly uniform current density (volume density). The current value and direction of the electric current flowing through the armature coil 38 are controlled by the stage control system 19 via the current driving unit.

Referring back to FIG. 2A, on the bottom surface portion of the container 35, in the central portion one or more coolant discharging joint 49 is (are) connected, and to each armature coil 38, a coolant injecting joint 40 serving as the coolant supplying joint is connected. The coolant discharging joint 49 is connected to a cooling portion arranged in the cooling device 79 of FIG. 1 via a coolant discharging pipe 93, and the coolant injecting joint 40 is connected to a coolant supplying unit arranged in the cooling device 79 via the coolant supplying pipe 92. That is, in this embodiment, the coolant supplied from the cooling device 79 via the coolant injecting joint 40 to the base 21 cools the inside of the base 21. After the inside is cooled, the coolant returns to the cooling device 79 via the coolant discharging joint 49. The coolant is cooled again in the cooling device 79, and then is supplied again into the base 21; thus the coolant is recycled. In this case, as the coolant, FLUORINERT (product name) is used.

Figure 12:
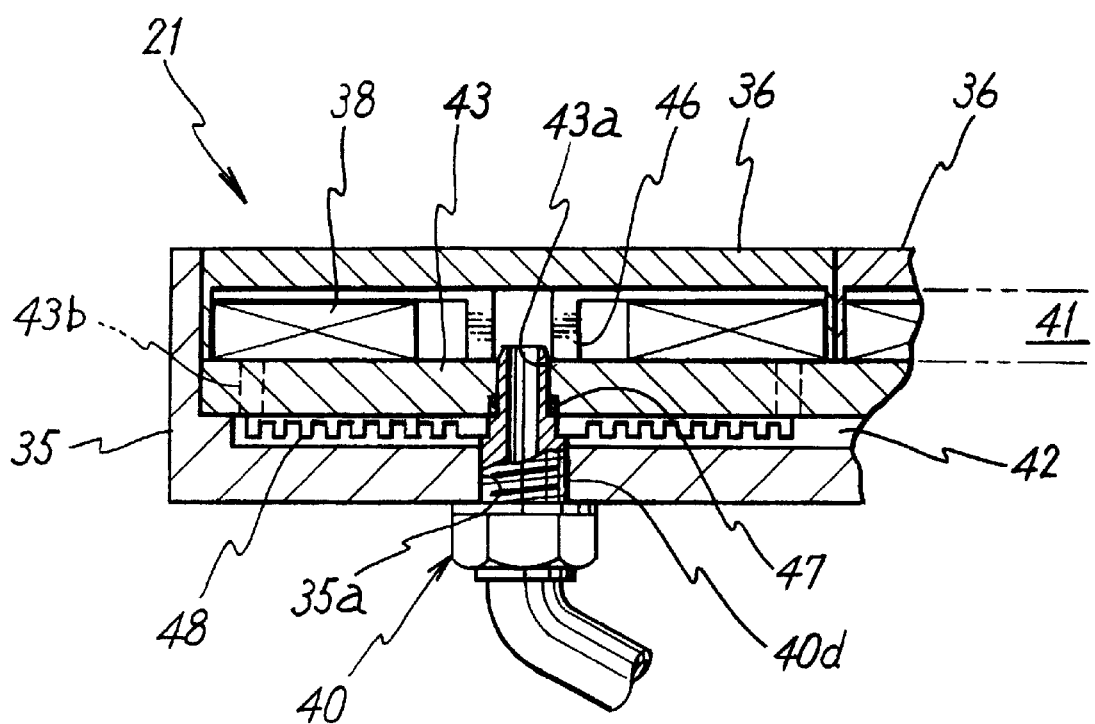
FIG. 12 is an enlarged diagram illustrating a part shown in a circle A of FIG. 2 and the vicinity thereof.
Figure 13:
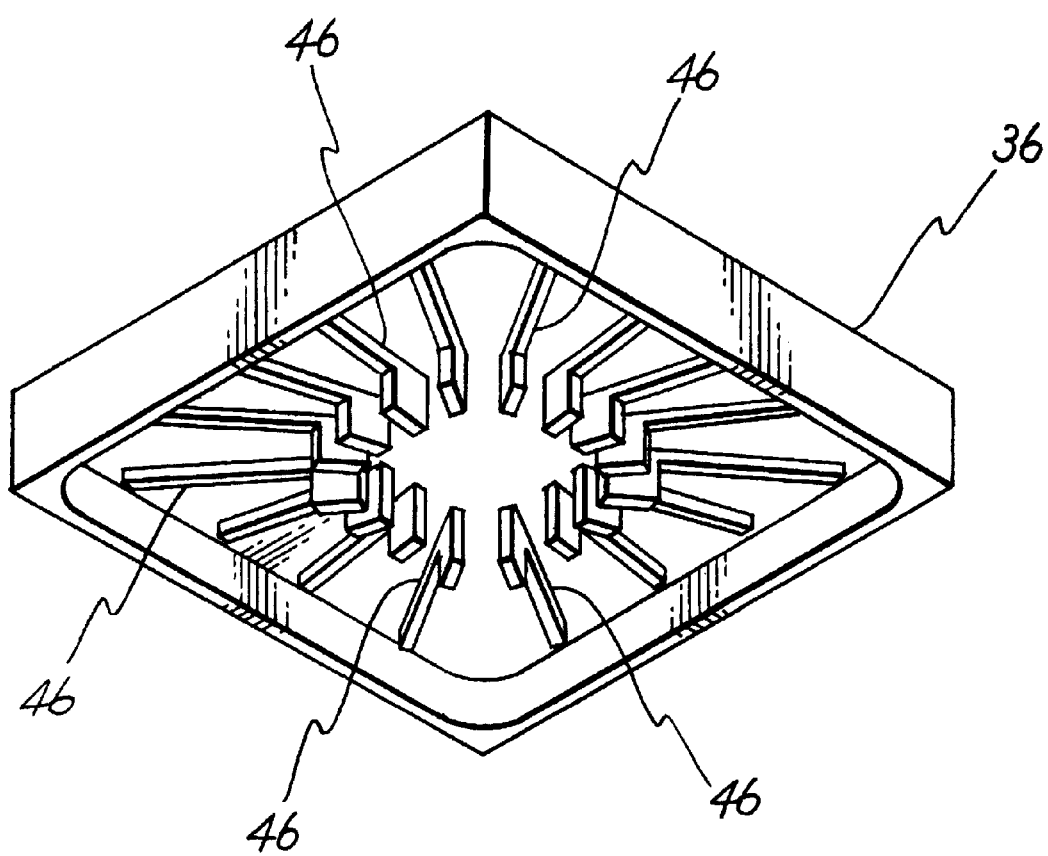
FIG. 13 is a perspective diagram illustrating a case of FIG. 12.

FIG. 12 illustrates the enlarged view of the circle A of FIG. 2A and its surroundings. As shown in FIG. 12, within the base 21, a stator yoke 43 which serves as a dividing member (and a plate-shaped member), made of a plate-shaped magnetic member is arranged. The stator yoke 43 divides the inner space (or closed space) into an upper first chamber 41 and a lower second chamber (or another chamber). The stator yoke 43 is placed from above on a step portion formed on the inner wall of the container 35, and is arranged so that it is parallel and apart from the bottom surface of the container 35 via a predetermined air gap. And, on the upper surface of the stator yoke 43, the ceramic case 36 which houses the armature coil 38 is arranged. On the side of the inner bottom surface (the upper surface in FIG. 12) of each ceramic case 36, as illustrated in the perspective diagram of FIG. 13, straightening fins 46 are integrally arranged. The straightening fins 46, structured of 16 L-shaped members, radially extend from the inner surface of the wall to the center of the case. The role of the straightening fins 46 will be described later.

Figure 14:
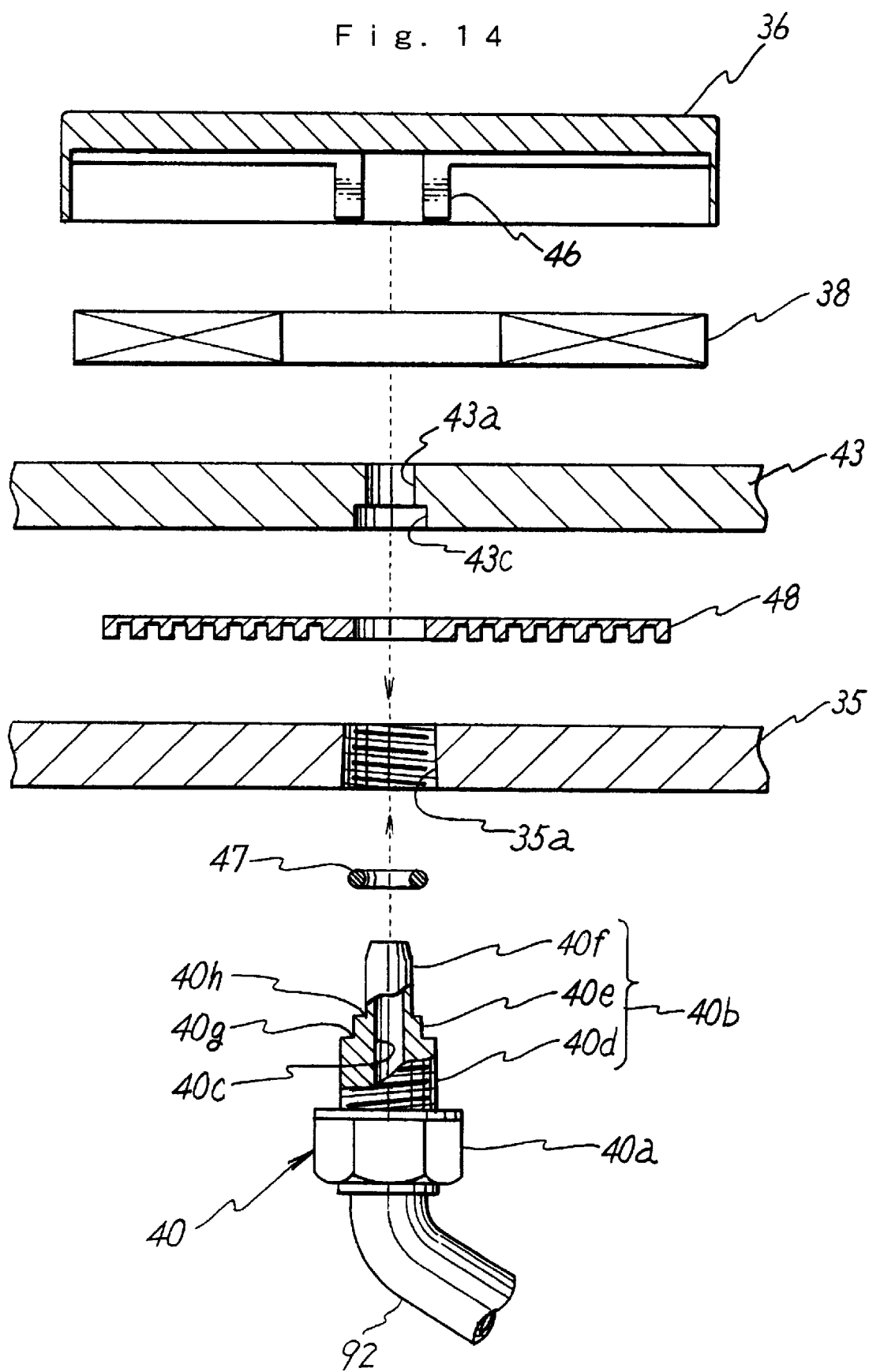
FIG. 14 is an exploded diagram illustrating a base of FIG. 1.

As illustrated in FIG. 14, the coolant injecting joint 40 is a stepped bolt-shaped member having a bolt head portion 40a and a stem portion 40b that is integral with the head 40a and that has two step-like portions. A coolant passage 40c is formed in the axial direction in the coolant injecting joint 40. The stem portion 40b has: a screw portion 40d adjoining the head 40a and having a male screw formed on the outer circumference; a middle-diameter portion 40e arranged on the tip portion side of the screw portion 40d which has a diameter smaller than the screw portion 40d; and a small-diameter portion 40f arranged further down to the tip portion of the middle-diameter portion 40e having a smaller diameter. A step portion 40h is formed at the boundary of the small-diameter portion 40f and the middle-diameter portion 40e. Another step portion 40g is formed on the boundary of the middle-diameter portion 40e and the screw portion 40d. The opposite side of the stem portion of the bolt head 40a is connected to the coolant supplying pipe 92, which is connected to the coolant outlet opening of the coolant supplying unit arranged in the cooling device 79 of FIG. 1.

Referring back to FIG. 12, in the stator yoke 43, an inlet opening 43a structured of a round hole is respectively formed in the position corresponding to the central space of each armature coil 38. And on the bottom-surface side of this inlet opening 43a, a hole 43c of a predetermined depth (see FIG. 14) is formed.

As shown in FIG. 12, the coolant injecting joint 40 is attached to the container 35 with the screw portion 40d screwed into the screw hole 35a formed on the bottom wall of the container 35. In the attached state, shown in FIG. 12, the small-diameter portion 40f of the stem portion 40b (see FIG. 14) is inserted into the inlet opening 43a formed in the stator yoke 43. An O-ring 47 is inserted into the recess hole 43c, and the step portion 40h (see FIG. 14) presses the O-ring 47. Also, in the attached state shown FIG. 12, a secondary cooling fin 48 made of a highly thermal conductive material is closely attached to the bottom surface of the stator yoke 43. The secondary cooling fin 48 is sandwiched between the step portion 40g (see FIG. 14) of the coolant injecting joint 40 and the stator yoke 43.

Figure 15A:
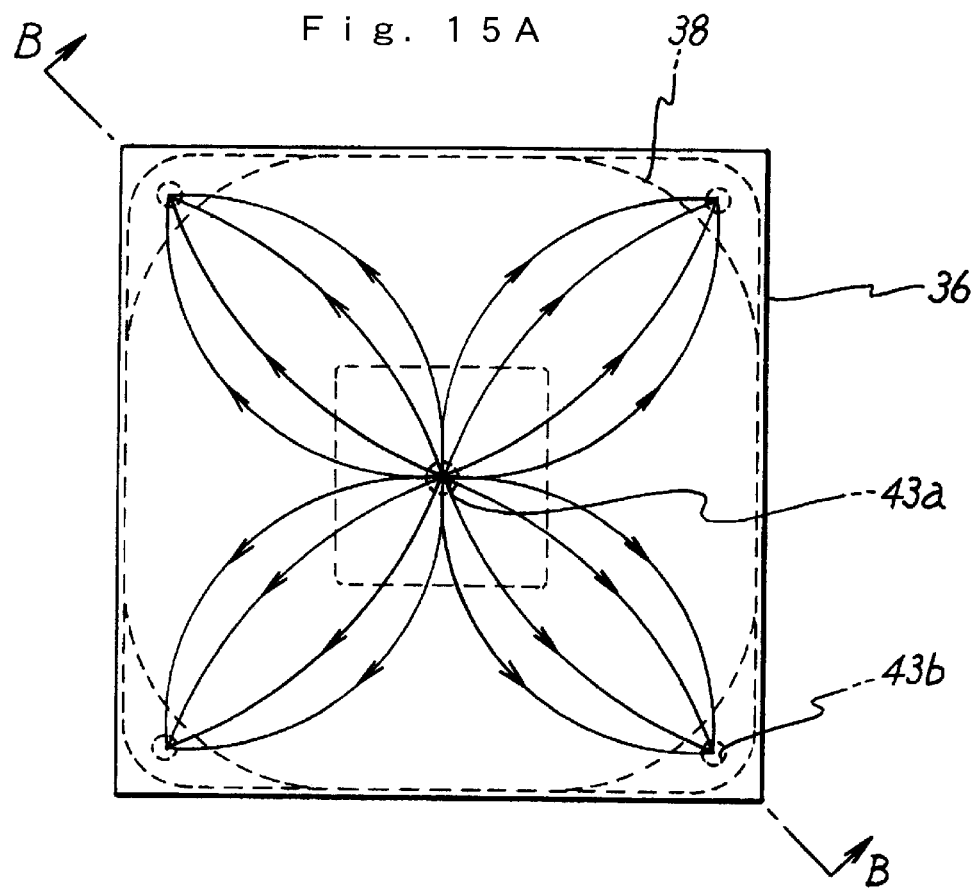
FIG. 15A is a planar diagram illustrating an arbitrary, one of cases of FIG. 2B.
Figure 15B:
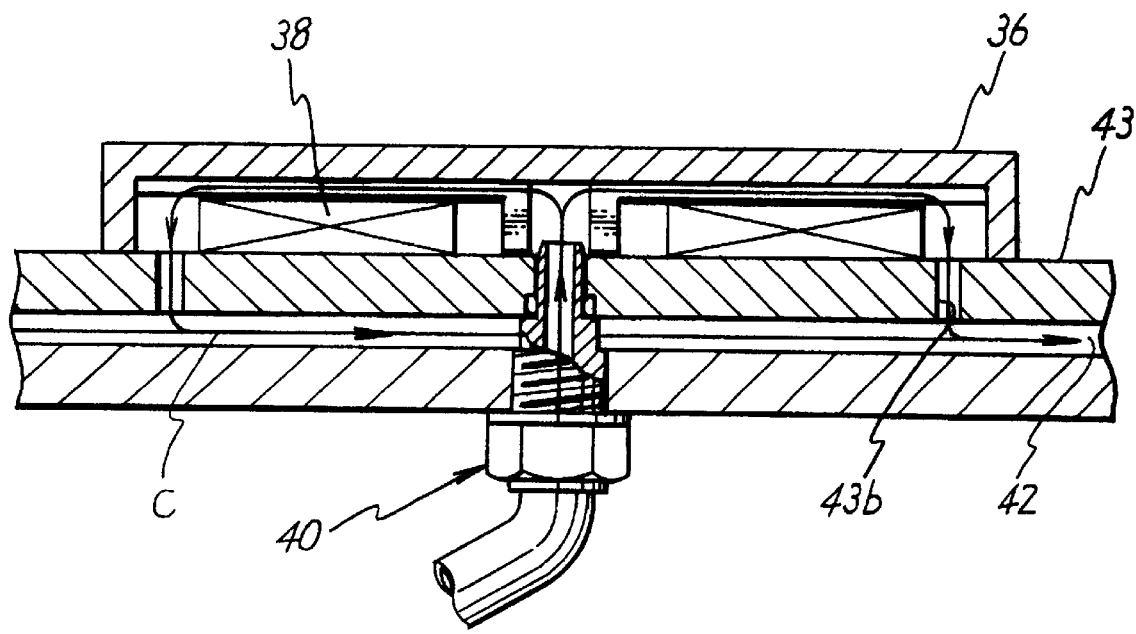
FIG. 15B is a sectional diagram taken on line B—B of FIG. 15A.
Figure 16:
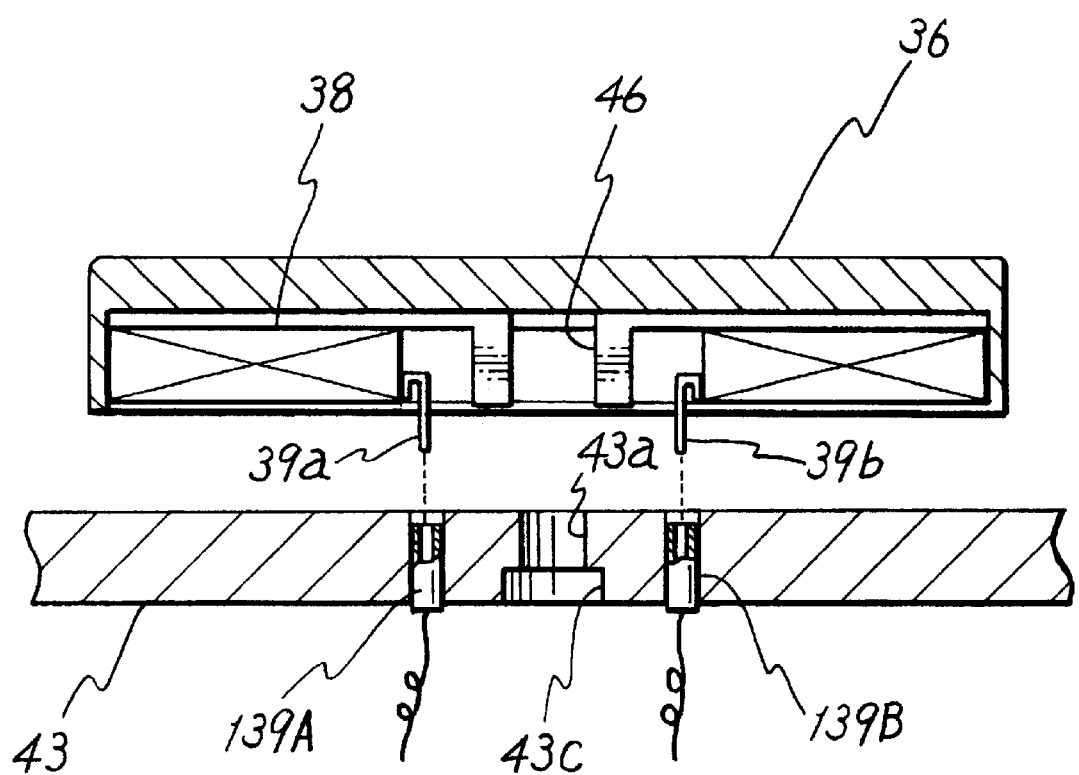
FIG. 16 is a diagram illustrating terminals of an armature coil in a case of FIG. 2B and sockets provided in a stator yoke which respectively corresponds to the terminals.

FIG. 15A is a planar diagram illustrating a ceramic case 36 in FIG. 2B. FIG. 15B is a sectional diagram along the line B—B of FIG. 15A. As shown in these figures, in between the inner circumferential surface of the case 36 and the outer circumferential surface of the armature coil 38, space portions are formed in the four corner portions. In respect to each space portion, an outlet 43b for the coolant is formed at the corresponding portion in the stator yoke 43.

In this embodiment, as indicated by a solid-line arrow C in FIG. 15B, the coolant is supplied in a small chamber formed by each ceramic case 36 and the stator yoke 43. It is supplied from the bottom surface side of the base 21 to the central space of each armature coil 38 via the coolant passage 40c of the coolant injecting joint 40. The coolant then flows to the outer circumferential portion along the top surface of the armature coil 38 through the space between the armature coil 38 and the ceramic case 36 (the space in between each straightening fin 48). Then, the coolant flows into the lower second chamber 42 formed between the stator yoke 43 and the case 36 via the outlet opening 43b.

That is, in this embodiment, a coolant path (see the arrow C) is formed in the base 21, in which the coolant supplied from the cooling device 79 flows into each ceramic case 36 via the inlet opening 43a, and into the second chamber 42 through the outlet opening 43b.

When no straightening fins are arranged within the ceramic case 36, the coolant is expected to take the shortest path from the central space of the armature coil 38 to each of the outlet openings 43b. In this case, however, the top surface of the armature coil 38 is only partially cooled. Therefore, 16 straightening fins 46 are arranged, in order to make forcibly a radial coolant path as indicated by the arrows in FIG. 15A.

Next, a method of assembling the constituent parts of the base 21 will be briefly described by referring to the exploded diagram of FIG. 14.

First, the O-ring 47 is attached to the small-diameter portion 40f of the coolant injecting joint 40. And in this state, each coolant injecting joint 40 is attached to the bottom wall of the container 35 from below. The coolant discharging joint 49 is also screwed into and attached to the bottom wall of the container 35.

Next, each secondary cooling fin 48 is inserted into the corresponding small-diameter portion 40f. Then, the bottom surface portion of the central portion of each secondary fin 48 is pressured so as to contact the step portion 40g of the corresponding coolant injecting joint 40. The stator yoke 43 is then assembled from above, and the O-ring 47 is pressed into each hole 43c.

And, finally, with each armature coil 38 preliminarily arranged within the ceramic case 36, the ceramic case 36 is positioned on the upper surface of the stator yoke 43, and sequentially fixed onto the surface. Although not shown in each of the FIGS. described earlier, in actual, as illustrated in FIG. 16 terminal 39a and 39b of the armature coil 38 are exposed from the part where the armature coil 38 (or case 36) is in contact with the stator yoke 43. At the portion of the stator yoke 43, corresponding to the terminals 39a and 39b, socket portions 139A and 139B are arranged into which the terminals 39a and 39b are respectively fitted. That is, by only attaching each ceramic case 36 onto the stator yoke 43, the wiring for supplying electric current to each of the armature coil 38 is also completed. And the base 21 can be made, by simply attaching the constituent parts to the container 35 from above or below following the procedure.

Figure 17:
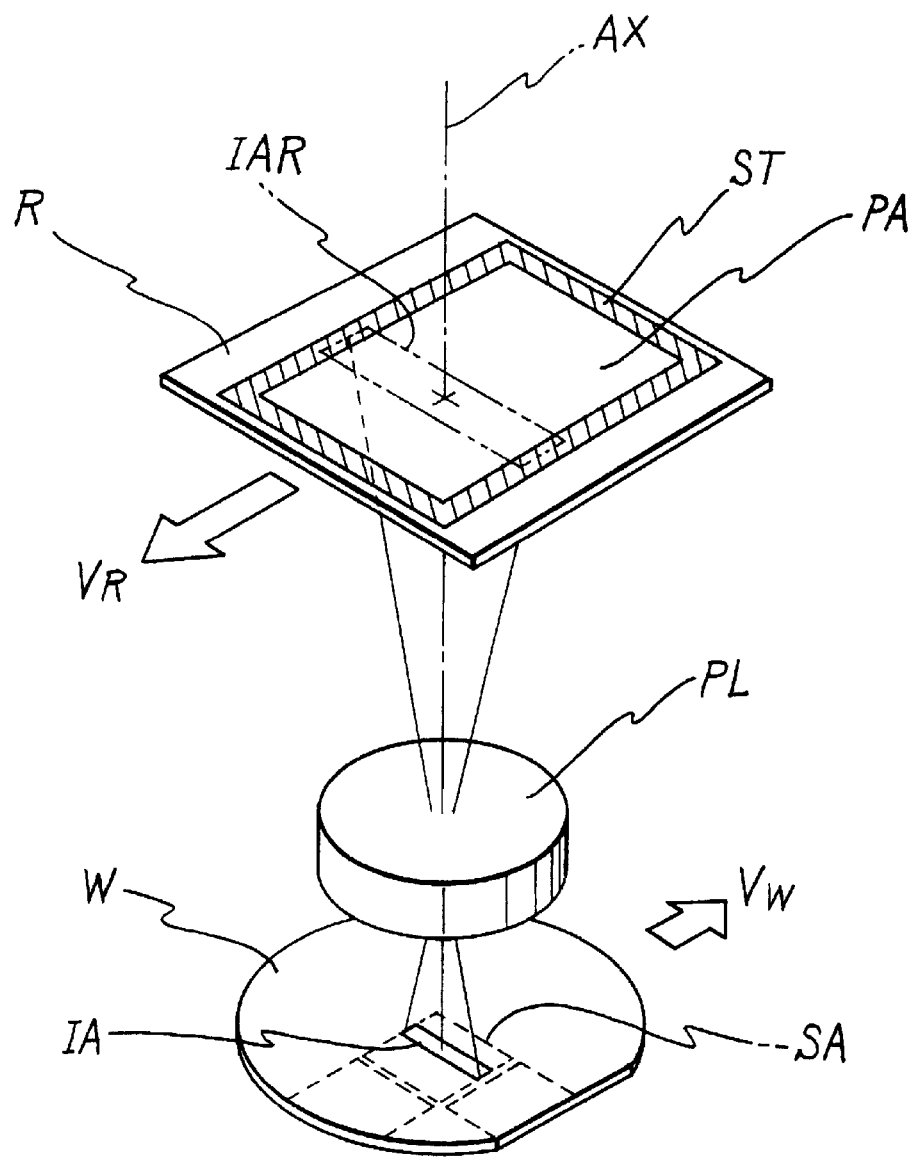
FIG. 17 is a diagram illustrating the principle of scanning exposure of the exposure apparatus of FIG. 1.
Figure 17:
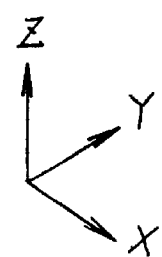

In the scanning type exposure apparatus 100 according to this embodiment, as illustrated in FIG. 17, the reticle R is illuminated in a rectangular (or slit-like) illumination area IAR which longitudinal direction is perpendicular to the scanning direction of the reticle R. The reticle R is scanned at a speed VR in the (−Y) direction on exposure. The illumination area IAR (the center of which almost coincides with the optical axis AX) is projected onto the wafer W via the projection optical system PL. A slit-shaped projection area, which is conjugate with the illumination area IAR, that is, the exposure area IA, is formed. The wafer W and the reticle R have an inverted image forming relationship. The wafer W is, thus, scanned at a velocity Vw synchronously with the reticle R in the direction opposite to the scanning direction of the reticle R, allowing the entire shot area SA on the wafer W to be exposed. The velocity ratio $V_W/V_R$ of the scanning speed precisely corresponds to the reduction ratio of the projection optical system PL, and the pattern of the pattern area PA of the reticle R is accurately reduced and transferred onto the shot area SA on the wafer W. The width in the longitudinal direction of the illumination area IAR is determined so as to be wider than that of the pattern area PA on the reticle R and to be narrower than the maximum width of the shielding area ST. And by scanning the reticle R, the entire pattern area PA is illuminated.

Hereinafter, the operation of each part of the embodiment when the wafer W is moving will be described.

First, the movement of the wafer W in this embodiment, that is, the outline of the movement of the mover 51 of the planar motor device 50, will be described by referring to FIGS. 18 to 36.

Figure 18:
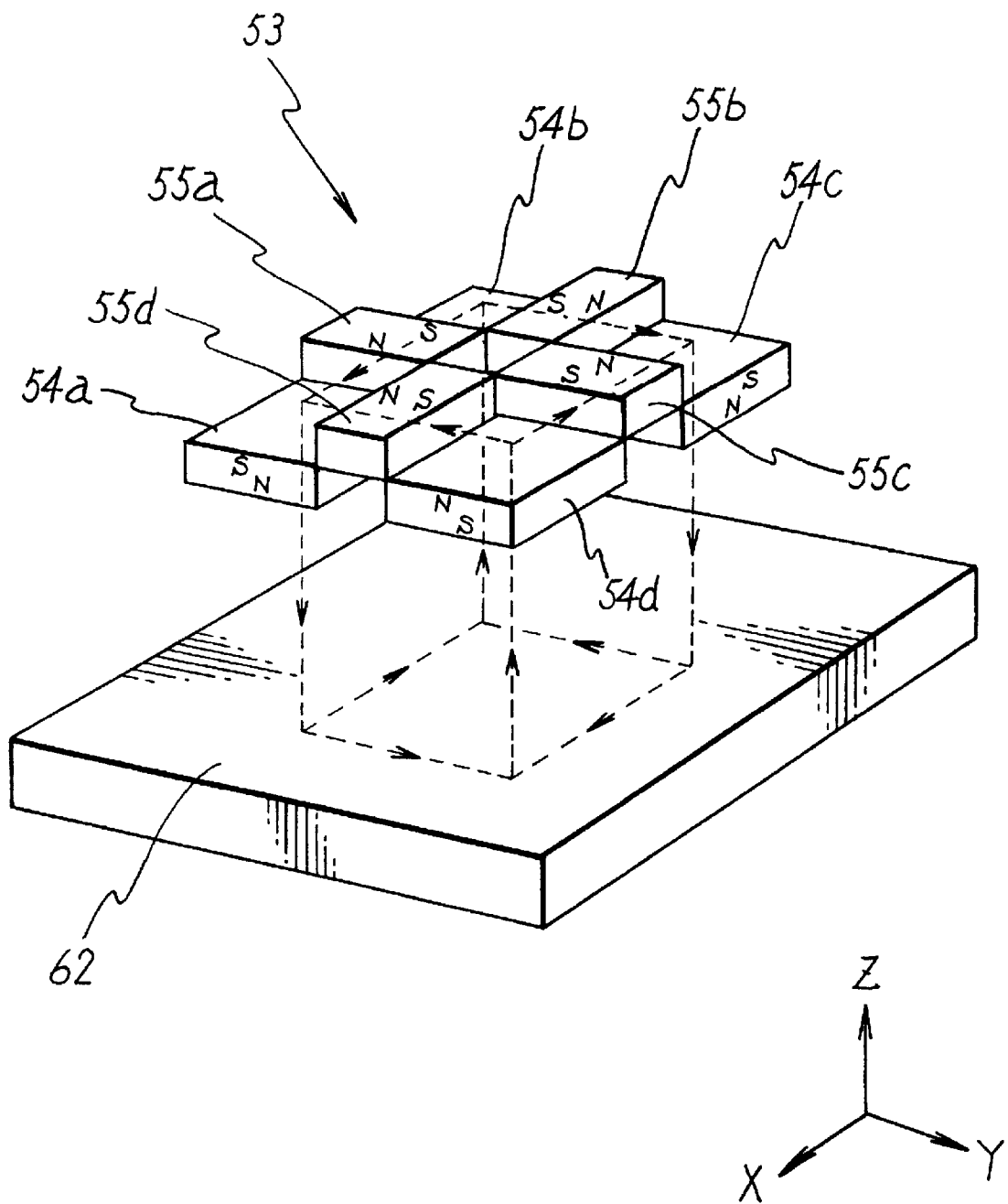
FIG. 18 is a perspective diagram illustrating magnetic circuits of the planar motor, which structure the stage of FIG. 1.
Figure 19A:
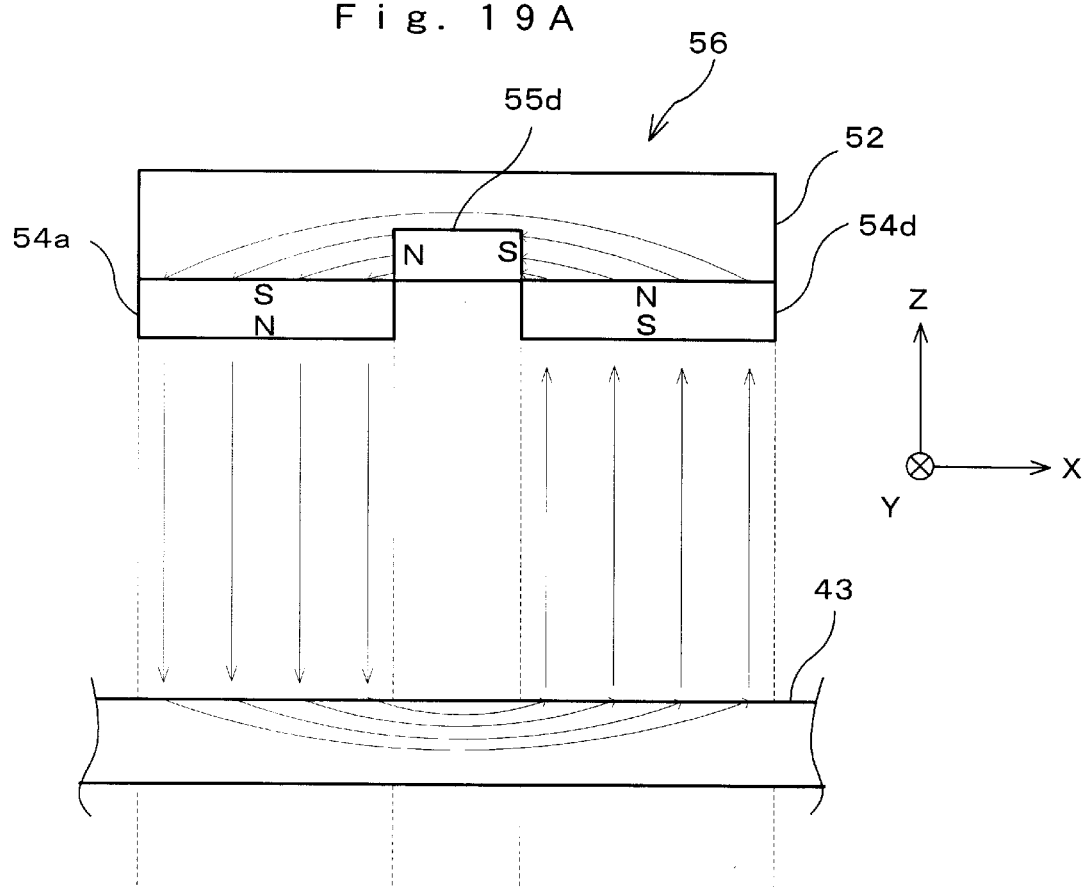
FIG. 19A and 19B are diagrams illustrating one of the magnetic circuits of FIG. 18.
Figure 19B:
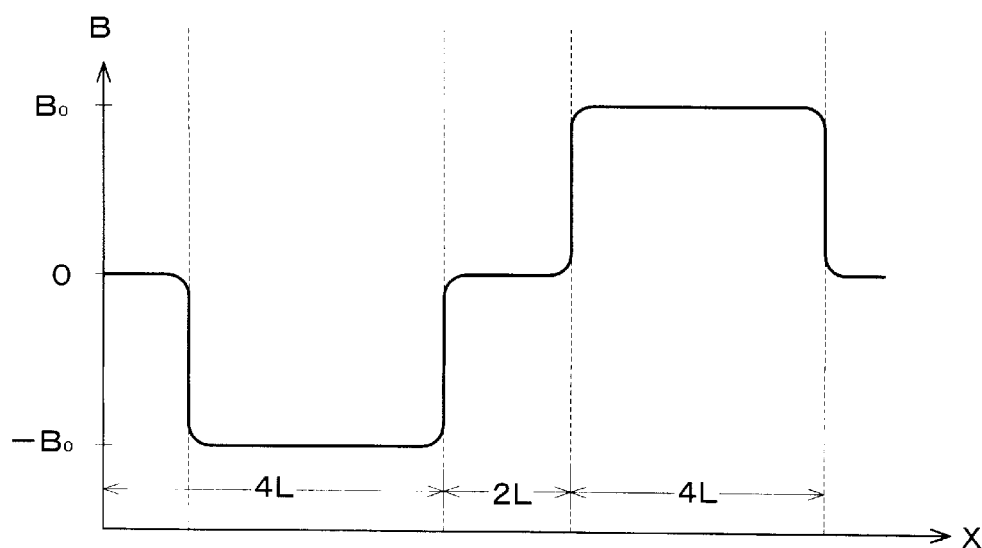

In FIGS. 18, 19A, and 19B, the outline of a magnetic circuit structured of the mover 51 and the stator 60 is illustrated. FIG. 18 shows a perspective diagram illustrating the outline of magnetic circuit. The dashed lines indicate the center axis of the magnetic flux that flows through the magnetic circuit, and the arrows show the directions of the magnetic flux. As shown in FIG. 18, the magnetic flux is generated in between the magnetic pole unit 56 of the mover 51 and the stator yoke 43 of the stator 60. The magnetic flux is also generated between each adjacent pair of the thrust generating magnets (54a, 54b), (54b, 54c), (54c, 54d), (54d, 54a) of the magnetic pole unit 56 via the interpolating magnets 55a, 55a, 55c, 55d respectively. Moreover, a magnetic flux is generated in the stator yoke 43. Thus, four magnetic circuits are formed. That is, a magnetic flux flows from one thrust generating magnet (for instance, the thrust generating magnet 54a) to the stator yoke 43, then onto another adjacent thrust generating magnet (for instance, the thrust generating magnet 54a). It then goes on to the interpolating magnet (for instance, the interpolating magnet 55d) arranged in between the one and adjacent thrust generating magnets, sequentially, and then back to the former thrust generating magnet (54a). A magnetic flux is also generated within the magnetic member 52, placed on the upper surface of the magnet assembly 53, and although the magnetic circuit structure includes the magnetic member 52, the magnetic member 52 is omitted in FIG. 18.

FIG. 19A illustrates one of the four magnetic circuits described above, in respect to the thrust generating magnet 54a, the stator yoke 43, the thrust generating magnet 54d, and the interpolating magnet 55d, and the solid-line arrows indicate the direction of the magnetic flux. In this magnetic circuit, as illustrated in FIG. 19A, a magnetic flux is generated from the thrust generating magnet 54a, from the (north pole) surface opposing the stator yoke 43 in the (−Z) direction (a downward direction in paper, on which this figure is drawn). Also within the stator yoke 43, a magnetic flux which main magnetic flux direction is the (+X) direction, is generated. And from the opposing position on the stator yoke 43 corresponding to the thrust magnet 54d, a magnetic flux is generated in the (+Z) direction (an upward direction in paper, on which this figure is drawn). From the north pole surface of the thrust generating magnet 54d, a magnetic flux of which the main magnetic flux direction is the (−X) direction, is generated. Most of the generated magnet flux enter the south pole surface of the interpolating magnet 55d, and the remaining of the generated magnetic flux flow through the magnetic member 52 and into the south pole surface of the thrust generating magnet 54a. Furthermore, from the north pole surface of the interpolating magnet 55d, a magnetic flux flowing to the south pole surface of the thrust generating magnet 54a is generated. The magnetic circuit is thus formed, where a magnetic flux sequentially circulates the thrust generating magnet 54a, the stator yoke 43, the thrust generating magnet 54d, and the interpolating magnet 55d.

The amount of magnetic flux flowing through the magnetic circuit is determined according to the magnetomotive force and the reluctance of the magnetic circuit. When the magnetomotive force is higher, the amount of magnetic flux becomes larger, and when the reluctance is lower, the amount of magnetic flux becomes larger. And, when the amount of magnetic flux becomes larger, the magnetic density becomes higher in the space on the upper portion of paper in FIG. 19, above where the stator yoke 43 is drawn.

In the planar motor device 50 according to this embodiment, the magnetomotive force of the magnetic circuit illustrated in FIG. 19A is reinforced by arranging the interpolating magnet 55d in addition to the thrust generating magnet 54a and 54d. Furthermore, other than the space between the mover 51 and the stator 60, the magnetic flux flows through a medium, that is, the magnetic member 52 and 62 that both have a low reluctance, which in turn reduces the reluctance of the magnetic circuit. Accordingly, the magnetic flux density of the space in the vicinity of the top surface of the stator yoke 43, in which the armature coil 38 is arranged, can be increased, and as a consequence, the Lorentz force can be efficiently generated. Also, since the magnetic flux is confined in the area between the magnetic member 52 and the stator yoke 43 (including the magnetic member 52 and the stator yoke 43), the members externally arranged are not affected by its magnetic influence. In the following description, the thrust generating magnet 54a to 54d are identical permanent magnets that provide the same magnetic force, except for the direction of magnetization.

In this case, the distribution of the magnetic flux density B in the proximity of the upper surface of the stator yoke 43, that is, the Z-position, where the armature unit 25 is arranged, is as illustrated in FIG. 19B. That is, the (gap) distance in between the mover 51 and the stator yoke 43 is actually sufficiently shorter than the length 4L, which is the length of one side of the magnetic pole surface of the thrust generating magnet 54a. Therefore, the magnetic flux density B is an almost constant value ($-B_0$) at the position opposing the thrust generating magnet 54a, and at the position opposing the thrust generating magnet 54d has an approximately constant value ($+B_0$). And, at a position where the thrust generating magnet 54a and 54d do not oppose each other, The magnetic flux density B becomes zero. In FIG. 19B, when the direction of the magnetic flux is in the (+Z) direction, the value of the magnetic flux density B is determined positive, whereas, when the direction of the magnetic flux is in the (−Z) direction, the value of the magnetic flux density B is negative.

The properties of the magnetic circuit relating to the adjacent thrust generating magnets (54a, 54d) applies to the respective magnetic circuits of the other pairs of the adjacent thrust generating magnets (54a, 54b), (54b, 54c), and (54c, 54d). Accordingly, the magnetic flux density distribution corresponding to the Y-direction is similar to that of the X-direction shown in FIG. 19B.

With the planar motor device 50 of this embodiment, the thrust generating magnet 54a to 54d of the mover 51 are arranged in a two-by-two matrix, so as to minimize the direction of magnetic flux from inverting by the movement of the mover 51 in the stator yoke 43. Eddy current generated in the stator yoke 43 is thus suppressed, allowing the reluctance to be maintained at a low value. Therefore, even when the mover 51 moves, a magnetic flux having a high-density can be continuously generated.

Hereinafter, the driving operation of the mover 51 by a Lorentz force, which is generated by the interaction between the magnetic flux between the mover 51 and the stator yoke 43 and the electric current flowing through the armature coil 38, is described.

Figure 20A:
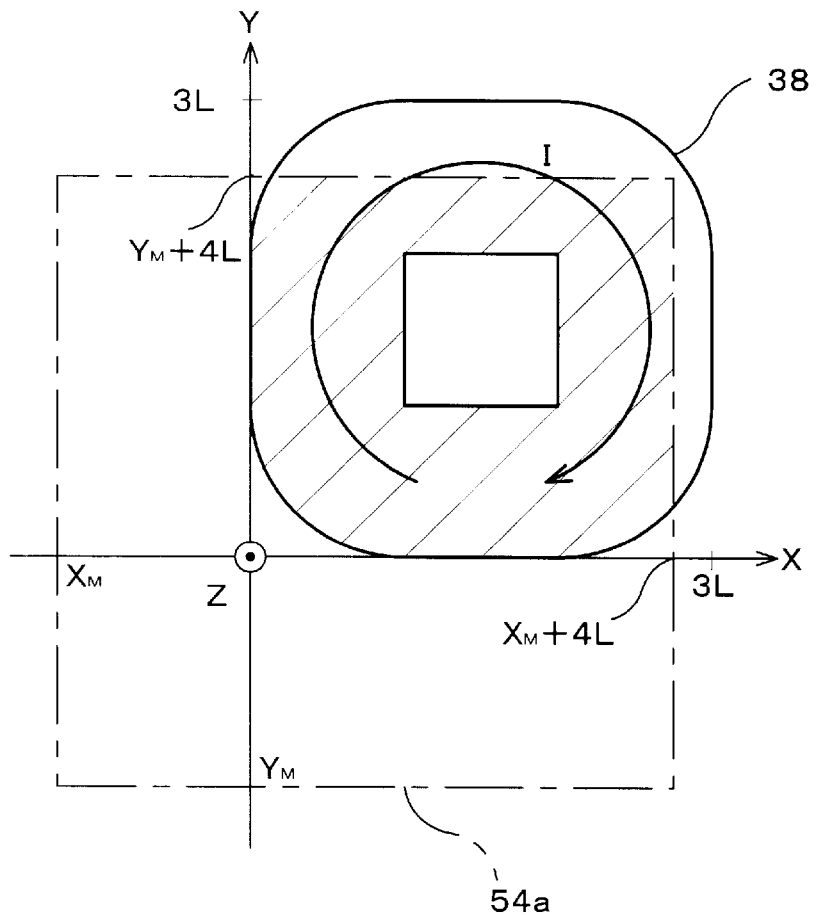
FIGS. 20A and 20B are diagrams illustrating the definitions of expressions concerning the armature coil in the present specification.

Prior to describing the driving operation, the representations of the armature coil 38 in the drawings used in the following description are described by referring to FIGS. 20A and 20B. As illustrated in FIG. 20A, when the armature coil 38 is viewed from the (+Z) direction, the current path is in the shape of a square which has an inner side with a length of L and an outer side having a length of 3L with rounded corners. And when electric current is supplied to the armature coil 38, an electric current having a constant current density (or volume density) flows in the coil clockwise or counterclockwise, as indicated in FIG. 20A. In this case, as illustrated in FIG. 20A, the solid arrow indicates the direction of electric current flowing though the armature coil 38, and the amount of the electric current is expressed as "I". In the case of viewing from the (+Z) direction as illustrated in FIG. 20A, when the current flowing is clockwise, the electric current is referred to as a "positive current" I. When the current flowing is counterclockwise when viewed from the (+Z) direction, the electric current is referred to as a "negative current" (−I). The Lorentz force is generated on the current path by the interaction of the current I or (−I) and the magnetic flux. The area, where the Lorentz force is generated, opposes the thrust generating magnet 54 (for example, the thrust generating magnet 54a) as is indicated by the oblique lines in FIG. 20A. And the area where the Lorentz force is generated, changes with the movement of the mover 51 (that is, the movement of the thrust generating magnet 54a to 54d). The resultant of forces of the Lorentz force generated at each position of the area act on the armature coil 38, and the reaction force of the resultant force becomes the driving force to drive the mover 51. That is, the thrust of the mover 51.

Figure 20B:
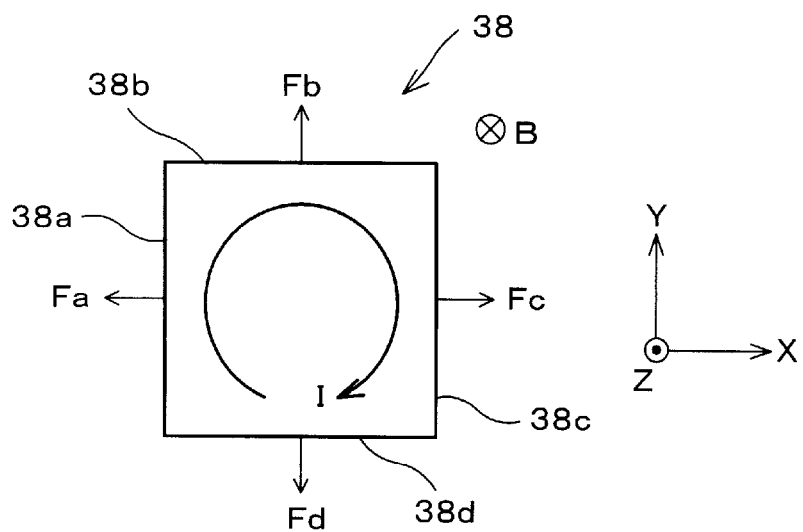

In the following description, when describing the Lorentz force generated in the armature coil 38, a linear square-shaped drawing represents the armature coil 38, as shown in FIG. 20B. And, the left-hand side of paper on which FIG. 20B is drawn, the top side, the right-hand side, and the bottom side of the coil are respectively designated as 38a, 38b, 38c, and 38d. Also, the Lorentz force generated on the sides 38a, 38b, 38c, and 38d are respectively denoted as Fa, Fb, Fc, and Fd. Since the armature coil 38 is arranged in the shape of a matrix as shown in FIG. 2B, when the armature coil 38 arranged in a matrix shape need to be identified, each armature coil 38 is represented such as "armature coil 38 (i, j)" ("i" and "j" are integers). Accordingly, on indicating the armature coil 38 (i, j) as is illustrated in FIG. 20B, the sides of the armature coil 38 (i, j) are respectively designated as "38a(i, j)", "38b(i, j)", "38c(i, j)", "38d (i, j)". And, the Lorentz force generated on the sides expressed as "38a(i, j)", "38b(i, j)", "38c(i, j)", "38d(i, j)" are respectively represented as "Fa(i, j)", "Fb(i, j)", "Fc(i, j)", and "Fd(i, j)". In the drawings referred to in the following description, for the sake of convenience, the designations "38a(i, j)" to "38d(i, j)", and "Fa(i, j)" to "Fd(i, j)" are omitted.

FIGS. 21A to 24D illustrate the relationship between the current supplied to the armature coil 38 and the Lorentz force, especially, examples of the direction of the resultant of forces of the Lorents force. In FIGS. 21A to 24D, an arrangement example of the armature coil 38 and the thrust generating magnet 54a is shown in a XY coordinate system. The armature coil 38(1, 1), 38(1, 2), 38(2, 1), and 38(2, 2) are arranged in a two-by-two matrix. The origin of the XY coordinate system on paper, is on the lower left hand side of the armature coil 38(1, 1), and the thrust generating magnet 54a is arranged so that the coordinate values of the lower left corner coincides with the value (L, L). And in FIGS. 21A to 24D, as a typical example, the part related to the thrust generating magnet 54a, is shown. Also FIGS. 21B, 21D, 22B, 22D, 23B, 23D, 24B, and 24D are drawn in accordance with the representation method in FIG. 20B for describing the force F. In these figures, solid-line arrows designate the Lorentz force generated on the sides of the current path, whereas bold line arrows indicate the resultant of forces of the Lorentz force. And, the central position of the thrust generating magnet 54a, is indicated by a star mark. In the case of FIGS. 21A to 24D, the resultant of forces of the thrust generating magnet 54a, which is caused by the resultant of forces of the Lorentz force, acts on the central position of the magnet 54a.

Figure 21A:
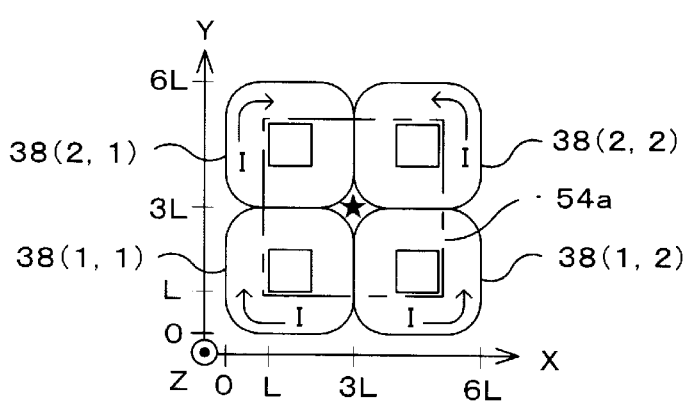
FIGS. 21A to 35B are diagrams illustrating an example of the Lorentz force acting on the armature coil.
Figure 21B:
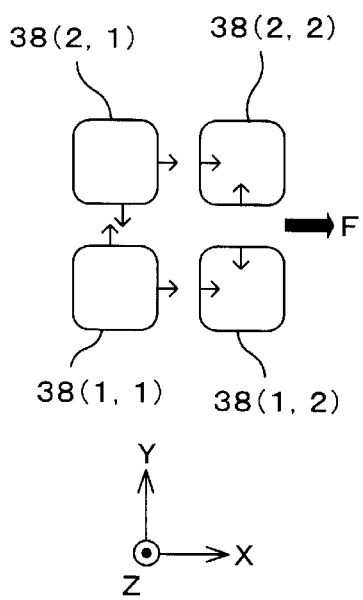

As illustrated in FIG. 21A, in the case the current flowing through the armature coil 38(1, 1), and 38(2, 1) is +I (clockwise), and the current flowing through the armature coil 38(1, 2), and 38(2, 2) is –I (counterclockwise), the Lorentz force Fb(1, 1) acting in the (+Y) direction is generated on the side 38b (1, 1) of the armature coil 38(1, 1), and the Lorentz force Fc(1, 1) acting in the (+X) direction is generated on the side 38c(1, 1), as illustrated in FIG. 21B. The Lorentz force Fa(1, 2) acting in the (+X) direction is generated on the side 38a (1, 2) of the armature coil 38(1, 2), and the Lorentz force Fb(1, 2) acting in the (–Y) direction is generated on the side 38b(1, 2). The Lorentz force Fc(2, 1) acting in the (+X) direction is generated on the side 38c(2, 1) of the armature coil 38(2, 1), and the Lorentz force Fd(2, 1) acting in the (–Y) direction is generated on the side 38d(2, 1). The Lorentz force Fa(2, 2) acting in the (+X) direction is generated on the side 38a(2, 2) of the armature coil 38(2, 2), and the Lorentz force Fd(2, 2) acting in the (+Y) direction is generated on the side 38d(2, 2).

When each force is generated, the force acting in the (+Y) direction and the force acting in the (–Y) direction cancel out. This is because the current amount, the magnetic flux density, the size of the area intersecting between the current and the magnetic flux (the symmetry in respect to the current amount, the magnetic flux amount, and the area of intersection) are all the same. Accordingly, only the component of the force acting the (+X) direction remains. Consequently, the resultant of forces of the Lorentz force generated on the four armature coil 38(1, 1), 38(1, 2), 38(2, 1), and 38(2, 2) becomes the force F acting in the (+X) direction, as shown in FIG. 21B. Therefore, the force exerted on the thrust generating magnet 54a is a reaction force of the force F, thus being the force (–F) acting in the (–X) direction.

Since the arrangement period 6L of the thrust generating magnet 54a to 54d is twice the arrangement period 3L of the armature coil 38, the positional relationship among the thrust generating magnets 54b to 54d and the armature coil 38 is similar to that of the thrust generating magnet 54a. Accordingly, in the case of the thrust generating magnet 54c which has a magnetic pole surface similar to that of the thrust generating magnet 54a, electric current is supplied similarly to the opposing armature coil, as with the case of the thrust generating magnet 54a. In the case of the thrust generating magnets 54b and 54d, electric current which flows in the opposite direction of the current in the thrust generating magnet 54a, is supplied to the armature coils. The remaining thrust generating magnets 54b to 54d are respectively provided with the force (–F), which has an identical force in the same direction (–X direction) as that of the magnet 54a. As a result, the mover 51 is driven in the (–X) direction, and the resultant of forces, –4F, of the force acting on each thrust generating magnet 54a to 54d becomes the thrust of the mover 51.

Figure 21C:
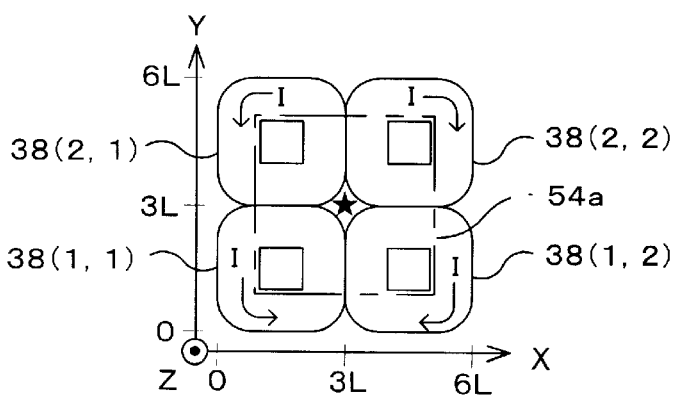
Figure 21D:
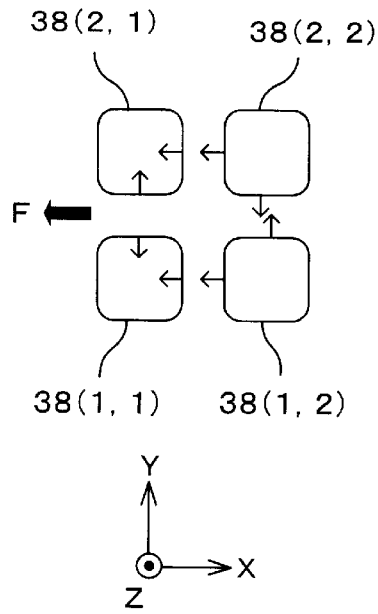

Next, as in FIG. 21C, with respect to the positional relationship between the thrust generating magnet 54a and the armature coil 38 (i, j) (i=1, 2; j=1, 2), the case when all directions of the current shown in FIG. 21A are reversed is described. The magnet and coil used are similar to those in FIG. 21A. In this case, as illustrated in FIG. 21D, the forces generated on each sides of the armature coil 38(i, j) are in the opposite direction, against the forces generated in the corresponding sides in FIG. 21B. Consequently, the force acting in the (+Y) direction and the force acting in the (–Y) direction cancel out, thus, only the component of the force acting the (–X) direction remains. Accordingly, the resultant of forces of the Lorentz force generated on the four armature coils 38(i, j)(i=1,2; j=1,2) becomes the force F acting in the (–X) direction shown in FIG. 21D. Consequently, the force acting on the thrust generating magnet 54a is the reaction of the force F, and is the force (–F) acting in the (+X) direction.

In this case, similar to the case of FIG. 21A and 21B, electric current is supplied to the armature coils opposing the magnets 54b to 54d according to the polarity of the opposing thrust generating magnets 54b to 54d. Therefore, the force (–F) which has an identical force in the same direction (+X direction) as in the case of the magnet 54a can be provided to each remaining thrust generating magnets 54b to 54d. As a result, the mover 51 is driven in the (+X) direction, and the resultant of forces, –4F, of the force exerted on each thrust generating magnet 54a to 54d becomes the thrust of the mover 51.

Figure 22A:
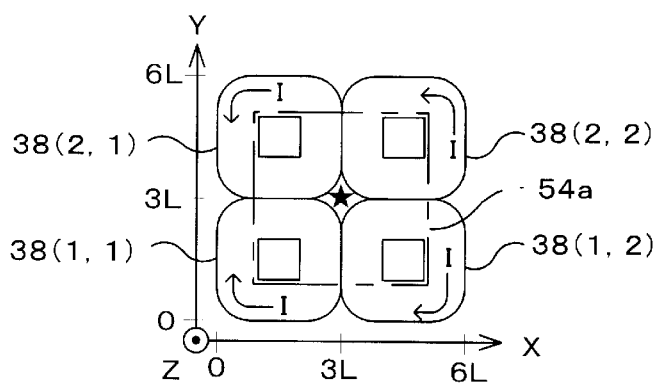
Figure 22B:
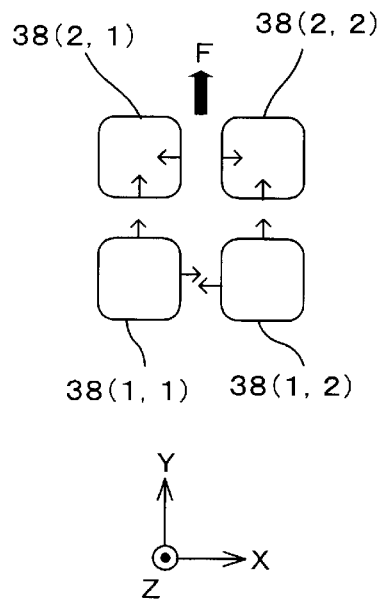

Also, when the current flowing through the armature coil 38(1, 1) and 38(1, 2) is +I (clockwise) and the current flowing through the armature coil 38(2, 1) and 38(2, 2) is –I (counterclockwise) as in FIG. 22A, the Lorentz force is generated on the sides as in FIG. 22B. However, only the component of the force acting the (+Y) direction remain, since the force acting in the (+X) direction and in the (–x) direction cancel out due to the relationship (such as rotation symmetry, translation symmetry) concerning the current amount, the magnetic flux amount, and the intersection area. Accordingly, the resultant of forces of the Lorentz force generated on the four armature coils 38(i, j)(i=1,2; j=1,2) is the force F acting in the (+Y) direction shown in FIG. 22B. Therefore, the force acting on the thrust generating magnet 54a is a reaction force of the force F, and thus is the force (–F) acting in the (–Y) direction.

Figure 22C:
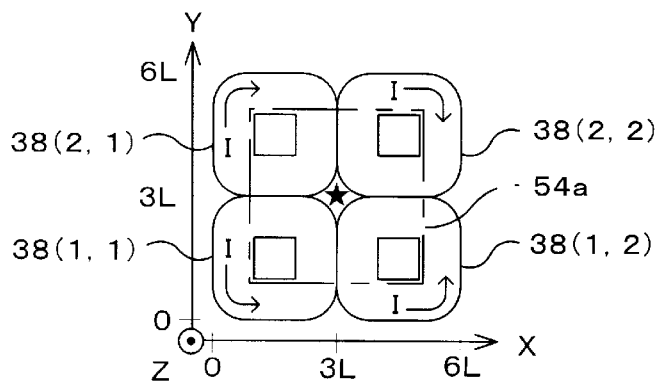
Figure 22D:
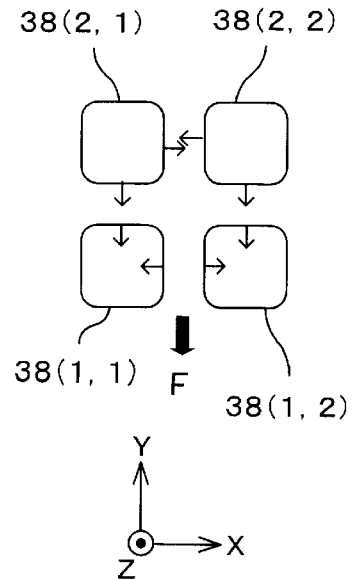

Also, the case is considered when all the current direction of the currents shown in FIG. 22A are reversed as in FIG. 22C, in respect to the positional relationship between the thrust generating magnet 54a and the armature coil 38(i, j) shown in FIG. 22A. In this case, as shown in FIG. 22D, the direction of the forces generated on the sides of the armature coil 38(i, j) are all opposite to that of the corresponding sides shown in FIG. 22B. As a result, the force acting in the (+X) direction and the force acting in the (–X) direction cancel out, with only the component of the force acting the (–Y) direction remaining. Accordingly, the resultant of forces of the Lorentz force generated on the four armature coils 38(i, j)(i=1,2; j=1,2) becomes the force F, acting in the (–Y)

direction shown in FIG. 22D. Therefore, the force acting on the thrust generating magnet 54a is a reaction force of the force F, and thus is the force (−F) acting in the (+Y) direction.

In the case of FIGS. 22A and 22B and FIGS. 22C and 22D, as with the case of FIGS. 21A and 21B, electric current is supplied to the armature coils opposing the thrust generating magnets 54b to 54d according to the polarity of the opposed magnets 54b to 54d. Thus, the force (−F) which has the identical force in the same direction (+Y direction or −Y direction) as in the case of the thrust generating magnet 54a, can be provided to each thrust generating magnets 54b to 54d. Consequently, the mover 51 is driven in the (−Y) direction or the (+Y) direction, and the resultant of forces, −4F, acting on the thrust generating magnet 54a to 54d becomes the thrust of the mover 51.

Examples of supplying electric current to the armature coil 38(i, j) so as to drive the mover 51 in the (+X) direction or (−X) direction, or in the (+Y) direction or (−Y) direction have been described above by referring to FIGS. 21A to 22D. In the case of driving the mover 51 in directions other than these directions, by supplying the armature coil 38 an electric current that has an overlay current pattern, the mover 51 can be moved in a preferred direction. The overlay current pattern, is a current pattern of the X component and Y component in the desired direction.

Figure 23A:
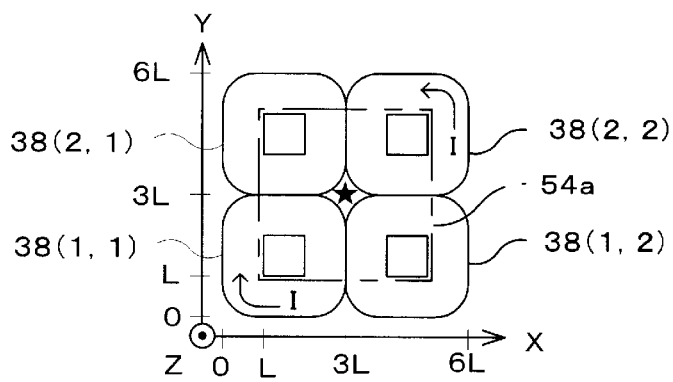
Figure 23B:
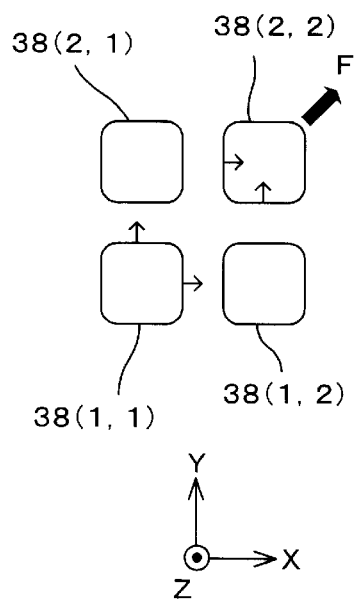

That is, in FIG. 23A which is the overlay current pattern of the current pattern of FIG. 21A and FIG. 22A, in other words, the electric current +I is supplied to the armature coil 38(1, 1), the electric current −I is supplied to the armature coil 38(2, 2), and no current is supplied to the coil 38(1, 2) and 38(2, 1). As shown in FIG. 23B, with the armature coil 38(1, 1), the Lorentz force Fb(1, 1) acting in the (+Y) direction is generated on the side 38b(1, 1), and the Lorentz force Fc(1, 1) acting in the (+X) direction is generated on the side 38c(1, 1). With the armature coil 38(2, 2), the Lorentz force Fa(2, 2) acting in the (+X) direction is generated on the side 38a(2, 2), and the Lorentz force Fd(2, 2) acting in the (+Y) direction is generated on the side 38d(2, 2). That is, forces acting in both the (+X) direction and the (+Y) direction are generated.

Due to the relationship (such as rotation symmetry, translation symmetry) concerning the current amount, the magnetic flux amount, and the intersection area, each force generated are of identical force. The resultant of forces, therefore, is the force F acting in the upper rightward direction at 45 degrees, on paper. Accordingly, the force F acting in the lower leftward direction at 45 degrees on paper is provided to the thrust generating magnet 54a. The direction of such a force is the same as the direction of the resultant of force in FIG. 21B and in FIG. 22B.

Figure 23C:
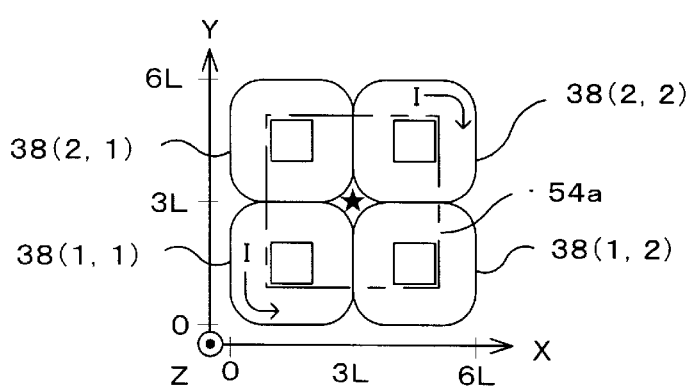
Figure 23D:
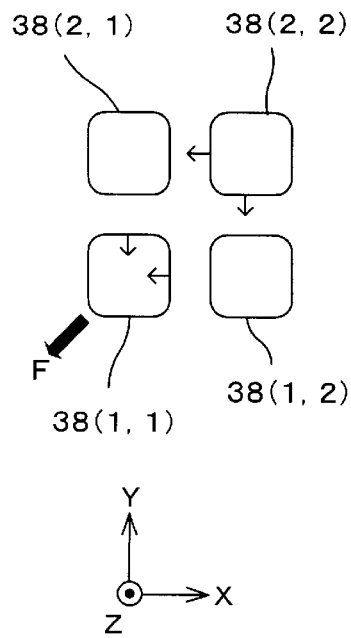

Also, the case is considered when all the current direction of the current s shown in FIG. 23A are reversed a s in FIG. 23C, in respect to the positional relationship between the thrust generating magnet 54a and the armature coil 38(i, j) shown in FIG. 23A. That is, the case when a current is supplied in which the current has the overlay current pattern of the current patterns in FIG. 21C and FIG. 22C. In this case, as shown in FIG. 23D, the direction of the Lorentz force generated on each sides of the armature coil 38(i, j) are all opposite to that of the corresponding sides shown in FIG. 23B. As a consequence, as illustrated in FIG. 23D, the resultant of forces of the Lorentz force generated in the armature coil 38(i, j), is the force F acting in the lower leftward direction at 45 degrees on paper. Accordingly, the force −F acting in the upper rightward direction at 45 degrees is provided to the thrust generating magnet 54a.

Figure 24A:
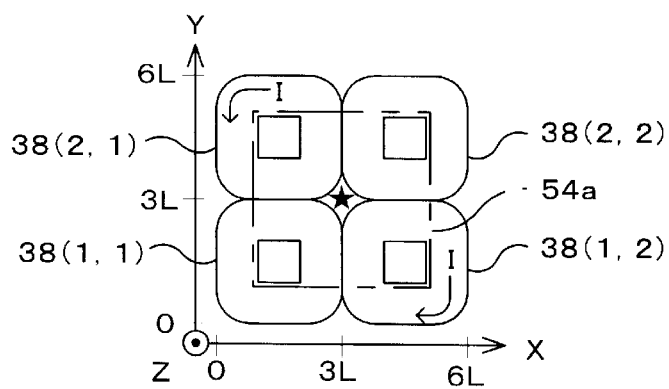
Figure 24B:
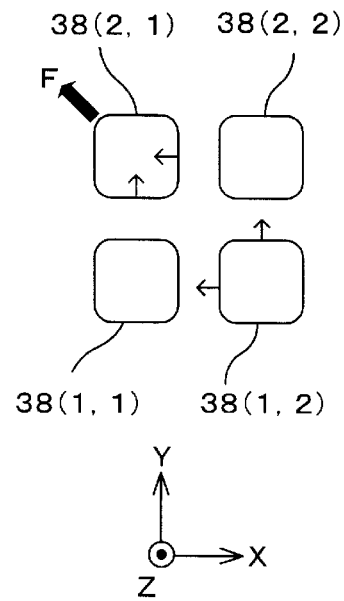

Also, as illustrated in FIG. 24A, the case when an overlay current pattern is supplied, in which the current patterns are those of FIG. 21C and FIG. 22A is considered. That is, the current +I is supplied to the armature coil 38(1,2), the current −I is supplied to the armature coil 38(2,1), and no current is supplied to the armature coil 38(1,1) and 38(2,2). In this case, as illustrated in FIG. 24B, with the armature coil 38(1,2), the Lorentz force Fa(1, 2) acting in the (−X) direction and the Lorentz force Fb(1,2) acting in the (+Y) direction are generated. With the armature coil 38(2,1), the Lorentz force Fc(2,1) acting in the (−X) direction and the Lorentz force Fd(2,1) acting in the (+Y) direction are generated. That is, the force acting in both the (−X) direction and the (+Y) direction are generated. As a consequence, the resultant of forces of the Lorentz force generated on the armature coil 38(i,j) is the force F, acting in the upper leftward direction at an angle of 45 degrees on paper as illustrated in FIG. 24B. Accordingly, the force −F acting the lower rightward direction at an angle of 45 degrees is provided to the thrust generating magnet 54a.

Figure 24C:
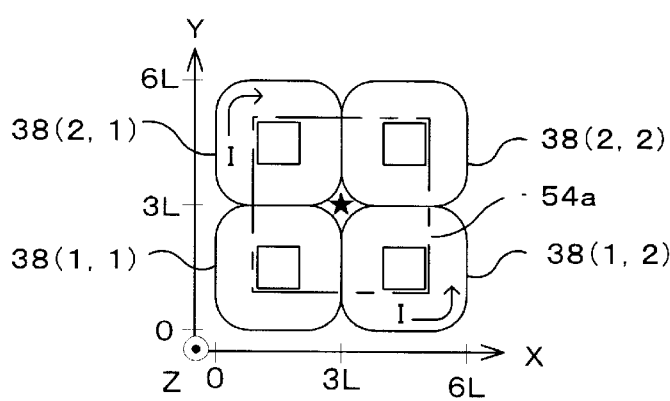
Figure 24D:
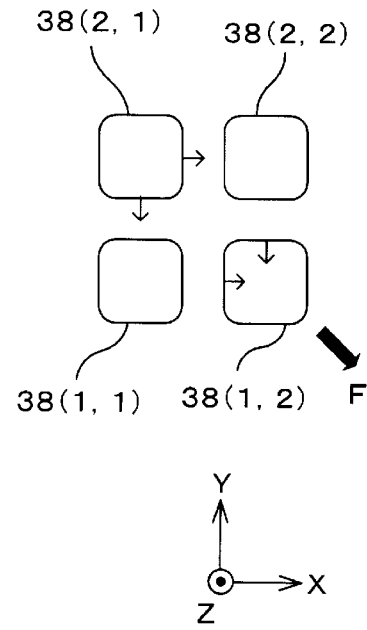

And, in the case that all directions of the electric current in FIG. 24A are reversed as illustrated in FIG. 24C, that is, the electric current which is obtained by overlaying the current pattern of FIG. 21A and FIG. 22C is supplied. In this case, as shown in FIG. 24D, the direction of the Lorentz force generated on each side of the armature coil 38(i,j) are all opposite to those in FIG. 24B. As a result, the resultant of forces of the Lorentz force generated on the armature coil 38(i,j) is the force F acting in the lower rightward direction at an angle of 45 degrees on paper, as illustrated in FIG. 24D. Thus, the force −F acting in the upper leftward direction at an angle of 45 degrees on paper is provided to the thrust generating magnet 54a.

In the case of FIGS. 23A to 24D, as with the case of FIGS. 21A to 22D, by supplying the electric current to the armature coils opposing the thrust generating magnet 54b to 54d according to the polarity of the magnets, a force which has an identical force in the same direction as in the case of the magnet 54a can be provided to each remaining thrust generating magnets 54b to 54d.

Also, in order to equalize the amount of the resultant of forces in FIGS. 21A to 22D and the resultant of forces in FIGS. 23A to 24D, the current amount in FIGS. 23A to 24D is to be $2^{1/2}$ times the current amount of FIGS. 21A to 22D.

As described above with reference to FIGS. 21A to 24D, when the thrust generating magnet 54a to 54d and the armature coil 38 are arranged to have a specific positional relationship, the mover 51 can be driven in a desired direction at a desired amount of force. Such driving of the mover 51 in the desired direction by the force having the desired amount of force, can be achieved in any positional relationship between the thrust generating magnet 54a to 54d and the armature coil 38. This will now be explained with reference to FIGS. 25a to 36, which is an example when the mover 51 is driven in the (+X) direction by the driving force $F_0$.

First, an example is described with reference to FIGS. 25A to 31B. In this case, the positional relationship between the thrust generating magnet 54a to 54d and the armature coil 38 as in FIGS. 21A to 24D, changes in the (+Y) direction which is perpendicular to the driving direction, while providing the driving force in the (+X) direction to the mover 51. In FIGS. 25a to 31B, the arrangement of the armature coil 38 and the thrust generating magnet 54a is shown in a XY coordinate system. The armature coil 38(1, 1), 38(1,2), 38(2,1), 38(2,2), 38(3,1), 38(3,2) are arranged in a three-by-two matrix. The origin of the XY coordinate system on paper, is on the lower lefthand side of the armature coil 38(1,1), and the thrust generating magnet 54a is arranged so that the coordinate value of the lower left corner $(X_M, Y_M)$ (hereunder referred to as the "coordinates $(X_M, Y_M)$ of the thrust generating magnet 54a") moves within the range from the coordinate values (L, L) to (L, 4L). FIGS. 25A to 31B illustrate the driving force acting on the mover 51 as the coordinate values of the thrust generating magnet 54a change from the coordinates (L, L) to (L, 4L), by focusing on the thrust generating magnet 54a. The portions related to the thrust generating magnet 54a are representatively illustrated, due to the reason that the arrangement period of the armature coil 38 in the (+Y) direction is 3L. The current I(i,j) is supplied to the armature coil 38(i,j) (i=1 to 3, j=1 to 3). Also, similar to the case of FIGS. 11 and 12, in FIGS. 25B, 26B, 27B, 28B, 29B, 30B, and 31B for describing the force F, the Lorentz force generated on the sides of the current path are indicated by solid-line arrows. Thick-line arrows indicate the resultant of forces of the Lorentz force. And, the central position of the thrust generating magnet 54a is indicated by a star mark.

Figure 25A:
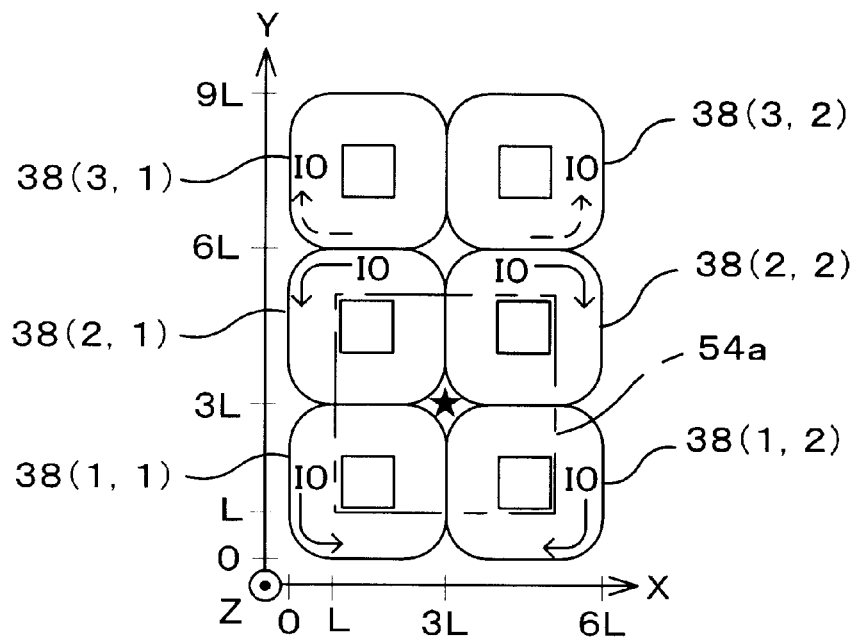
Figure 25B:
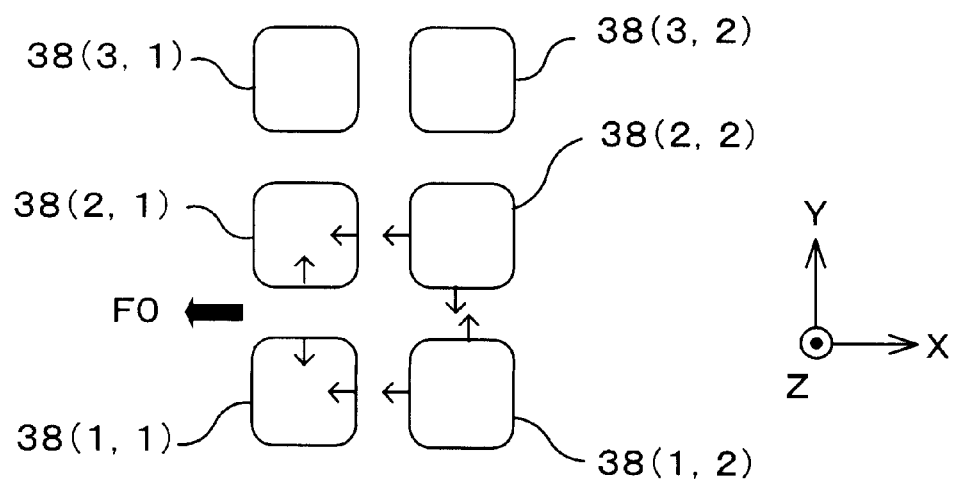

FIG. 25a illustrates the case when the coordinate values $(X_M, Y_M)$ of the thrust generating magnet 54a is (L, L). Similar to the case in FIG. 21C, the current supplied to the armature coil 38 (1,1) and 38(2,1) is −I0 (counterclockwise), and the current supplied to the armature coil 38 (1,2) and 38(2,2) is +I0 (clockwise), so as to drive the mover 51 in the (+X) direction by the force F0. In this case, as illustrated in FIG. 25B, with the armature coil 38(1,1), the Lorentz force Fb(1,1) acting in the (−Y) direction is generated on the side 38b(1,1), and the Lorentz force Fc(1,1) acting in the (X) direction generated on the side 38c(1,1). With the armature coil 38(1,2), the Lorentz force Fa(1,2) acting in the (−X) direction is generated on the side 38a(1,2), and the Lorentz force Fb(1,2) acting in the (+Y) direction generated on the side 38b(1,2) . With the armature coil 38(2,1), the Lorentz force Fc(2,1) acting in the (−X) direction is generated on the side 38c(2,1), and the Lorentz force Fd(2,1) acting in the (+Y) direction generated on the side 38d(2,1). With the armature coil 38(2,2), the Lorentz force Fa(2,2) acting in the (−X) direction is generated on the side 38a(2,2), and the Lorentz force Fd(2,2) acting in the (−Y) direction generated on the side 38d(2,2) . Accordingly, the Lorentz force Fb(1, 1), Fb(1,2), Fd(2,1), Fd(2,2) acting in the (+Y) direction and the (−Y) direction cancel out, due to the relationship (such as rotation symmetry, translation symmetry) concerning the current amount, the magnetic flux amount, and the intersection area. Meanwhile, the Lorentz force Fc(1,1), Fa(1,2), Fc(2,1), Fa(2,2) of the same amount of force acting in the (−X) direction are summed up, so that the resultant of forces F0 acting in the (−X) direction is generated.

The armature coil 38(3,1) and 38(3,2) are arranged so as to oppose the thrust generating magnet 54b (not shown in FIGS.) in a similar positional relationship as of the positional relationship between the thrust generating magnet 54a and the armature coil 38(1,1) and 38(1,2). Accordingly, to provide the thrust F0 acting in the (+X) direction to the thrust generating magnet 54b, the current +I0 is supplied to the armature coil 38(3,1), and the current −I0 is supplied to the armature coil 38(3,2). The electric current +I0 is also supplied to an armature coil 38(4,1) (not shown in FIGS.), and the electric current −I0 is supplied to the armature coil 38(4,2) (not shown in FIGS.). Furthermore, to provide the thrust F0 acting in the (+X) direction to the thrust generating magnets 54c and 54d (not shown), electric current is supplied to the armature coils opposing these magnets so that the resultant of forces F0 acting in the (−X) direction is generated in these coils.

Figure 26A:
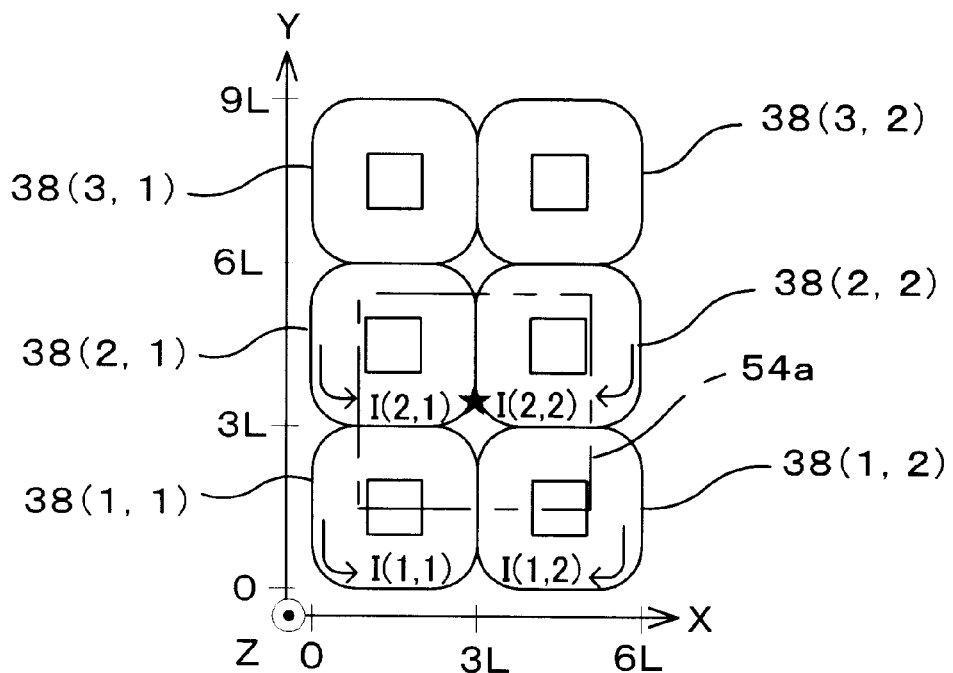

Next, the case when the coordinate values $(X_M, Y_M)$ of the thrust generating magnet 54a is (L, $Y_M$ (L<$Y_M$<2L)) as illustrated in FIG. 26A. In this case, as illustrated in FIG. 26B, additionally, the Lorentz force Fb(2,1) acting in the (−Y) direction is generated on the side 38b(2, 1) of the armature coil 38(2,1), and the Lorentz force Fb(2,2) acting in the (+Y) direction is generated on the side 38b(2,2) of the armature coil 38(2,2), when compared with the case of FIG. 25B.

Figure 26B:
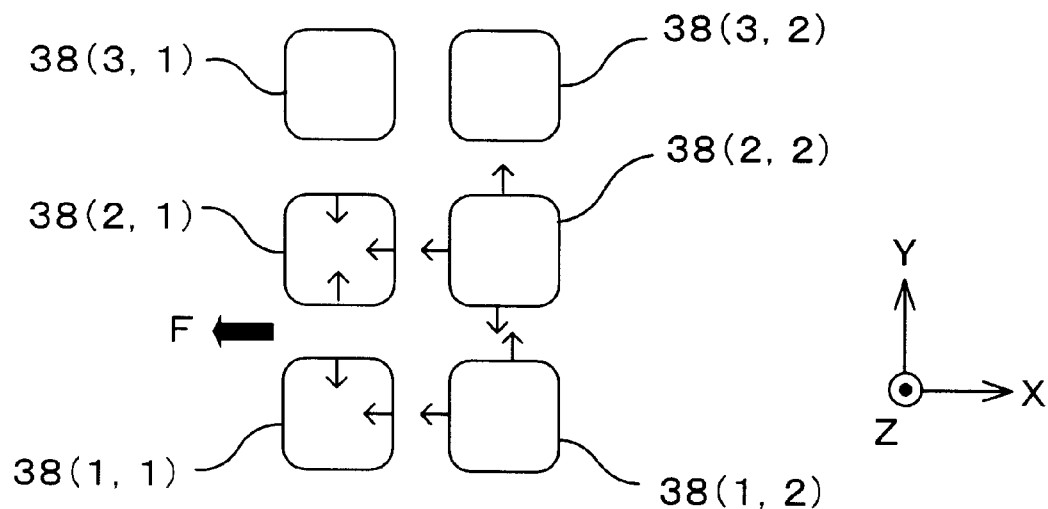

In the armature coil 38 respectively opposing the thrust generating magnet 54a to 54d, forces similar to those illustrated in FIG. 26B are generated. Thus, in order to drive the mover 51 by a driving force 4F0 in the (+X) direction and to make the mover 51 perform a translation motion without causing rotational force, the Lorentz force acting in the (+Y) direction and in the (−Y) direction and the force which individually rotates the thrust generating magnet 54a to 54d need to be cancel out from among forces acting on the thrust generating magnet 54a to 54d. And, with each thrust generating magnet 54a to 54d, respectively, the resultant of forces of the force acting in the (+X) direction is required to be 4F0, and the rotational force of the mover 51, in general, is to be set so that it is cancel out.

So, in the case when the coordinate values $(X_M, Y_M)$ of the thrust generating magnet 54a is (L, $Y_M$ (L<$Y_M$<2L)), first of all, to cancel out the force including the force which individually rotates the thrust generating magnet 54a to 54d from among forces acting on the thrust generating magnet 54a in the (±Y) direction, the ratio between the currents I(1,1) and I(2,1) and the ratio between the currents I(1,2) and I(2,2) has to be determined. Then, the Lorentz force acting on the armature coil 38(1,1) in the (−Y) direction and the Lorentz force acting on the armature coil 38(2,1) in the (+Y) direction which coil is arranged adjacent to the armature coil 38(1,1) in the (+Y) direction are canceled out. And the Lorentz force acting on the armature coil 38(1,2) in the (+Y) direction and the Lorentz force acting on the armature coil 38(2,2) in the (±Y) direction which coil is arranged adjacent to the armature coil 38(1,2) in the (+Y) direction are canceled out. That is, as the Y-coordinate value $Y_M$ in the coordinate values $(X_M, Y_M)$ of the thrust generating magnet 54a increases, the current values of the currents I(1,1) and I(1,2) are decreased, while the current values of the currents I(2,1) and I(2,2) are increased. Consequently, the driving force acting in the (+X) direction is provided to the thrust generating magnet 54a. The current to be supplied to the armature magnets 38 is adjusted so as to cancel out the rotation of the mover 51 in general with respect to the relationship among the driving force provided to the thrust generating magnet 54a and other thrust generating magnets 54b to 54d. The current adjustment is achieved by, for instance, performing adjustment to cancel out the rotational force between the thrust generating magnet 54a and the thrust generating magnet 54b adjacent in the (+Y) direction. And similar adjustment is performed between the thrust generating magnets 54c and 54d, as is with the thrust generating magnet 54a and the thrust generating magnet 54b.

Figure 27A:
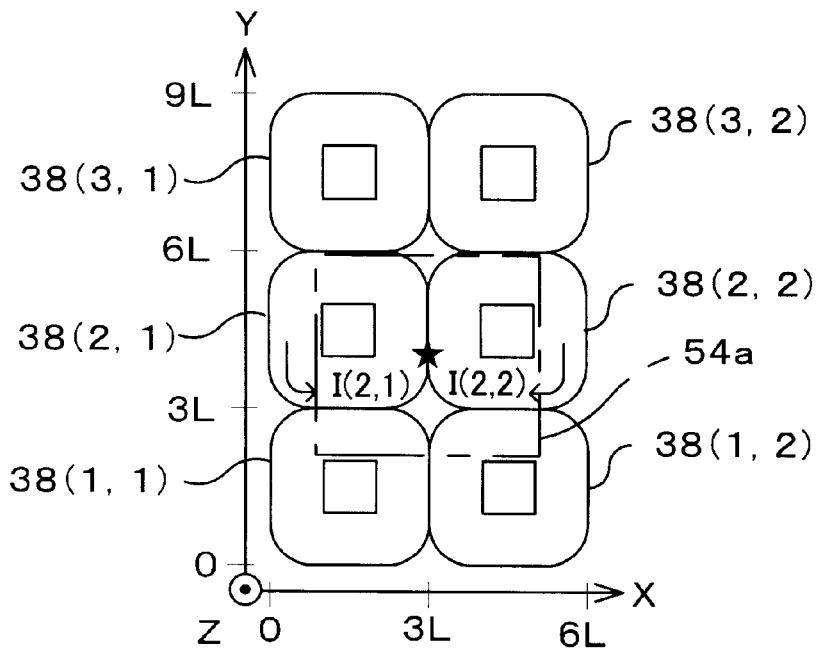

Next, when the coordinate values $(X_M, Y_M)$ of the thrust generating magnet 54a is (L, 2L) as illustrated in FIG. 27A, the Lorentz force Fb(2,1) and Fd(2,1) generated on the armature coil 38(2,1) acting in the (±Y) direction are canceled out. On the other hand, in the case electric current is supplied to the armature coil 38(1,1), the Lorentz force Fb(1,1) is generated in the (−Y) direction, and with respect to this force, the thrust acting in the (+Y) direction to the thrust generating magnet 54a can be canceled out in the (+Y) direction by supplying the same amount of electric current to the armature coil 38(1,2) in the opposite direction as with the current supplied to the armature coil 38(1,1). In this case, however, a rotational force which is counterclockwise due to the Lorentz force Fb(1,1) and Fb(1,2) is inevitably added to the thrust generating magnet 54a. This rotational force cannot be totally canceled out only by the thrust given to the thrust generating magnet 54a.

Figure 27B:
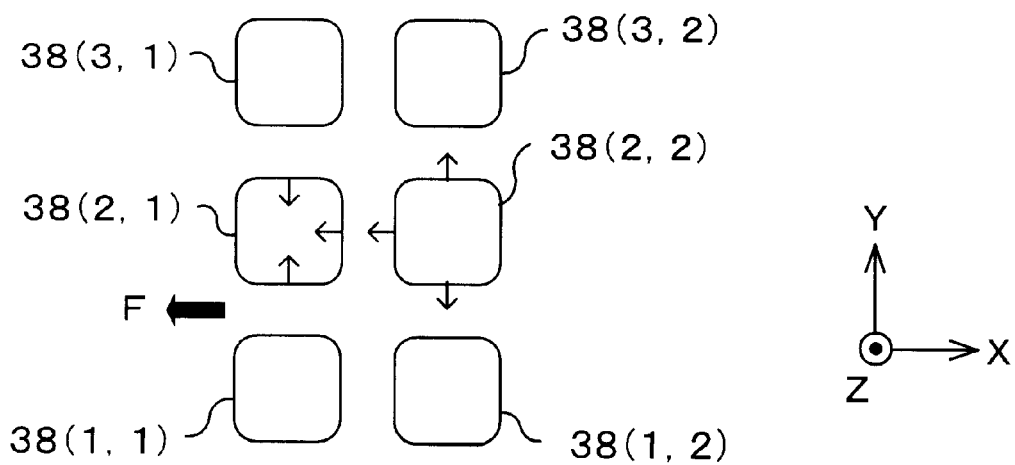

Therefore, for example, when the amount of current supplied to the armature coil 38(1,1) and the amount of current supplied to the armature 38(1,2) is set to 0, the force is consequently generated only in the armature coil 38(1,2) and 38(2,2), as illustrated in FIG. 27B. And the resultant of forces of the force act in the (−X) direction. The amount of the resultant force is set by adjusting the current supplied to each armature coil 38 opposing the thrust generating magnet 54a to 54d, so as to drive the mover 51 into performing a translation motion in the X-direction by the driving force 4F0, as is with the case of FIG. 26.

Also, it is possible to reduce the thrust acting in the (±Y) direction of the mover 51 in general, as well as reduce the rotational force of the mover 51 in general to zero, while current is being supplied to the armature coil 38(1,1) and 38(1,2). This is accomplished by adjusting the current to be supplied to each armature coil opposing the thrust generating magnet 54a to 54d.

Figure 28A:
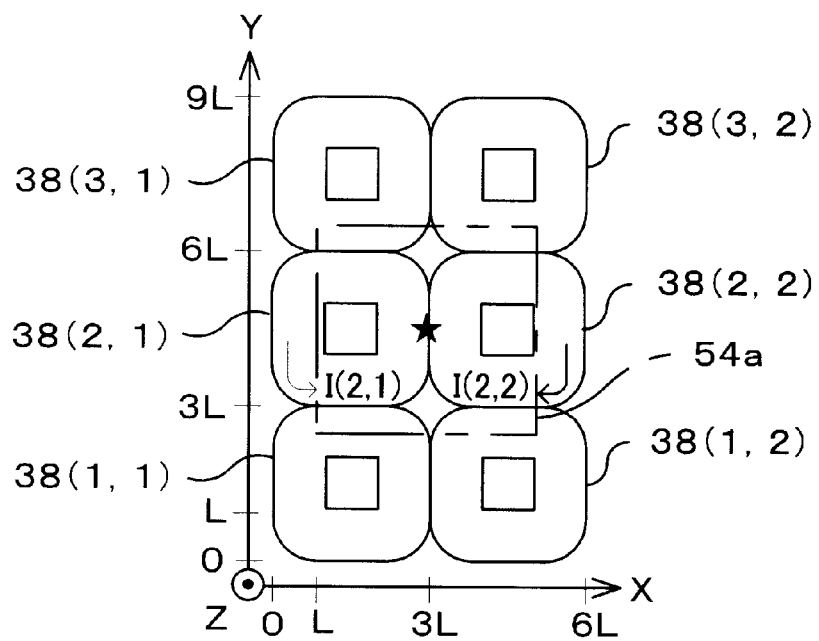

Next, as illustrated in FIG. 28A, the case when the coordinate values $(X_M, Y_M)$ of the thrust generating magnet 54a is (L, $Y_M$ (2L<$Y_M$<3L)) is considered. In this case as well, the armature coil 38(3,1) and 38(3,2) are opposing the thrust generating magnet 54b (not shown in FIGS.). Accordingly, the electric current supplied to the armature coil 38(3,1) and 38(3,2) is of the same amount, but in the opposite direction as of the current supplied to the armature coil 38(1,1) and 38(1,2). However, under this condition, the thrust of the thrust generating magnet 54a in the (±Y) direction, which is caused by the Lorentz force in the (±Y) direction generated in the armature coil 38(1,1), 38(2,1) and 38(3,1) being arranged in the (+Y) direction, cannot be reduced to zero. Similarly, the thrust of the thrust generating magnet 54a in the (±Y) direction, which is caused by the Lorentz force in the (+Y) direction generated in the armature coil 38(1,2), 38(2,2) and 38(3,2) being arranged in the (+Y) direction, cannot be reduced to zero. The thrust of the thrust generating magnet 54a in the (+Y) direction, can be reduced to zero by adjusting the current being supplied to the armature coil 38(1,1), 38(1,2), 38(2,1), 38(2,2), 38(3,1), and 38(3,2). However, the rotational force generated in the thrust generating magnet 54a cannot be reduced to zero at the same time.

Figure 28B:
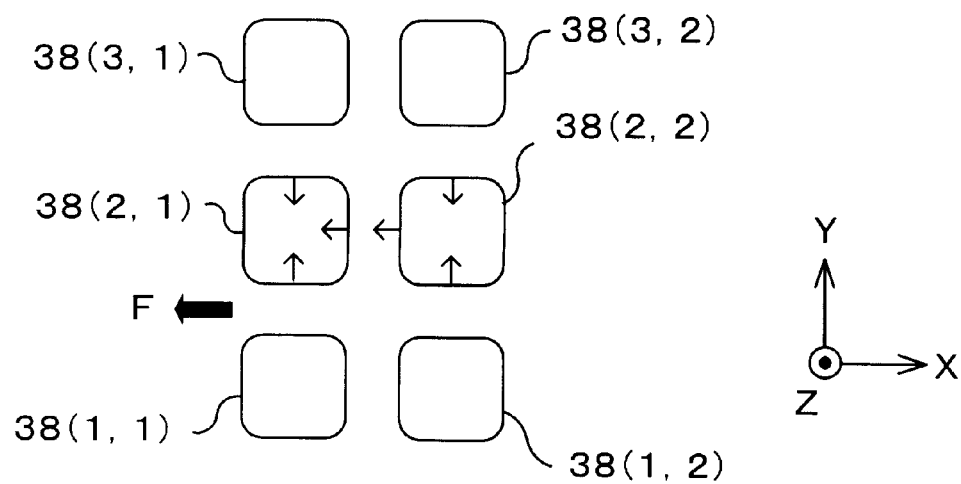

So, for example, the current to be supplied to the armature coil 38(1,1), 38(1,2), 38(2,1), 38(2,2), 38(3,1), and 38(3,2) is set at 0. As a result, as illustrated in FIG. 28B, similar to FIG. 27B, the Lorentz force is generated only in the armature coil 38(2,1) and 38(2,2), and the force become the resultant of the forces in the (−X) direction. The amount of the resultant force is determined by adjusting the current supplied to the armature coil 38 which respectively oppose the thrust generating magnet 54a to 54d, so that the mover 51 can perform a translation motion in the X-direction by the driving force 4F0.

Also, it is possible to reduce the thrust acting in the (+Y) direction of the mover 51 in general, as well as reduce the rotational force of the mover 51 in general to zero, while current is being supplied to the armature coil 38(1,1), 38(1,2), 38(3,1), and 38(3,2). This is accomplished by adjusting the current to be supplied to each armature coil opposing the thrust generating magnet 54a to 54d.

Figure 29A:
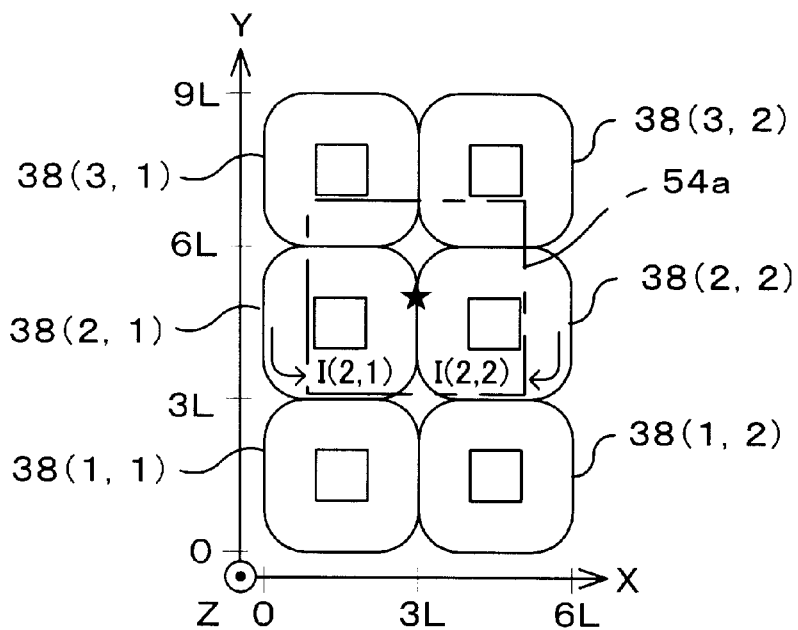

As in the case illustrated in FIG. 29A, when the coordinate values $(X_M, Y_M)$ of the thrust generating magnet 54a is (L, 3L)), the armature coil 38(3,1) and 38(3,2) no longer oppose the thrust generating magnet 54b. However, when electric current is supplied to the armature coil 38(3,1) and 38(3,2), as is with the case in FIG. 29B, the thrust acting in the (±Y) direction provided to the magnet 54b cannot be reduced to zero. The rotational force added to the thrust generating magnet 54a also cannot be reduced to zero.

Figure 29B:
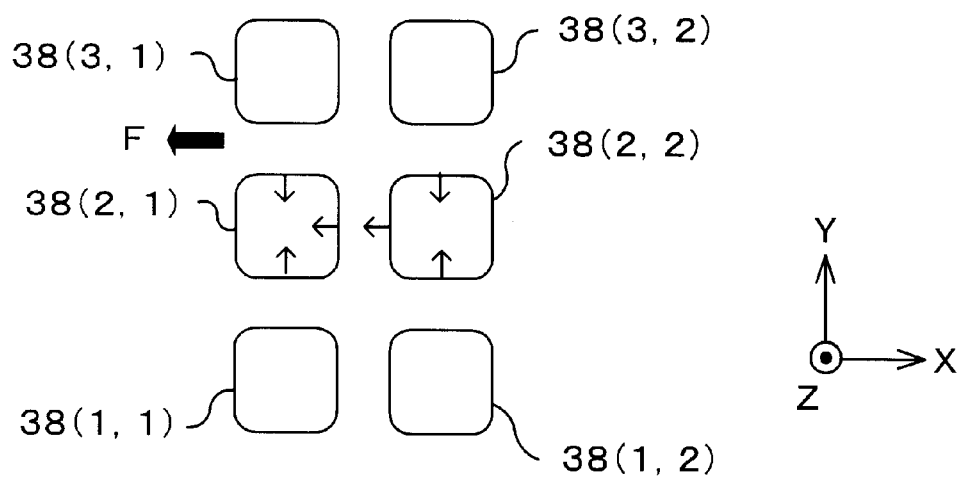

So, for example, similar to the case of FIG. 27B, the current supplied to the armature coil 38(3,1), and to the armature coil 38(3,2) is set to 0. As a result, as illustrated in FIG. 29B, as is with FIG. 27B, the Lorentz force is generated only in the armature coil 38(2,1) and 38(2,2). A resultant of the forces of the Lorentz force becomes the force in the (−X) direction. Even in this case, like the case in FIG. 26B, the amount of the resultant of the forces is set by adjusting the current supplied to the armature coil 38 which respectively opposes the thrust generating magnet 54a to 54d. The mover 51, therefore, can perform a translation motion in the X-direction by the driving force 4F0.

And, it is possible to reduce the thrust acting in the (±Y) direction of the mover 51 in general, as well as reduce the rotational force of the mover 51 in general to zero, while current is being supplied to the armature coil 38(1,1) and 38(1,2). This also can be accomplished by adjusting the current to be supplied to each armature coil opposing the thrust generating magnet 54a to 54d, as is shown in FIG. 26B.

Figure 30A:
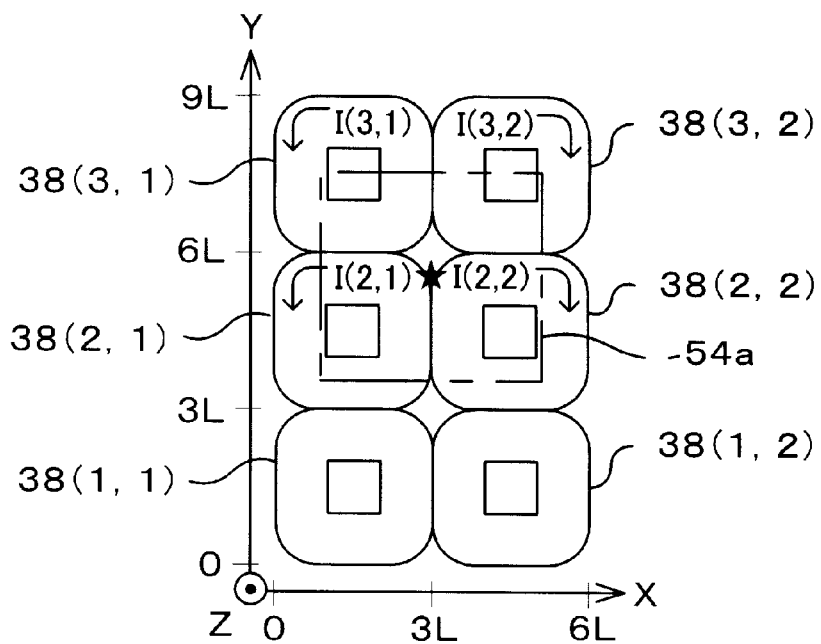
Figure 30B:
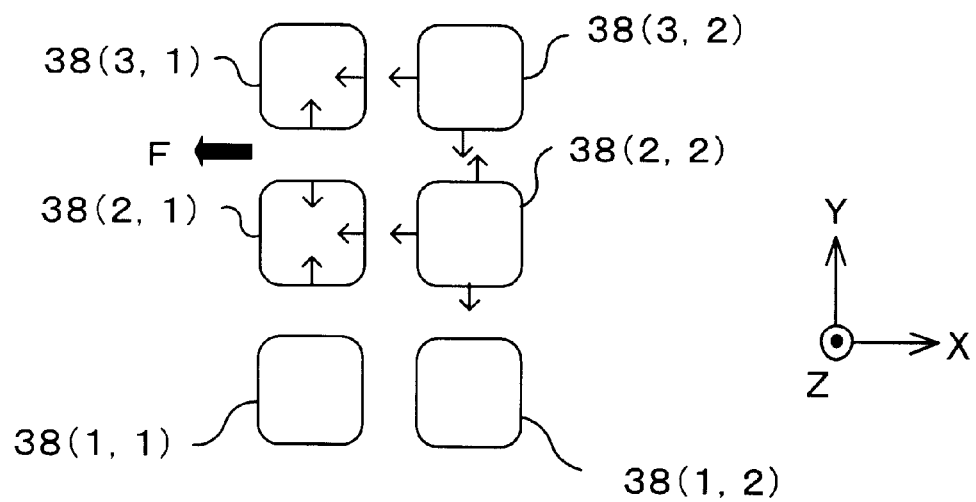

Next, the case in which the coordinate values $(X_M, Y_M)$ of the thrust generating magnet 54a is (L, $Y_M$ (3L<$Y_M$<4L)) as illustrated in FIG. 30A, is considered. This case can be considered as being symmetric to the case of FIG. 26A. In order to cancel out the force including the force which individually rotates the thrust generating magnet 54a to 54d from among forces acting on the thrust generating magnet 54a in the (+Y) direction, the ratio between the currents I(3,1) and I(2,1) and the ratio between the currents I(3,2) and I(2,2) has to be determined. Then, the Lorentz force acting on the armature coil 38(3,1) in the (+Y) direction and the Lorentz force acting on the armature coil 38(2,1) in the (±Y) direction which coil is arranged adjacent to the armature coil 38(3,1) in the (−Y) direction are canceled out. And the Lorentz force acting on the armature coil 38(3,2) in the (−Y) direction and the Lorentz force acting on the armature coil 38(2,2) in the (±Y) direction which coil is arranged adjacent to the armature coil 38(3,2) in the (−Y) direction are canceled out. That is, as the Y-coordinate value $Y_M$ in the coordinate values $(X_M, Y_M)$ of the thrust generating magnet 54a increases, the current values of the currents I(2,1) and I(2,2) are decreased, while the current values of the currents I(3,1) and I(3,2) are increased. Consequently, the driving force acting in the (+X) direction is provided to the thrust generating magnet 54a. The current to be supplied to the armature magnets 38 is adjusted so as to cancel out the rotation of the mover 51 in general with respect to the relationship among the driving force provided to the thrust generating magnet 54a and other thrust generating magnets 54b to 54d.

Figure 31A:
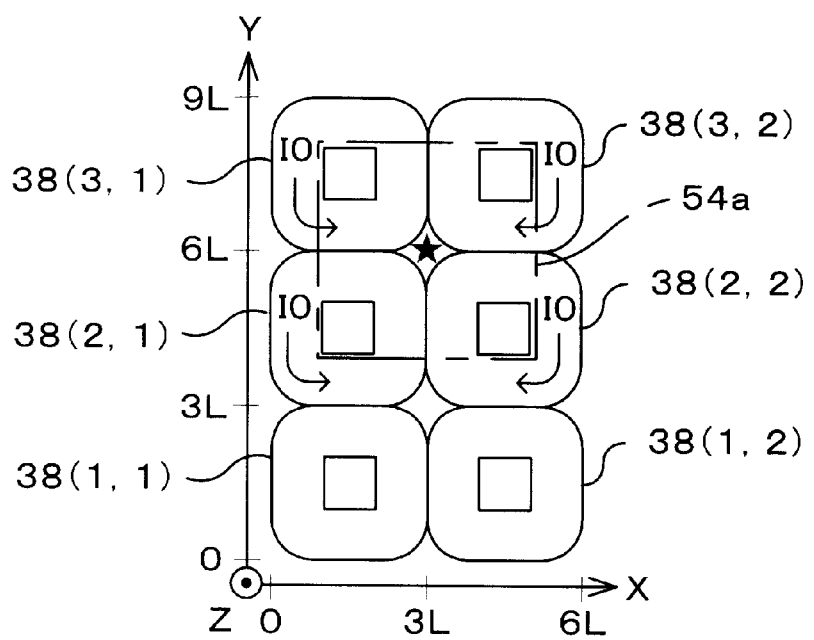
Figure 31B:
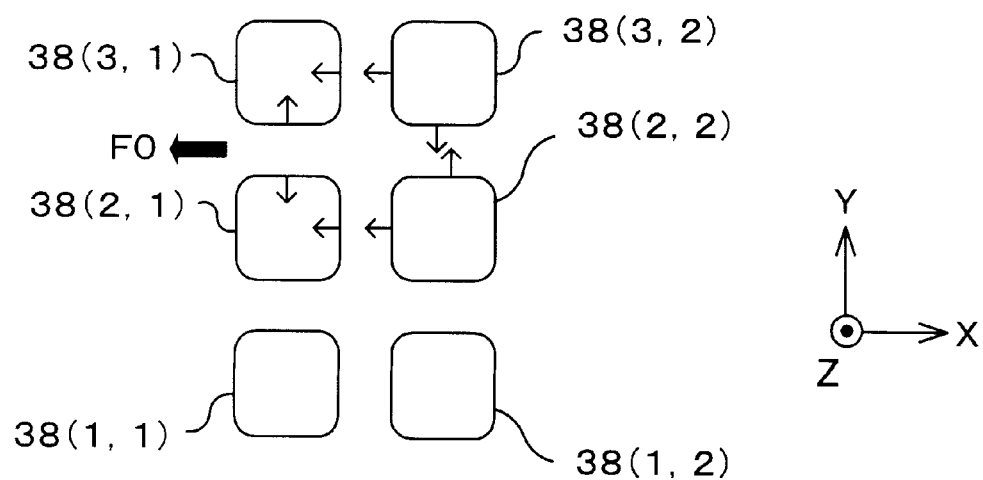

Furthermore, when the coordinate values $(X_M, Y_M)$ of the thrust generating magnet 54a is (L, 4L)) as in FIG. 31A, the positional relationship of the thrust generating magnet 54 and the armature coil 38 is shifted by one period in the (+Y) direction of the armature coil 38 arrangement in FIG. 25a. Thus, by making the current I(i+1, j) supplied to the armature coil 38(i+1, j) to have a pattern similar to that of the current I(i,j) supplied to the armature coil 38(i,j) in FIG. 25a, a thrust similar to that of FIG. 25B can be provided to the thrust generating magnet 54a, as is illustrated in FIG. 31B.

With reference to FIGS. 25a to 31B, in the description above, cases have been described in which a positional relationship change between the thrust generating magnets 54 and the armature coil 38 in a direction perpendicular to a driving-force generating direction. Similarly, when the driving-force generating direction is in a certain direction, the mover 51 can perform a translation motion by a desired driving force. This can be performed by controlling the current pattern of current being supplied to the armature coils, even when the positional relationship between the thrust generating magnets 54 and the armature coil 38 in a direction perpendicular to the certain driving direction change.

Next, with reference to FIGS. 32A to 35B, the case when a positional relationship between the thrust generating magnets 54 and the armature coil 38a change in respect to the direction parallel to a driving-force generating direction is described. In this case, the positional relationship of the thrust generating magnet 54a to 54d and armature coil 38 change from the relationship illustrated in FIGS. 24A to 24D in the (+X) direction while a driving force acting in the (+X) direction is provided to the mover 51. In FIGS. 32A to 35B, the armature coil 38(1,1), 38(1,2), 38(1,3), 38(2,1), 38(2,2), 38(2,3) are arranged in a two-by-three matrix in a XY coordinate system, which origin is on the lower lefthand side of the armature coil 38(1,1) on paper. FIGS. 32A to 35B illustrate the driving force for driving the mover 51 when the coordinate values $(X_M, Y_M)$ of the thrust generating magnet 54a change from the coordinates (L,L) to (L, 4L), by focusing attention on the thrust generating magnet 54a, and also illustrate portions relating to the thrust generating magnet 54a as representative examples. This is because the arrangement interval of the armature coil 38 in the (+X) direction is 3L. And to the armature coil 38(i,j) (i=1 to 3, j=1 to 3), the current I(i,j) is to be supplied. Also similar to the case of FIGS. 21A to 24D, in FIGS. 32B, 32D, 33B, 33D, 34B, 34D, and 35D which illustrates the force F, the Lorentz force generated on the sides of the current path are designated by solid-line arrows, and the thick-line arrows indicate the resultant of forces of the Lorentz force. And, the central position of the thrust generating magnet 54a is indicated by a star mark. In the case of FIGS. 32A to 35B, the resultant forces of the thrust generating magnet 54a which is provided by the resultant of forces of the Lorentz force, becomes a force acting on the central position of the magnet 54a.

Figure 32A:
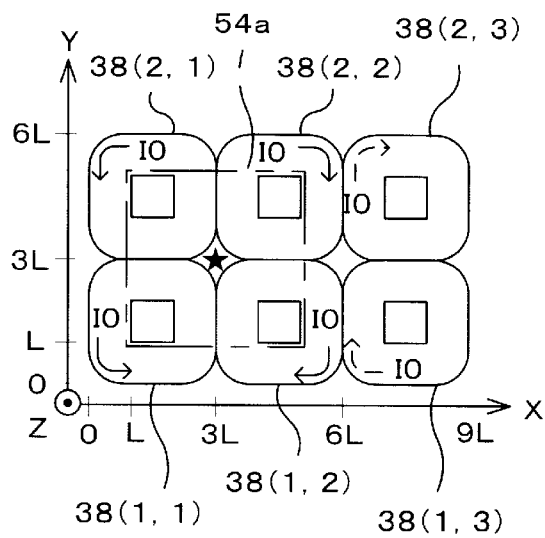
Figure 32B:
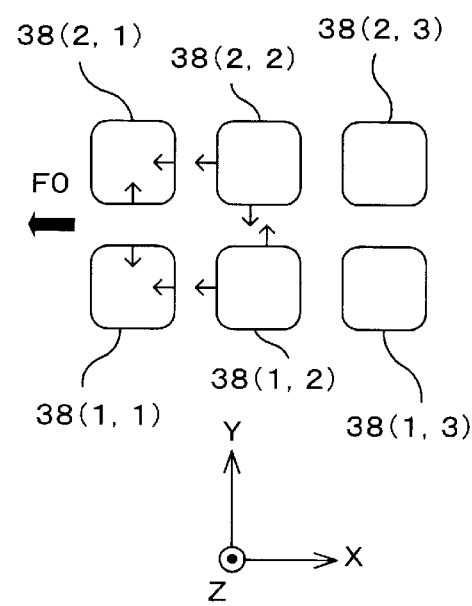

FIG. 32A illustrates the case when the coordinate values $(X_M, Y_M)$ of the thrust generating magnet 54a is (L, L). Similar to the case in FIG. 21C, the current supplied to the armature coil 38 (1,1) and 38(2,1) is −I0 (counterclockwise), and the current supplied to the armature coil 38 (1,2) and 38(2,2) is +I0 (clockwise), so as to drive the mover 51 in the (+X) direction by the force F0. In this case, as illustrated in FIG. 32B, similar to the case in FIG. 21D, the Lorentz force Fb(1,1), Fb(1,2), Fd(2,1), Fd(2,2) acting in the (+Y) direction and the (−Y) direction cancel out, while, the Lorentz force Fc(1,1), Fa(1,2), Fc(2,1), Fa(2,2) of the same amount of force acting in the (−X) direction are summed up, so that the resultant of forces F0 acting in the (−X) direction is generated.

The armature coil 38(1,3) and 38(2,3) are arranged so as to oppose the thrust generating magnet 54d (not shown in FIGS.) in a similar positional relationship as of the positional relationship between the thrust generating magnet 54a and the armature coil 38(1,1) and 38(1,2). Accordingly, to provide the thrust F0 acting in the (+X) direction to the thrust generating magnet 54d, the current +I0 is supplied to the armature coil 38(1,3), and the current +I0 is supplied to the armature coil 38(2,3). The electric current +I0 is also supplied to an armature coil 38(1,4) (not shown in FIGS.), and the electric current −I0 is supplied to the armature coil 38(2,4) (not shown in FIGS.). Furthermore, to provide the thrust F0 acting in the (+X) direction to the thrust generating magnets 54c and 54d (not shown in FIGS.), electric current is supplied to the armature coils opposing these magnets so that the resultant of forces F0 acting in the (−X) direction is generated in these coils. Consequently, the mover 51 is driven in the (+X) direction. In this case, a current pattern is to be considered in which the thrust provided to the thrust generating magnet 54a to 54d acts in the (+X) direction and at the same time, does not provide a rotation force to the mover 51.

Focusing on the thrust generating magnet 54a, among the forces generated in the armature coil 38(1,1), 38(1,2), 38(2,1), 38(2,2) which opposes the thrust generating magnet 54a, in the case that the current respectively supplied to the armature coil 38(1,1) and 38(2,1) arranged in the (+Y) direction is the same (I(1,1)=I(2,1)) and the current respectively supplied to the armature coil 38(1,2) and 38(2,2) are also equal (I(1,2)=I(2,2)), the Lorentz force acting in the (+Y) direction and the (−Y) direction cancel out due to the current amount, the magnetic flux density, the size of the area intersecting between the current and the magnetic flux (the symmetry in respect to the current amount, the magnetic flux amount, and the area of intersection). In the case the Y coordinate value of the coordinate values $(X_M, Y_M)$ of the thrust generating magnet 54a is L, the Lorentz force acting in the (±Y) direction cancel out at all times so long as the current supplied to the armature coil 38 opposing the thrust generating magnet 54a and arranged in the (+Y) direction is equal. The same can be said with other thrust generating magnets 54b to 54d.

Accordingly, in the following description upon the movement of the mover 51 in the (+X) direction, of the armature coils arranged opposing the thrust generating magnet 54a to 54d the current supplied to the armature coils arranged in the (+Y) direction is to be the same (I(i,j)=I(i+1, j)). Therefore, the description of cancellation of the Lorentz force acting in the (+Y) direction and the (−Y) direction will be omitted.

Also, when considering the Lorentz force acting in the (±X) direction, it is generated in the armature coil 38 opposing the thrust generating magnet 54a to 54d due to the current amount, the magnetic flux density, the size of the area intersecting between the current and the magnetic flux (the symmetry in respect to the current amount, the magnetic flux amount, and the area of intersection). And as a reaction force of the Lorentz force, the driving force acting on the respective thrust generating magnet 54a to 54d acts through the center of gravity of the respective thrust generating magnet 54a to 54d. Therefore, by setting the Lorentz force respectively acting on the thrust generating magnet 54a to 54d as the force F0 in the (+X) direction, the mover 51 can perform a translation motion in the (+X) direction by a constant thrust 4F0. Thus, hereinafter, descriptions will be focused on the thrust generating magnet 54a. Regarding other thrust generating magnets 54b to 54d, the mover 51 can perform a translation motion in the (+X) direction by a constant thrust F0, similar to the case of the thrust generating magnet 54a, except for the current direction of the current being supplied due to the difference in magnetic flux direction.

Figure 32C:
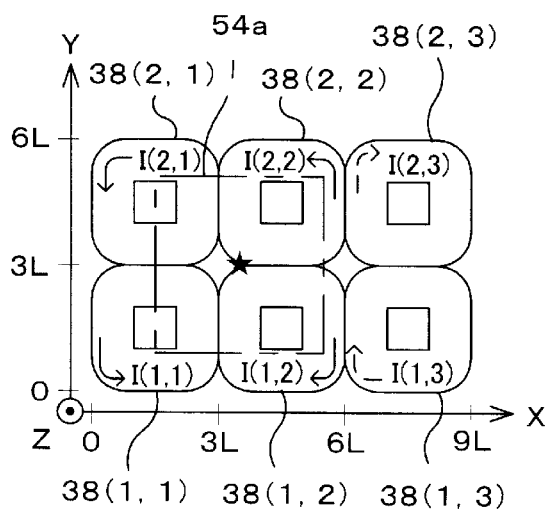
Figure 32D:
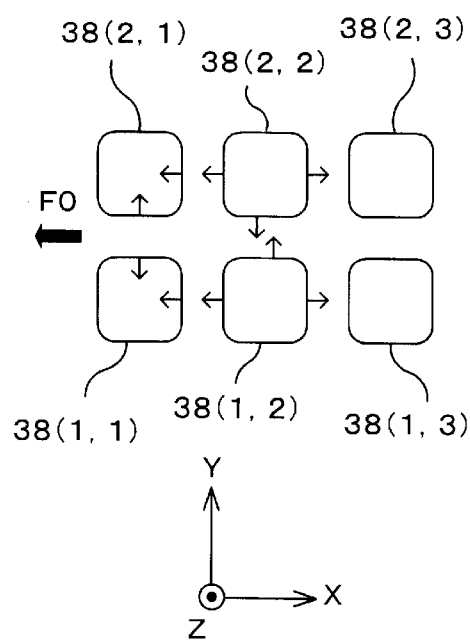

So, when the mover 51 is driven in the (+X) direction, the mover 51 moves in the (+X) direction, and, as illustrated in FIG. 32C, the coordinate values $(X_M, Y_M)$ of the thrust generating magnet 54a become $(X_M (L<X_M<2L), L)$. In this case, when considering the Lorentz force acting in the (±X) direction, the intersecting area between the armature coil 38(1,1) and 38(2,1) and the magnetic flux in which the Lorentz force acting in the (−X) direction is generated, is similar as in the case of FIG. 32A. Therefore, only the Lorentz force acting in the (−X) direction is generated in the armature coil 38(1,1) and 38(2,1) in relation to the current supplied, as in FIG. 32B. However, as illustrated in FIG. 36D, in the armature coil 38(1,2) and 38(2,2), the Lorentz force acting on in both the (−X) direction and the (+X) direction are inevitably generated. The resultant of forces of the Lorentz force acting in the (±X) direction on the coils 38(1,2) and 38(2,2), is a force acting in the (−X) direction, and as the X-coordinate value $X_M$ of the coordinate values $(X_M, Y_M)$ of the thrust generating magnet 54a increases, the amount of current supplied to maintain the amount of the force acting in the (−X) direction need to be increased.

Therefore, the resultant of forces generated in the armature coil 38(1,1), 38(1,2), 38(2,1), 38(2,2) which oppose the thrust generating magnet 54a can be set at F0 in the (−X) direction while suppressing power consumption. In this case, preferably, the amount of current supplied to the armature coil 38(1,1) and 38(2,1) is increased whereas the amount current supplied to the armature coil 38(1,2) and 38(2,2) is decreased as the X-coordinate value $X_M$ of the coordinate values $(X_M, Y_M)$ of the thrust generating magnet 54a increases.

Figure 33A:
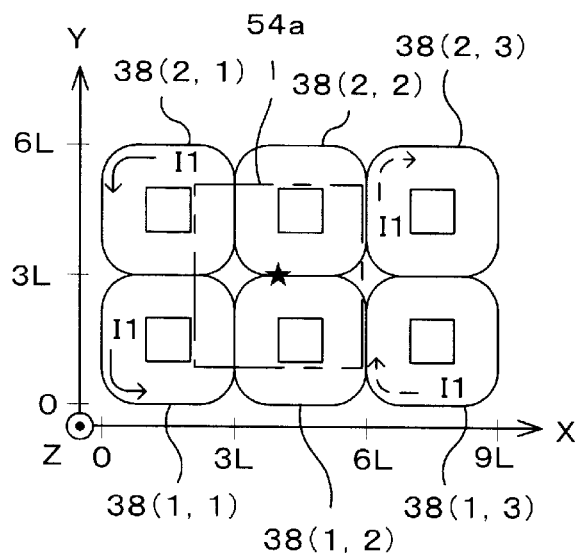

Thus, the mover 51 is continuously driven in the (+X) direction, and as illustrated in FIG. 33A, the coordinate values $(X_M, Y_M)$ of the thrust generating magnet 54a become (2L, L). In this case, even if the current is supplied to the armature coil 38(1,2) and 38(2,2), the Lorentz force acting in the (−X) direction and in the (+X) direction are canceled out, thus, cannot contribute to the driving of the thrust generating magnets 54 in the (+X) direction. Therefore, from the viewpoint of the power consumption, it is preferable that the current supplied to the armature coil 38(1,2), 38(2,2) are reduced to zero.

On the other hand, to the thrust generating magnets 54, a thrust which has a magnitude F0 and acts in the (+X) direction needs to be provided. This is achieved by supplying sufficient current to the armature coil 38(1,1) and 38(2, 1). Accordingly, the current supplied to the armature coil 38(1,1) and 38(2,1) illustrated in FIG. 33A(−I1), is twice the current supplied to the armature coil 38(1,1) and 38(2,1) in FIG. 32A (−I0).

Figure 33B:
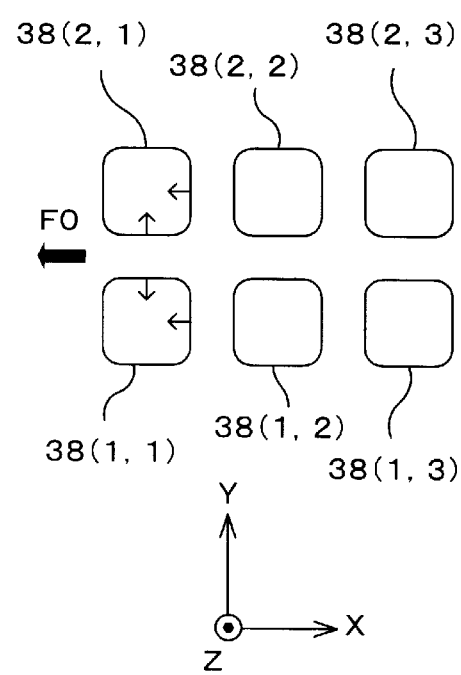

As a result, as illustrated in FIG. 33B, the resultant of forces of the Lorentz force generated in the armature coil 38(1,1), 38(1,2), 38(2,1), and 38(2,2) acts in the (−X) direction and is F0. Thus, the thrust which amount is F0 and acts in the (+X) direction, is provided to the thrust generating magnet 54a.

Figure 33C:
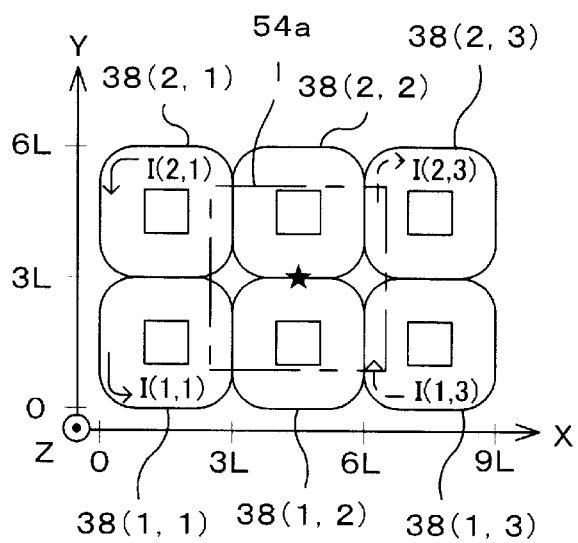

The mover 51 is then further continuously driven in the (+x) direction. And as illustrated in FIG. 33C, the coordinate values $(X_M, Y_M)$ of the thrust generating magnet 54a becomes (3L, L). In this case, as well, even when current is supplied to the armature coil 38(1,2) and 38(2,2), the Lorentz force acting in the (−X) direction and in the (+X) direction are canceled out. Thus, the force cannot contribute to the driving of the thrust generating magnets 54 in the (+X) direction. Therefore, it is preferable from the viewpoint of power consumption that the current supplied to the armature coil 38(1,2) and 38(2,2) are reduced to zero.

In this case, the magnetic flux caused by the thrust generating magnet 54a, newly shares an intersection area with the armature coil 38(1,3) and 38(2,3). The armature coil 38(1,3), 38(2,3) also share an intersection area due to the magnetic flux caused by the thrust generating magnet 54d (not shown in FIGS.), and the current provided to the thrust generating magnet 54d is controlled in a symmetrical manner as that of the thrust generating magnet 54a. That is, to the armature coil 38(1,3), a current +I(1,3) (=+I(1,1)) is supplied in which the current amount is the same as of the current supplied to the armature coil 38(1,1)(−I(1,1)) but having the opposite direction. And to the armature coil 38(2,3), a current +I(2,3) (=+I(2,1)) is supplied in which the current amount is the same as of the current supplied to the armature coil 38(2,1) (−I(2,1)) (=−I(1,1)), but having the opposite direction.

Figure 33D:
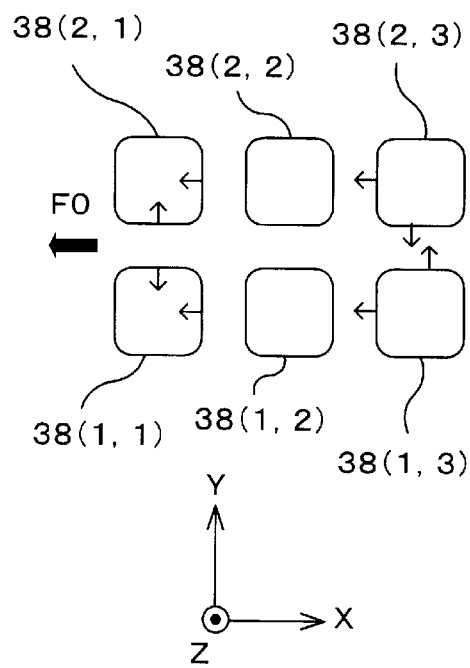

As illustrated in FIG. 33D, with respect to the thrust generating magnet 54a, the Lorentz force generated in the (±X) direction in the armature coil 38(1,3) and 38(2,3), are respectively a force in the (−X) direction. Also, as the X-coordinate value $X_M$ of the coordinate values $(X_M, Y_M)$ of the thrust generating magnet 54a increases, the intersection area between the magnetic flux of the thrust generating magnet 54a and the armature coil 38(1,1) and 38(2,1) becomes smaller. And so as to compensate for the decrease, the intersection area between the magnetic flux due to the thrust generating magnet 54a and the armature coil 38(1,3) and 38(2,3) becomes larger. Accordingly, by setting the current supplied to the armature coil 38(1,1) and 38(2,1) so that it almost equals the current −I1 shown in FIG. 16E, a thrust having the force F0 acting in the (+X) direction is continuously provided to the thrust generating magnet 54a. Since the outer shape of the armature coil is a square having rounded corners, the current amount supplied to the armature coil 38(1,1), 38(2,1), 38(1,3), 38(2,3) changes in accordance with the change of the X-coordinate value $X_M$ of the coordinate values $(X_M, Y_M)$ of the thrust generating magnet 54a. More particularly, when the X-coordinate value $X_M$ of the coordinate values $(X_M, Y_M)$ of the thrust generating magnet 54a is in the value range of (2L to 2.5L), all the current amount increase with the increase as the X-coordinate value $X_M$ increase. And, when the X-coordinate value $X_M$ of the coordinate values $(X_M, Y_M)$ of the thrust generating magnet 54a is in the value range of (2.5L to 3L), the current amount decreases as the X-coordinate value $X_M$ increases. In the case that the outside shape of the armature coil 38 is a perfect square, such a fluctuation in the current amount does not occur.

Figure 34A:
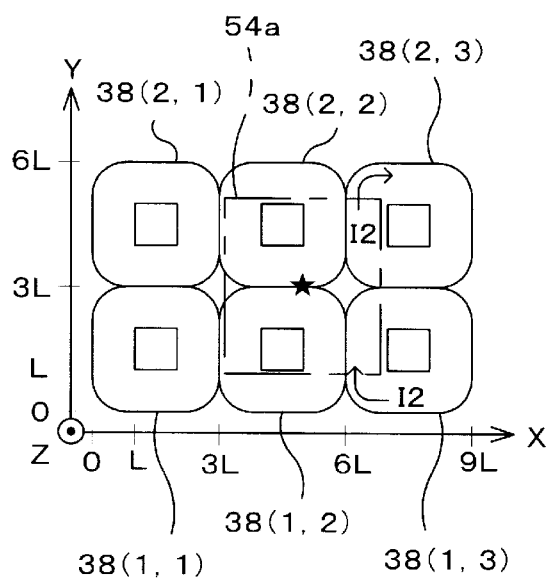

Thus, the mover 51 is successively driven in the (+X) direction, and as illustrated in FIG. 34A, the coordinate values $(X_M, Y_M)$ of the thrust generating magnet 54a become (3L, L). In this case, as well, even if the current is supplied to the armature coil 38(1,2) and 38(2,2), the Lorentz force action in the (−X) direction and the (+X) direction cancel out. Therefore, the Lorentz force action in the (−X) direction and the (+X) direction cannot contribute to the driving of the thrust generating magnet 54a in the (+X) direction. Accordingly, it is preferable from the viewpoint of power consumption that the current supplied to the armature coil 38(1,2) and 38(2,2) is reduced to zero. Also, since there are no intersecting areas between the magnetic flux due to the thrust generating magnet 54a and the armature coil 38(1,2) and 38(2,2), naturally, the current to be supplied is to be reduced to zero.

Figure 34B:
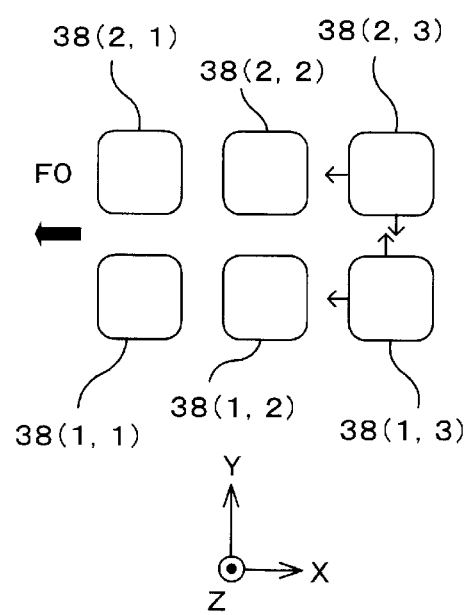

On the other hand, to the thrust generating magnets 54, a thrust which has a magnitude F0 and acts in the (+X) direction needs to be provided. This is achieved by supplying sufficient current to the armature coil 38(1,3) and 38(2, 3). Accordingly, the current supplied to the armature coil 38(1,3) and 38(2,3) illustrated in FIG. 34A (+I2), is twice the current supplied to the armature coil 38(1,1) and 38(2,1) in FIG. 32A (−I0). As a result, as illustrated in FIG. 34B, the resultant of forces of the Lorentz force generated in the armature coil 38(1,2), 38(1,3), 38(2,2), and 38(2,3) acts in the (−X) direction and is F0. Thus, the thrust which amount is F0 and acts in the (+X) direction, is provided to the thrust generating magnet 54a.

Figure 34C:
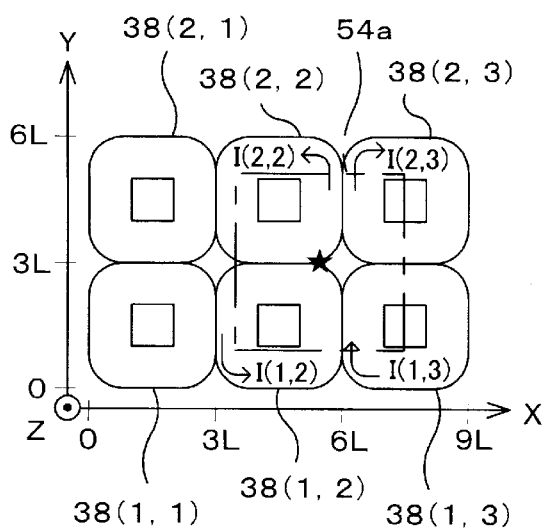
Figure 34D:
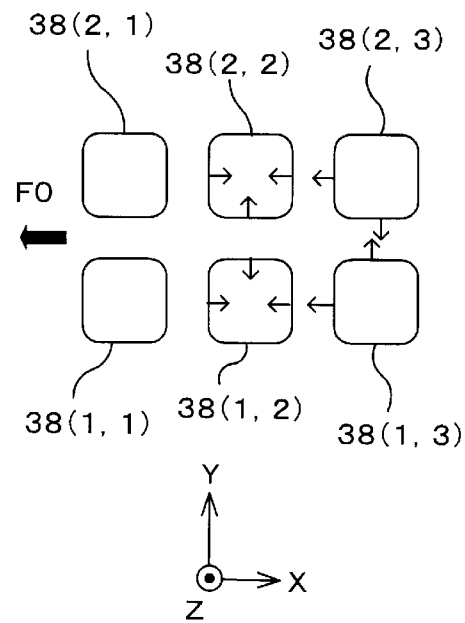

Subsequently, the mover 51 is driven in the (+X) direction, and as illustrated in FIG. 34C, the coordinate values $(X_M, Y_M)$ of the thrust generating magnet 54a become $(X_M(3L<X_M<4L), L)$. In this case, when considering the Lorentz force in the (±X) direction, the intersection area between the armature coil 38(1,3) and 38(2,3) for generating Lorentz force acting in the (−X) direction and the magnetic flux is similar to that of FIG. 34A. Therefore, in the armature coil 38(1,3) and 38(2,3), the Lorentz force acting only in the (−X) direction is generated relative to the current supply similarly described in the case of FIG. 34B. However, in the armature coil 38(1,2) and 38(2,2), as illustrated in FIG. 34D the Lorentz force acting in both the (−X) direction and in acting in the (−X) direction are inevitably generated. In other words, it is a symmetrical state as with the cases illustrated in FIGS. 32C and 32D. Accordingly, the resultant of forces of the Lorentz force generated in the armature coil 38(1,2), 38(1,3), 38(2,2), 38(2,3) opposing the thrust generating magnet 54a, is determined so as to act in the (−X) direction and to have a magnitude F0 while the power consumption is suppressed. This can be achieved by increasing the current amount supplied to the armature coil 38(1,3), 38(2,3) as well as decreasing the current amount supplied to the armature coil 38(1,2), 38(2,2), as the X-coordinate value $X_M$ of the coordinate values $(X_M, Y_M)$ of the thrust generating magnets 54 increases.

Figure 35A:
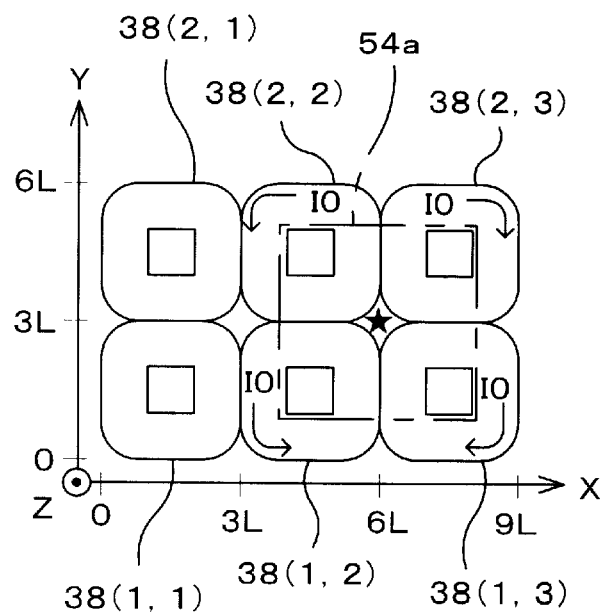
Figure 35B:
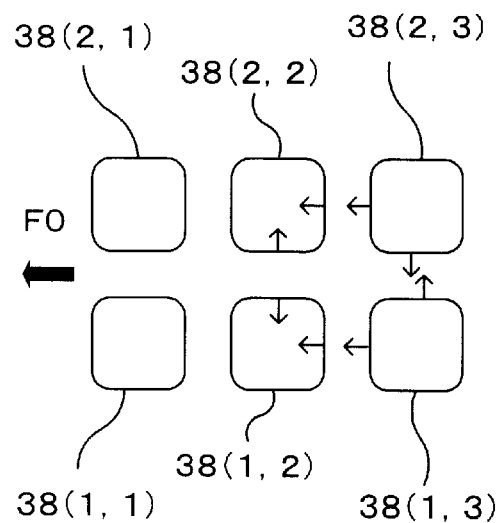
Figure 35B:
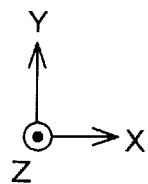

And, as illustrated in FIG. 35a, the coordinate values $(X_M, Y_M)$ of the thrust generating magnet 54a becomes (4L, L). In this case, the positional relationship of the thrust generating magnet 54 and the armature coil 38 is shifted by one period in the (+Y) direction of the armature coil 38 arrangement in FIG. 32A. Thus, as illustrated in FIG. 35B, a thrust similar to that of the case in FIG. 32B can be provided to the thrust generating magnet 54a by making the current I(i, j+1) supplied to the armature coil 38(i, j+1) have a pattern similar to that of the current I(i,j) supplied to the armature coil 38(i,j) of FIG. 32A. As a result, a thrust that has a force F0 acting in the (+X) direction, can be provided to the thrust generating magnet 54a. And by controlling the current supplied to the armature coil 38 as described above, the force F0 acting in the (+X) direction, can be continuously provided to the thrust generating magnet 54a.

Figure 36A:
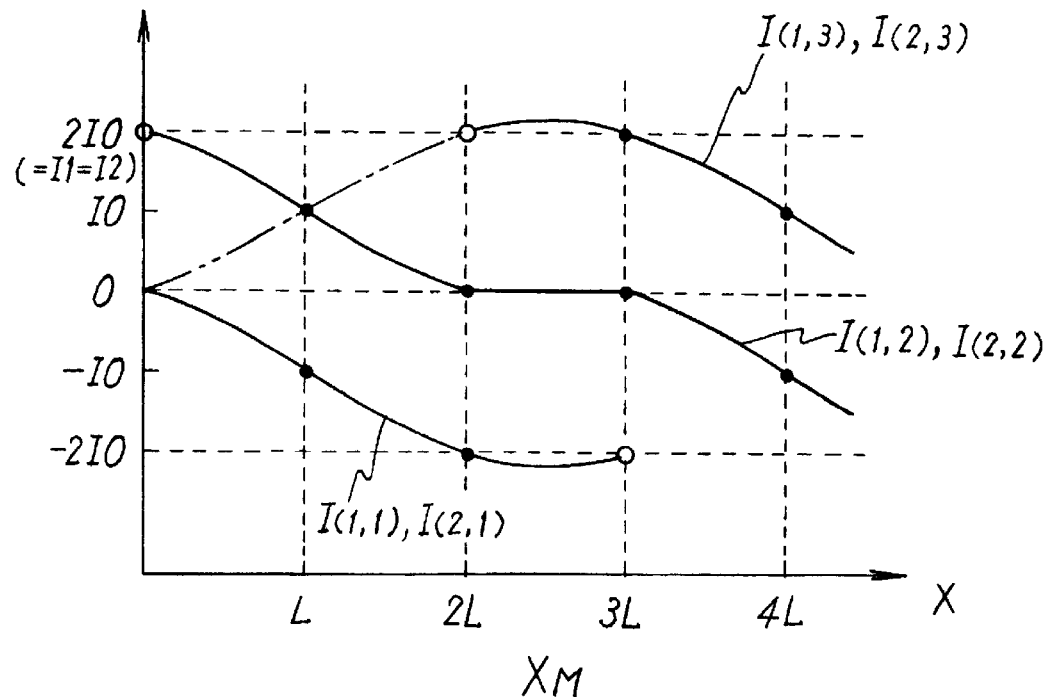
FIGS. 36A and 36B are diagrams illustrating an example of electric current supplied to the armature coil.

FIG. 36A illustrates the change in current amount supplied to the respective armature coil 38 in accordance with the change in the coordinate value $X_M$ of the coordinate values $(X_M, Y_M)$ of the thrust generating magnet 54a. By also performing such current control on other thrust generating magnets 54b to 54d, a thrust which has a force amount of 4F0 acting in the (+X) direction can be continuously provided to the mover 51.

Figure 36B:
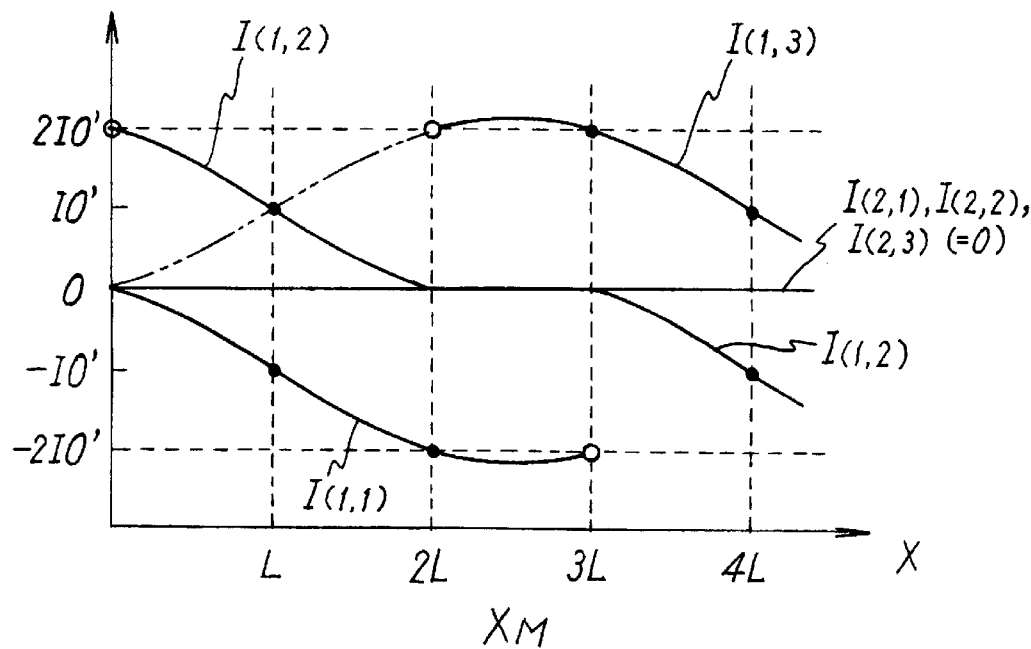

In the previous description, the translation motion in the (+X) direction performed by using a constant thrust in the case of the coordinates $(X_M, L)$ of the thrust generating magnet 54a has been described. However, even if the coordinate values $(X_M, Y_M)$ of the thrust generating magnet 54a are of any values, the translation motion can be performed in any direction by utilizing a thrust. For example, when the coordinate values of the thrust generating magnet 54a is $(X_M, 0)$, in order to perform a translation motion in the X-direction by using a constant thrust, the current is to be controlled as illustrated in FIG. 36B. In short, when the coordinate values $(X_M, L)$ of the thrust generating magnet 54a is (L, 0), the current should be controlled similarly to the cases illustrated in FIGS. 29A and 29B, and, with the movement of the mover, the current is to be controlled as is shown FIG. 36A. Also, even in the case when the driving direction is a direction other than the (+X) direction, the mover 51 can be driven in a desired direction by utilizing a constant thrust, similarly as in the previous cases.

Therefore, with the planar motor device 50 of this embodiment, in respect to a direction in which the driving force is generated, even if the positional relationship between the thrust generating magnet 54 and the armature coil changes, the mover 51 can perform translation in a desired direction with a desired driving force. This can be achieved in consideration of: cancellation of the driving force of the respective thrust generating magnet 54a to 54d in a direction perpendicular to the driving direction of the desired mover 51; cancellation of the rotational force of the mover 51 in general; and a driving force of a desired amount by controlling the electric current.

Moreover, the mover 51 can be rotationally driven in the desired direction of rotation at a desired rotational force by driving the thrust generating magnet 54a to 54d without canceling the rotational force. For instance, when the thrust generating magnet 54d is arranged in the (+X) direction of the thrust generating magnet 54a, and the thrust generating magnet 54b is arranged in the (+Y) direction of the thrust generating magnet 54a, by providing a thrust acting in the (+X) direction to the thrust generating magnet 54a and 54d, and providing a thrust acting in the (−X) direction to the thrust generating magnets 54b and 54c, the mover 51 can be rotated counterclockwise. The mover 51 can be driven to simultaneously perform translation and rotation.

Therefore, according to the planar motor device 50 of the present invention, a high thrust can be generated, while reducing the power consumption of the armature unit 25, and utilizing the merits of the Lorentz force method that excels in controllability, thrust linearity, and positionability.

In the case of the stage unit 30 of the present invention, as described earlier, the mover 51 is attached to the substrate table 18, which holds the wafer W. Thus, the main controller 20 can control the mover 51 as described above which is in a levitated state via the stage controller 19, so the mover 51 moves integrally with the substrate table 18 and the wafer W, freely within the XY-plane. More particularly, when the mover, in other words, the substrate table 18 is moved in a desired direction by using a desired thrust, the main controller 20 monitors the measurement values of the wafer interferometer 31 (positional information or the velocity information) via the stage control system 19, and obtains the positional relationship between the mover 51 and the stator within the XY-plane. And, the main controller 20 calculates and determines the current value and direction of the current to be supplied to the respective armature coil 38. This is calculated in accordance with the relative positional information obtained and the target position to which the substrate table 18 is to be driven, and then the main controller 20 sends instructions to the stage control system 19. Consequently, the stage control system 19 controls the current value and direction of the electric current to be supplied to the respective armature coil 38, via a current driving unit (not shown in FIGS.). In this case, the main controller 20 also controls the speed of the substrate table 18 in accordance with the distance to the target position.

The main controller 20 may obtain the current value and direction of the current to be supplied to the respective armature coil 38, at each stage of movement, according to the positional information (or velocity information) sent by the wafer interferometer 31. However, when the response time is not sufficient enough, the main controller 20 can obtain the current value and direction of the current to be supplied to the respective armature coil 38 in time-series. In this case, the calculation is performed so that the wafer W draws a desired locus and moves at a desired velocity in a predetermined time period after starting its movement. In such a case, the main controller 20 obtains a deviation from the desired locus at each stage of movement according to the positional information (or velocity information) sent from the wafer interferometer 31. Then, the main controller 20 corrects the current value and direction of the current to be supplied to the respective armature coil 38, as well as calculate the time-series data of current value and direction to each coil for a predetermined period after the correction. The stage system 19 then repeats the current control of the armature coil 38 according to the corrected information.

Next, the exposure operation of the exposure apparatus 100 including the stage unit 30 is briefly described.

First, a reticle R, on which a pattern to be transferred is formed, is loaded onto the reticle stage RST by a reticle loader. Similarly, a wafer W to be exposed is loaded onto the substrate table 18 by a wafer loader.

At this point, the substrate table 18 is supported by air levitation at a predetermined wafer loading position on the base 21. The main controller 20 servo controls the substrate table 18 via the stage system 19 based on the measurement value of the wafer interferometer, so that the substrate table 18 stays positioned at the loading position for a predetermined period of time. When the substrate table 18 is staying at the loading position, the electric current is supplied to the respective armature coil 38 of the stator 60 of the planar motor device 50. Accordingly, the main controller 20 cools the respective armature coil 38 via the cooling device 79 so as to prevent the temperature of the armature coil 38 from rising due to the heat generated.

In this case, in the embodiment, a coolant is supplied into a small chamber (that is, a space defined by the ceramic case 36 and the stator yoke 43), in which the armature coil 38 is housed, from the bottom-surface side of the armature coil 38. The coolant flows from the central space of the armature coil 38 to a surrounding space along the upper surface of the armature coil 38. Therefore, heat flowing from the top and side surfaces of the armature coil 38 can be relieved. When the coolant flows in the armature coil, the straightening fins 48 integrally arranged within the ceramic case 36 makes the coolant to flow in uniform through the space in the upper surface of each of the armature coil 38. Consequently, the upper and side surfaces of the armature coil 38 can be efficiently cooled. Additionally, such a cooling operation is individually performed in each small chamber.

The coolant also flows into the lower second chamber 42 arranged below the stator yoke 43, and on the lower surface of the stator yoke 43, the secondary cooling fin 48 made of a high thermal conductive material is arranged. Thus, heat flowing out from the lower surface of the armature coil 38 is travels to the secondary cooling fin 48 through the stator yoke 43. Consequently, the heat is removed by the heat exchange between the secondary cooling fin 48 and the coolant.

In the manner described above, the heat flowing from the entire surface of each armature coil 38 is relieved by the coolant as much as possible. Also, in this embodiment, the coolant is supplied from the cooling device 79 through the coolant supplying pipe 92, and a plurality of coolant injecting joints 40 into the base 21. The coolant then flows through a coolant passage provided in the base 21 and cools the respective armature coil 38. The coolant, which temperature rises during this cooling process, is returned to the cooling device 79 through the coolant discharging joint 39 and the coolant discharging pipe 93. The coolant is cooled in the cooling device 79, and again re-cycled into the base 21, in which the coolant cools the respective armature coil 38. That is, since the coolant is repeatedly circulated, the armature coil 38 can be cooled at all times by using an almost constant amount of coolant, making this apparatus economical.

Next the main controller prepares for a reticle alignment and a base line measurement in a predetermined procedure, by using what is called a reticle microscope (not shown in FIGS.), a reference mark plate (not shown in FIGS.) mounted on the substrate table 18, and an alignment detecting system. And by using the alignment detection system, alignment measurement such as EGA (Enhanced Global Alignment) which details are disclosed in the Japan Patent Laid Open No. 61-44429 and the corresponding U.S. Pat. No. 4,780,617, is performed. The disclosures, cited above are fully incorporated by reference herein. During such operations, when the wafer W needs to be moved, the main controller 20 controls the current supplied to the respective armature coil 38 within the stage unit via the stage control system 19 and moves the mover 51 so as to move the wafer W. After completing such alignment measurement, a step-and-scan exposure is performed, in the following manner.

Upon exposure, first of all, the substrate table 18 is moved so that the XY position of the wafer W is positioned at a scanning starting position of the first shot area (first shot). This movement is performed by the main controller 20 controlling the current supplied to the respective armature coil 38 structuring the planar motor device 50 via the stage control system 19, as described above. Simultaneously, the reticle stage RST is moved so that the XY position of the reticle is at a scanning starting position. This movement is performed by the main controller 20 via the stage control system 19 and the reticle driving portion (not shown in FIGS.).

Then, the stage control system 19 synchronously moves the reticle R and the wafer W via the reticle driving portion (not shown in FIGS.) and the planar motor device 50. This is performed in accordance with the XY positional information of the reticle R measured by the reticle interferometer 16, and the XY positional information of the wafer W, which is measured by the wafer interferometer 31. With this synchronized movement of the reticle and the wafer, scanning exposure is performed.

When the transfer of a reticle pattern onto a shot area by scanning exposure controlled as described above is completed, the substrate table 18 is stepped by a distance of one shot area. Then, scanning exposure is performed on the next shot area. The stepping operation and scanning exposure are repeatedly performed in sequence, thus, transferring the necessary number of patterns onto the wafer W.

On alignment operation and scanning exposure, an upward force is generated from the pressurized air that is supplied from an air pump 59 and released toward the upper surface of the base 21 through the air pad 61 to support the mover 51 by air levitation.

Also, during alignment and scanning exposure, since electric current is suitably supplied to the respective armature coil 38 structuring the stator 60 of the planar motor device 50, the armature coil 38 is cooled, as is with the case during wafer loading operation. The main controller 20 cools each armature coil 38 via the cooling device 79 so as to prevent the temperature of the coils 38 from rising due to generated heat.

Therefore, with the exposure apparatus 100 according to this embodiment, by using the stage unit 30 having the planar motor device 50 the positioning of the wafer W can be achieved with high accuracy at a high speed. As a consequence, the exposure with high exposure precision can be achieved, improving the throughput.

Also, according to this embodiment, the planar motor device 50 based on electromagnetic force is employed as the driving unit for the substrate table 18. Moreover, the substrate table 18 is integrally levitated and supported with the mover 51 of the planar motor device 50 above the base 21 by the air slider 57. Therefore, mechanical loss due to friction can be avoided, excelling in durability. And, compared with employing the planar motor device based on variable reluctance driving, the power consumption of the air pump for supplying pressurized air to the air slider 57 for supporting the substrate table 18 by air levitation, can be reduced.

Moreover, in this embodiment, the mover 51 and the substrate table 18 can be support by air levitation in a non-contact manner, by switching the airway passage of the passage switching valve 70 arranged in the air slider 57 to upwardly release the pressurized air from the air slider 57. This prevents inconvenience from occurring, for example, preventing the magnetic pole unit 56 from being abruptly attracted in a downward direction by the magnetic attraction force between the magnetic pole unit 56 and the stator yoke 43. And the magnetic pole unit 56 can be easily attached to the air slider 57. Moreover, the reverse exhaustion of air works effectively when detaching the magnetic pole unit 56 from the air slider 57, simplifying the disassembling. Consequently, the stage unit 30 which can be easily assembled and disassembled and which excel in maintainability can be realized.

Furthermore, on the bottom surface of the air slider 57 the air pads 61 and the air pockets 62 which surround the thrust generating magnet 54a to 54d are arranged. Therefore, the magnetic pole unit, and the substrate table 18 can be efficiently levitated. Moreover, a bearing device with high stiffness can be realized. Also, in this embodiment, the guide surface 21a on the side of the stator 60, and the surface opposing the guide surface 21 which is on the air slider 57, that is, the bearing surfaces, are formed of a low thermal expansion ceramic material. Thus, the flatness of both the surfaces can be increased to an extremely high level by lapping, as well as reducing distortion caused by heat. And, a bearing device with high-stiffness which is durable to a high load, is realized.

Furthermore, with to this embodiment, the armature coil 38 of the planar motor device 50 is efficiently cooled, thus, minimizing the thermal influence on the surrounding environment of the apparatus and reducing the power consumption for cooling. Additionally, since the thermal influence on the surrounding environment is minimized, there is little influence of air fluctuation on beams used in the interferometer 31 for measuring the position of the wafer table 18, allowing precise positioning of the wafer and the positioning control. Accordingly, with the exposure apparatus 100 according to this embodiment, position control of the wafer can be accurately performed at a high speed by the stage unit 30 employing the planar motor device 50 based on electromagnetic force. As a result, exposure can be performed with high accuracy, while improving the throughput.

Also, according to this embodiment, since the constituent parts of the base 21 can be attached only from above or from a vertically downwardly direction when it is assembled, it excels in attachability and maintainability of the stator-side components.

And, according to this embodiment, the exposure apparatus 100 is made so that high-precision high-speed positioning control of the wafer can be performed, as well as exposure with high accuracy while improving the throughput. The apparatus can be made by performing overall coordination (such as electrical adjustment, and performance test) after the constituent elements of the planar motor device 50, the illumination system 10, and the projection optical system PL illustrated in FIG. 1 are electrically, mechanically, or optically connected and assembled. Preferably, the making of the exposure apparatus 100 is to be performed in a clean room in which conditions such as the temperature and the degree of cleanliness are controlled.

Next, the manufacturing of a device by using the exposure apparatus and method according to this embodiment is described.

Figure 37:
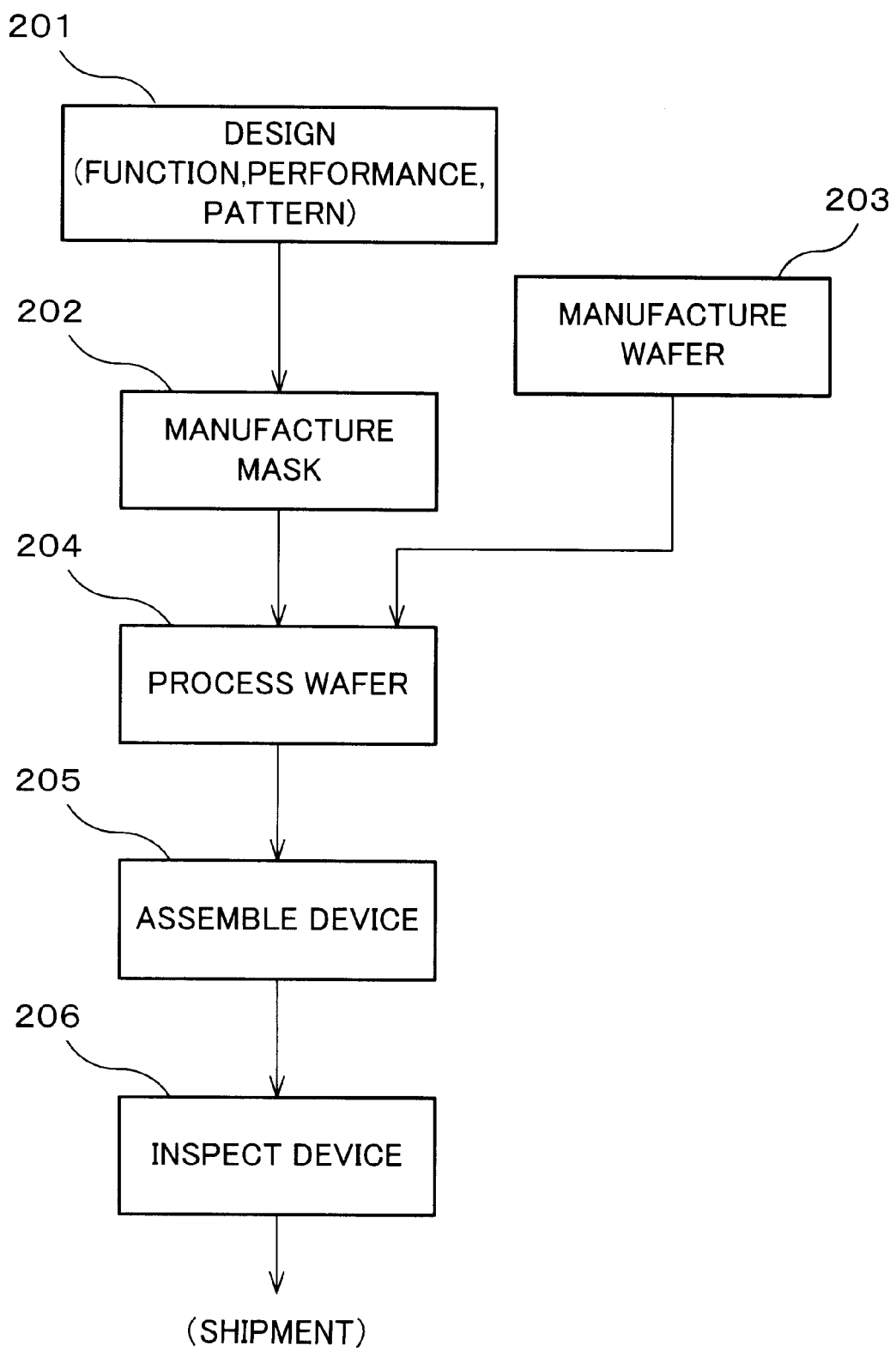
FIG. 37 is a flow chart explaining a device manufacturing method employing the exposure apparatus illustrated in FIG. 1.

FIG. 37 is a flow chart showing an example of manufacturing a device (a semiconductor chip such as an IC or LSI, a liquid crystal panel, a CCD, a thin magnetic head, a micromachine, or the like). As shown in FIG. 37, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like are formed on the wafer by lithography or the like using the mask and wafer prepared in steps 201 to 203, as will be described later. In step 205 (device assembly step), a device is assembled by using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 38:
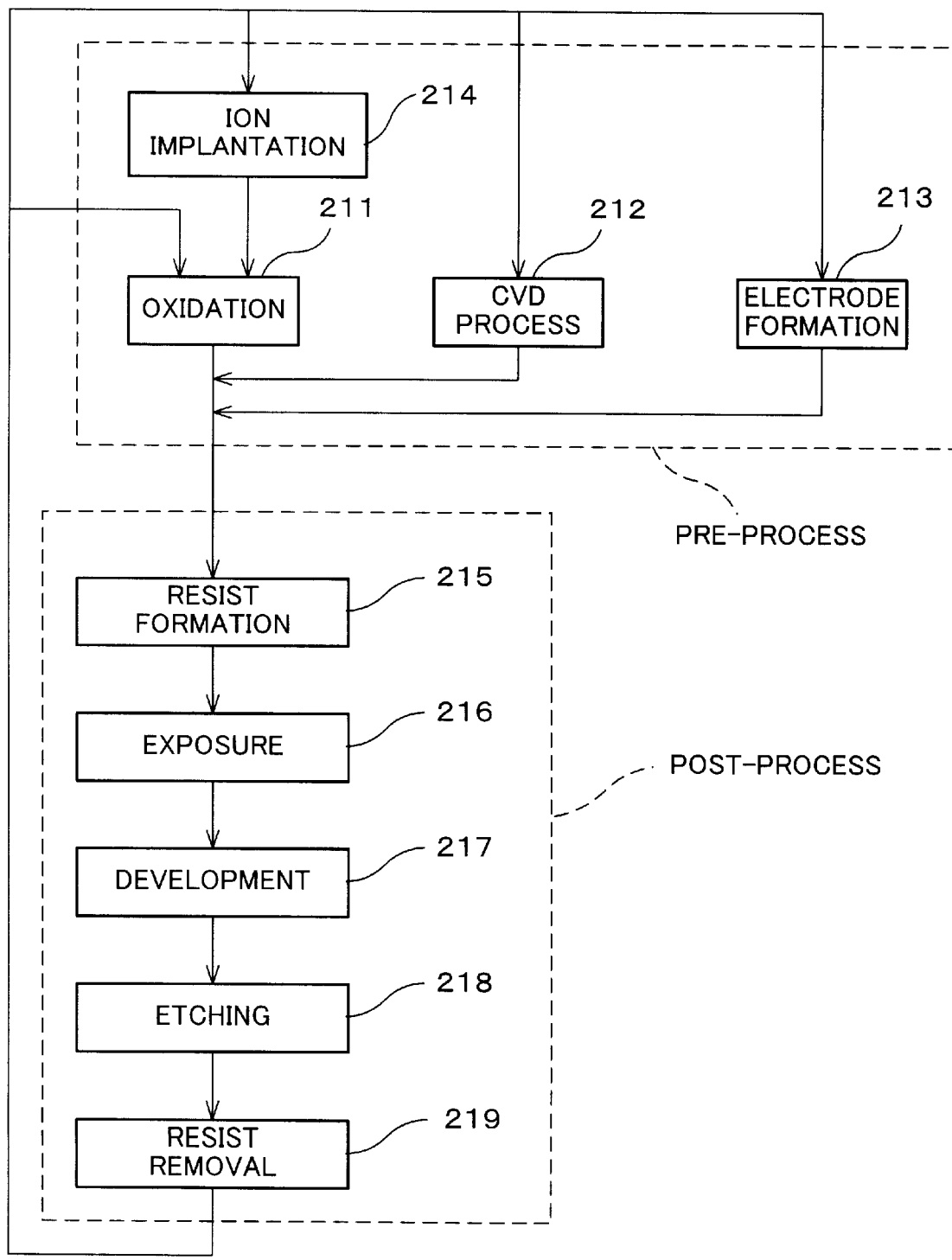
FIG. 38 is a flow chart showing the process of a wafer processing step (step 204) in FIG. 37.

FIG. 38 is a flow chart showing a detailed example of step 204 described above in manufacturing the semiconductor device. Referring to FIG. 38, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transcribed onto the wafer by the above exposure apparatus and method. Then, in step 217 (developing step), the exposed wafer is developed. In step 218 (etching step), an exposed member on a portion other than a portion where the resist is left is removed by etching. Finally, in step 219 (resist removing step), the unnecessary resist after the etching is removed.

By repeatedly performing these pre-process and post-process, multiple circuit patterns are formed on the wafer.

As described above, this makes it possible to manufacture devices with fine patterns with high accuracy, with a high productivity.

In this embodiment, the case of utilizing the reverse exhaustion of the pressurized air supplied from the air slider 57 when the magnetic pole unit 56 is attached to and detached from the air slider 57 has been described, that is, the air slider 57 has an attachment/detachment mechanism by utilizing the pressure of the pressurized air. However, the air slider of the present invention is not limited thereto. The air slider 57 serving as a supporting member may be arranged with an attachment/detachment mechanism to attach the magnetic pole unit 56 to the air slider 57 and to detach the magnetic pole unit 56 from the air slider 57. As this attachment/detachment mechanism, a jack mechanism 82 as illustrated in FIGS. 39A to 39F, is suitable.

Hereinafter, the structure of this jack mechanism 82 is briefly described.

Figure 39A:
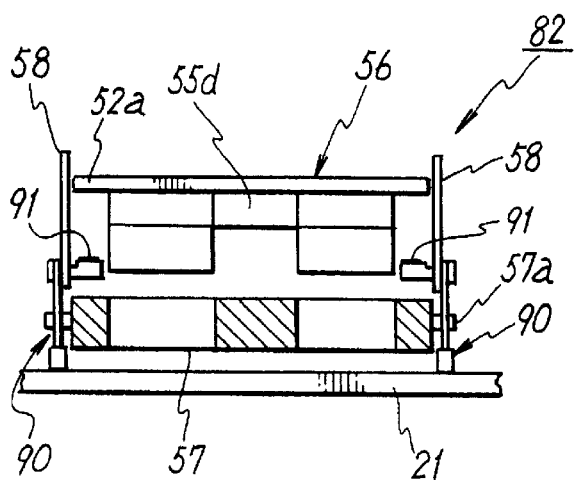
FIG. 39A to 39F are diagrams illustrating a procedure for attaching the magnetic pole unit to the air slider by using a jack mechanism.
Figure 39B:
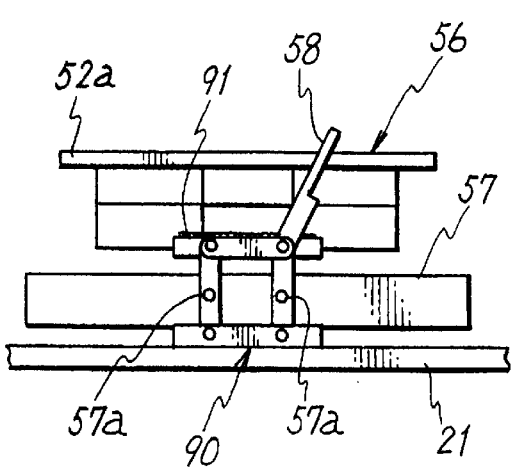

As illustrated in FIGS. 39A and 39B, this jack mechanism 82 has a pair of parallel link mechanism (a parallelogram link mechanisms) 90 respectively fixed to both sides of the air slider 57 via two spindles 57a, and further has a pair of rotatable arms 58 to operate the pair of parallel link mechanism 90. A multiple of rollers 91 are arranged on each of the parallel link mechanisms which is arranged on the upper surface of the inner surface portion of an upper horizontal member, along in the longitudinal direction of the upper horizontal member.

Figure 39C:
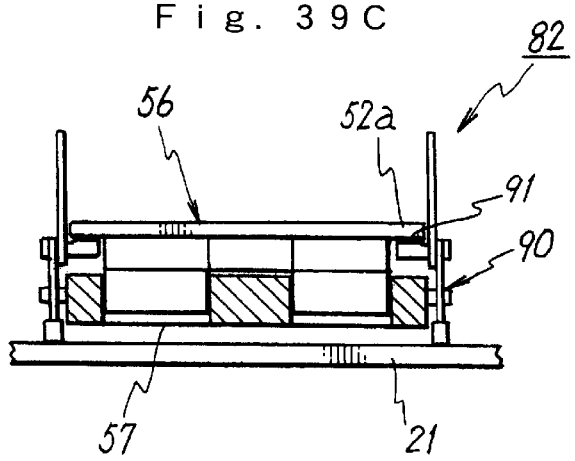
Figure 39D:
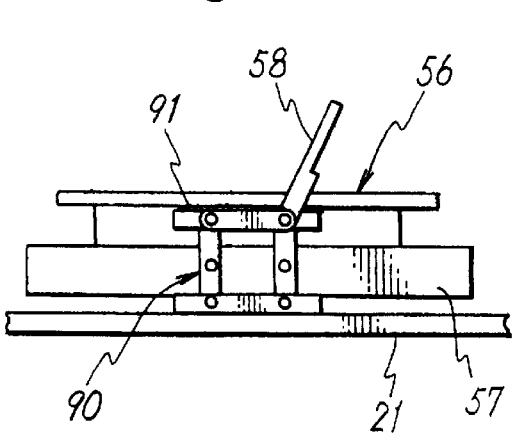

Next, an operation of attaching the magnetic pole unit 56 to the air slider 57 by using this jack mechanism 82 is described. As the initial state of the mechanism 82, as illustrated in FIGS. 39A and 39B, the bottom surface of a lower horizontal member of the pair of parallel link mechanisms (a parallelogram link mechanism) 90 is to be in contact with the base 21, and the air slider 57 mounted on the base 21. In this state, the magnetic pole unit 56 is transferred to a position above the air slider 57. Then, the magnetic pole unit 56 is lowered a predetermined distance. Subsequently, the bottom end portions of the four thrust generating magnet 54a to 54d of the magnetic pole unit 56 are fitted into the openings of the air slider 57 from above. Thus, as illustrated in FIGS. 39C and 39D, the bottom surface of the collar portion (52a) of the magnetic pole unit 56 comes into contact and is supported on the upper surface of the roller 91.

Figure 39E:
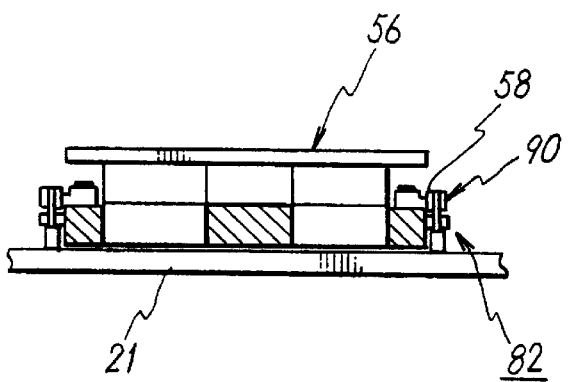
Figure 39F:
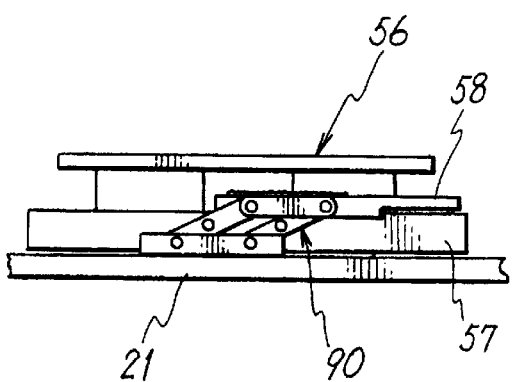

Then, the pair of rotational arms 58 is turned in a direction (clockwise as viewed in FIG. 39B) as far as the horizontal positions. In this state, a stopper (not shown in FIGS.) prevents the rotational arms 58 from being further turned. Thus, when an attempt is made to turn the rotational arms 58 further clockwise, as viewed in FIG. 39B, each inclined member rotates around a shaft 57a being in the center by a rotation moment. In this case, the air slider 57 restricts the movement of the magnetic pole unit 56 in the horizontal direction, so, the roller 91 rotates while sliding along the bottom surface of the collar portion 52a. Consequently, the parallel link mechanisms 90 are gradually deformed into a flat parallelogram shape. As the mechanisms 90 gradually deform, the magnetic pole unit 56 descends, and is finally attached to the air slider 57. And, by further rotating the arms, as illustrated in FIGS. 39E and 39F, the bottom surface of the lower horizontal member of each of the parallel link mechanisms 90 is lifted up to the same height as of the bottom surface of the slider 57. Finally, the bottom surface of the air slider 57 comes into contact with the base 21.

Conversely, to detach the magnetic pole unit 56 from the air slider 57, the rotation arms 58 are turned in a direction so that the magnetic pole unit 56 rises upward. Thus, by using the jack mechanism 82, the attachment and detachment between the magnetic pole unit 56 and the air slider 57 can be performed by simply turning the rotational arms 58. This simplifies the maintenance of the apparatus.

Furthermore, the description of this embodiment describes the case when pressurized air is used as the pressurized gas, however, the present invention is not limited to this.

Figure 40A:
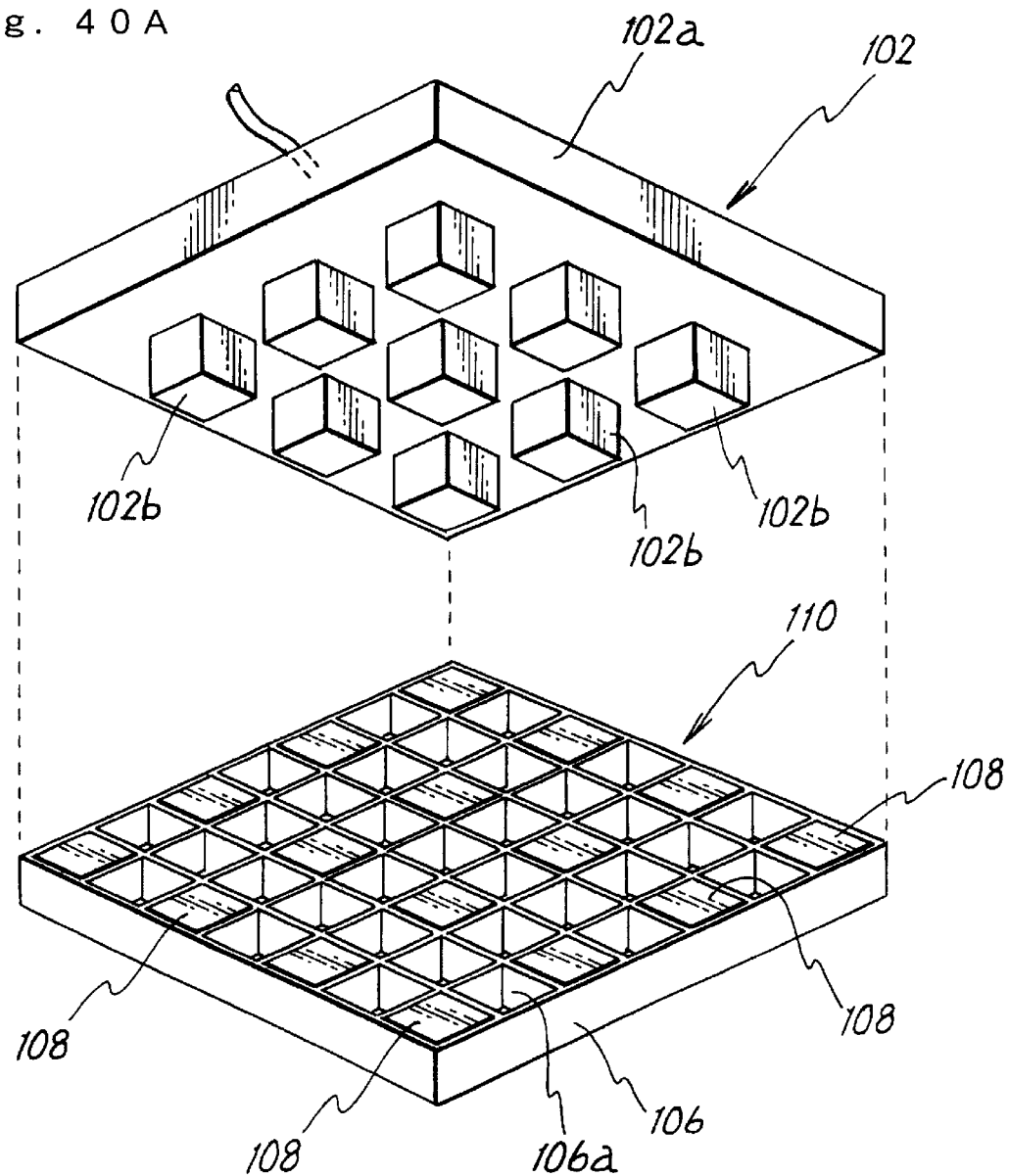
FIGS. 40A and 40B are diagrams illustrating a first modification of a set of the magnetic pole unit and the air slider.
Figure 40B:
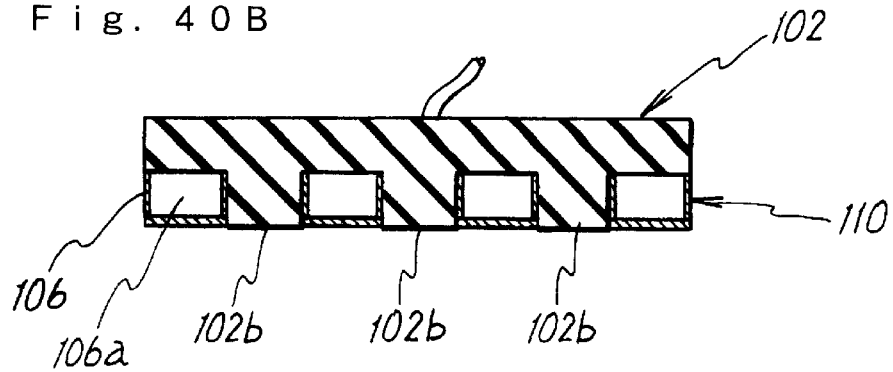

Also, the configuration of the magnetic pole unit and the air slider described in the description are merely an example, and the present invention is not limited to them. For example, as in FIG. 40A, a multiple number (9 in this case) of air pads 102b may be arranged in a shape of a matrix. These air pads 102b may be integrally formed on the bottom surface (namely, the surface facing the stator) of the plate-shaped supporting member 102a and configure the air slider 102. In correspondence with the configuration, the magnetic pole unit 110 may be configured of a lattice-shaped frame member 106 and the thrust generating magnets 108 embedded in every other divided area both in the row and column directions in the lattice-shaped frame member 106. In this case, as illustrated in the sectional view of FIG. 40B, each air pad 102b of the air slider 102 is adapted so as to be fit into a corresponding space 106a, which is a space within the lattice-shaped frame member 106. The respective air pads 102b is fixed to the frame member 106 by adhesive. In a state where the air slider 102 and the magnetic pole unit 110 are integrally formed, when observed in a planar view, the thrust generating magnets 108 are respectively arranged on the four corners of each air pads 102b. In this case, needless to say, in the remaining space portions 106a where the air pads 102b and the thrust generating magnets 108 are not inserted, the interpolating magnets may be embedded in the frame member 106. In this case, as illustrated in FIG. 40B, a bottom wall of the frame member 106 is preferably formed in each of the remaining space portions 106a. Also, the air pad may be formed separately from the supporting member, and be fixed by screwing it onto the supporting member.

Figure 41:
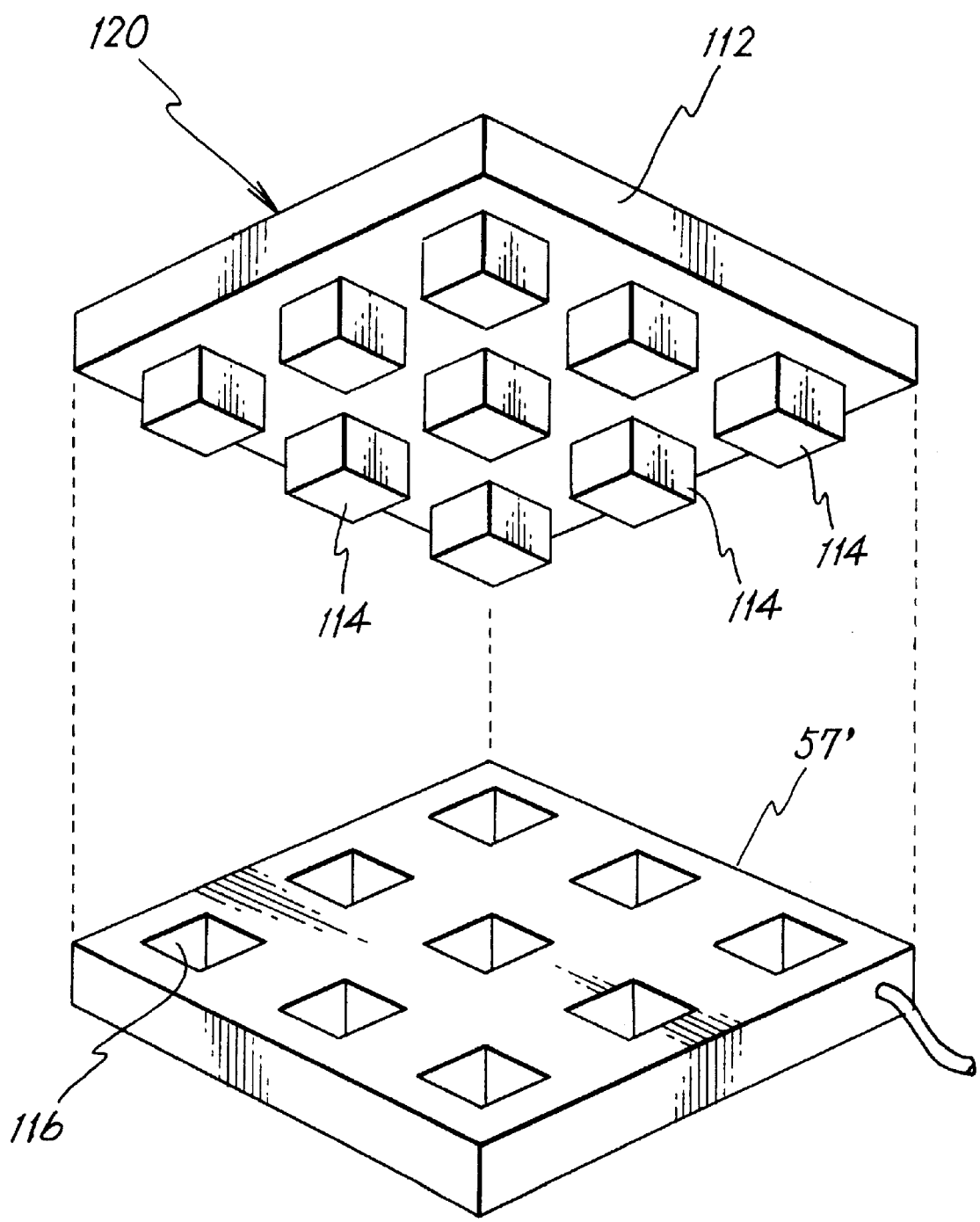
FIG. 41 is a diagram illustrating a second modification of the set of the magnetic pole unit and the air slider.

Alternatively, similar to the case of the embodiment above when the magnetic pole unit is fitted into the air slider from above, as illustrated in FIG. 41, a multiple number (9 in this case) of thrust generating magnets 114 may be arranged in the shape of a matrix. These magnets are fixed onto the bottom surface (the surface opposing the stator) of the plate-shaped magnetic member 112 to structure the magnetic pole unit 120. And, an air slider 57', which is similar to the air slider 57 and has openings 116 arranged which corresponds to the thrust generating magnets 114, may be arranged. The mover may be structured of the magnetic pole unit 120 being fitted into the air slider 57'.

Alternatively, the magnetic pole unit may be of a structure having a single thrust generating magnet with a relatively large area. Corresponding to the unit, the air slider may employ a structure that has a relatively large opening so that the thrust generating magnet can be fitted.

Figure 42A:
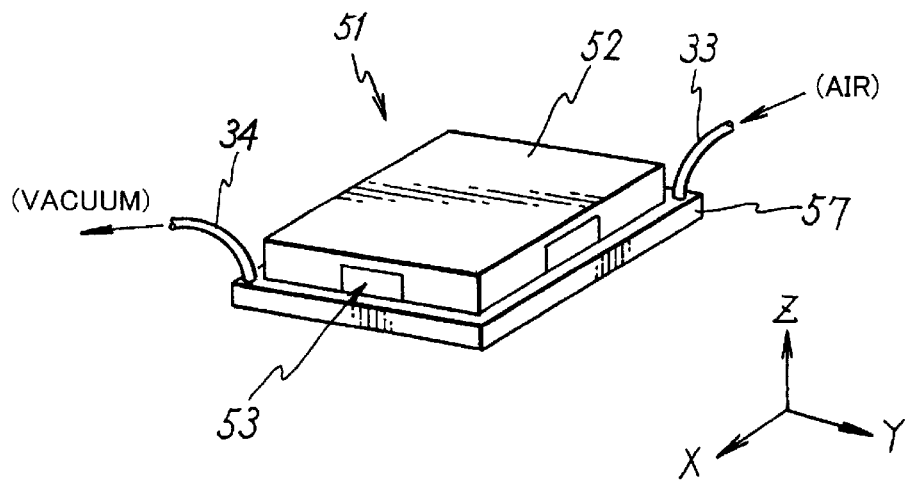
FIGS. 42A and 42B are diagrams illustrating a third modification of the set of the magnetic pole unit and the air slider.
Figure 42B:
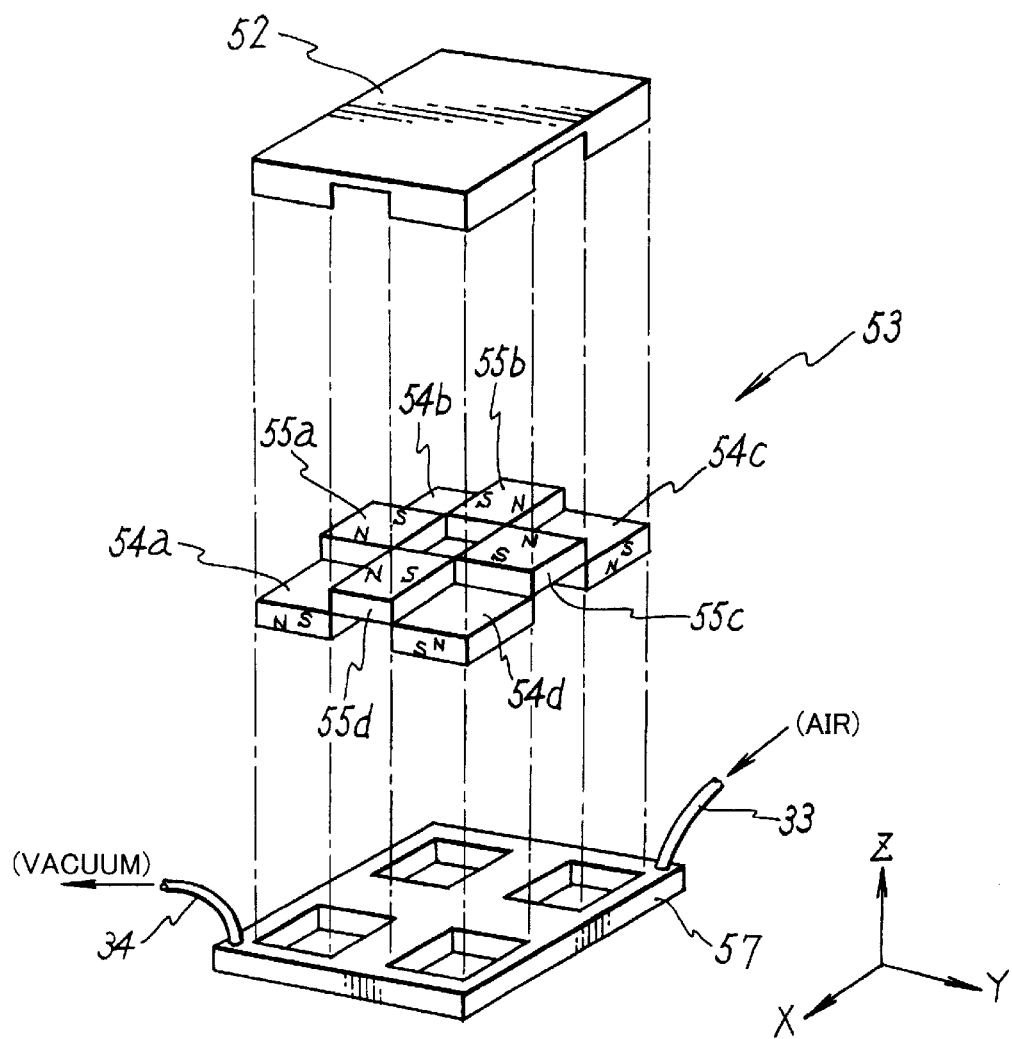

In the description of the embodiment, the case has been described where as a method of supplying the pressurized air to the air slider 57 from the air pump 59, the upper surface concentrated supplying method of supplying the pressurized air from one place on the upper central portion of the air slider 57 is employed. However, the present invention is not limited to this method. The apparatus may employ an upper surface distributed supplying method of supplying the pressurized air from a plurality of places on the upper surface of the air slider, a side surface centralized supplying method of supplying the pressurized air from one place on the side surface, and a side surface distributed supplying method of supplying the pressurized air from a plurality of places on the side surface. For example, an air inlet end and a vacuuming air-discharging end of the pressurized air supplying path may be arranged in the different edges of the upper surface of the air slider 57. The air inlet end and the vacuuming air-discharging end of the pressurized air supplying path are preferably located so as to oppose each other with the central portion of the upper surface of the air slider 57 in between them. FIGS. 42A and 42B illustrate an example of such a case. Furthermore, the air inlet end and the vacuuming air-discharging end of the pressurized air supplying path may be omitted due to air levitation support of the mover 51.

Figure 43A:
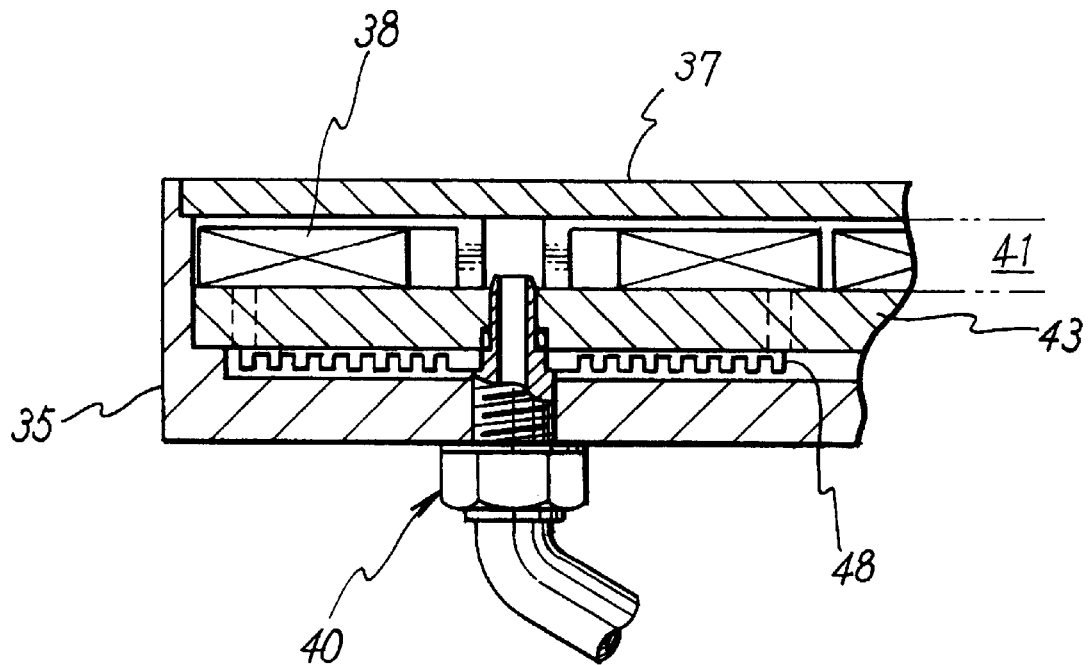
FIGS. 43A and 43B are diagrams illustrating a modification of the base.
Figure 43B:
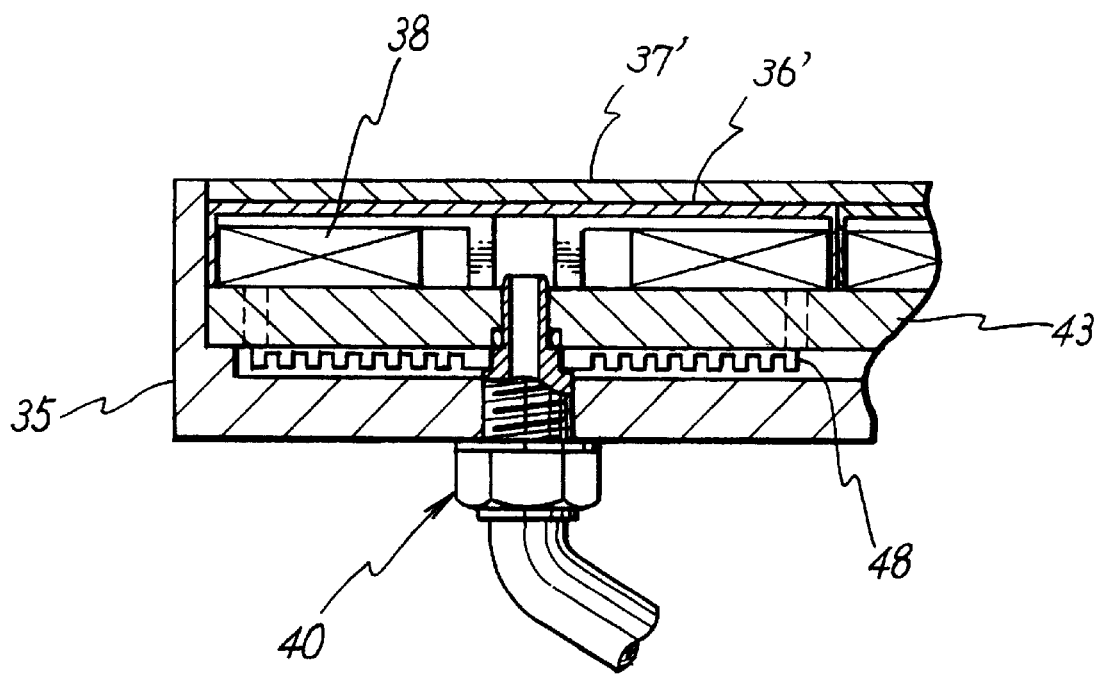

The configuration of the base 21, which has been described in the previous description of the embodiment, is an example, and is not limited to this. FIGS. 43A and 43B illustrate other examples of the base configuration. Of these configurations, the example in FIG. 43A has a first chamber 41 consisting of a side wall of the container 35, a stator yoke 43, and a ceramic plate-shaped member 37 structuring the guide surface. The configuration of FIG. 43B is basically of similar structure to that of the base of the previous embodiment. However, a case having an inner bottom (or upper) surface thinner than that of the embodiment is used as the case 36' for housing each of the armature coil 38, and a plate-shaped non-magnetic member 37' structuring the guide surface is arranged so as to cover the plurality of case 36'.

Furthermore, in the embodiment described above, on the opposite side of the guide surface of the stator yoke 43, the second chamber 42 which have the second cooling fins 48 is arranged. However, the present invention is not limited thereto. That is, a guide surface being formed on one of the surfaces of the base, and in its interior has a closed space where a plurality of armature coils are housed, is sufficient enough, with an inlet and an outlet for coolant arranged within this closed space. From the viewpoint of the cooling efficiency, it is preferable that a coolant supplying opening (or inlet opening) is arranged respectively, corresponding to each armature coils.

Also, in addition to the cooling method of cooling the armature coil 38 described earlier, a cooling method may be employed in which the armature coil 38 is arranged on the stator yoke 43 via a Peltier element, and by supplying electric current to the Peltier element the armature coils 38 may be cooled.

In the embodiment the case of recycling the coolant has been described, however, the present invention is not limited to this. In addition to recycling the coolant, the coolant may be controlled at a predetermined target temperature, and the armature coils may be cooled so that the guide surface is always maintained at an almost constant temperature. In this case, a temperature sensor can be arranged in the base, and the cooling temperature of the coolant may be feedback controlled according to the measurement values of the temperature sensor.

Incidentally, in the embodiment above, the permanent magnets are placed in the mover while the armature coils are provided in the stator, however, the armature coils may be placed in the mover, and the permanent magnets in the stator. Also, in the embodiment, the thrust generating magnets and the interpolating magnets are in linear contact with one another. However, a relatively small gap may exist, or a part of the interpolating magnets may be arranged in the gap between the thrust generating magnets.

And, in the embodiment, the side length of the thrust generating magnets which outer shape is in the shape of a square is set at 4L. However, the side length of the thrust generating magnets may be changed between 4L and 5L, on condition that the arrangement period of the thrust generating magnets is maintained at 6L. In this case, similar to the case of the previous embodiment, the movement of the mover can be controlled by controlling either the current amount supplied to the respective armature coils, or the current direction.

Also, in the embodiment, the air guide mechanism is employed for levitating the mover from the stator. However, instead of this guide mechanism, a magnetic levitation mechanism may be employed. Furthermore, with the magnetic pole unit, instead of using the permanent magnets, an electromagnet adapted to generate lines of magnetic force in directions similar to those in the case of the permanent magnet may be used.

Moreover, with the embodiment, liquid coolant is used for cooling the armature coils, however, as long as it is a fluid that can serve as a coolant, a gas coolant may be used.

Figure 44:
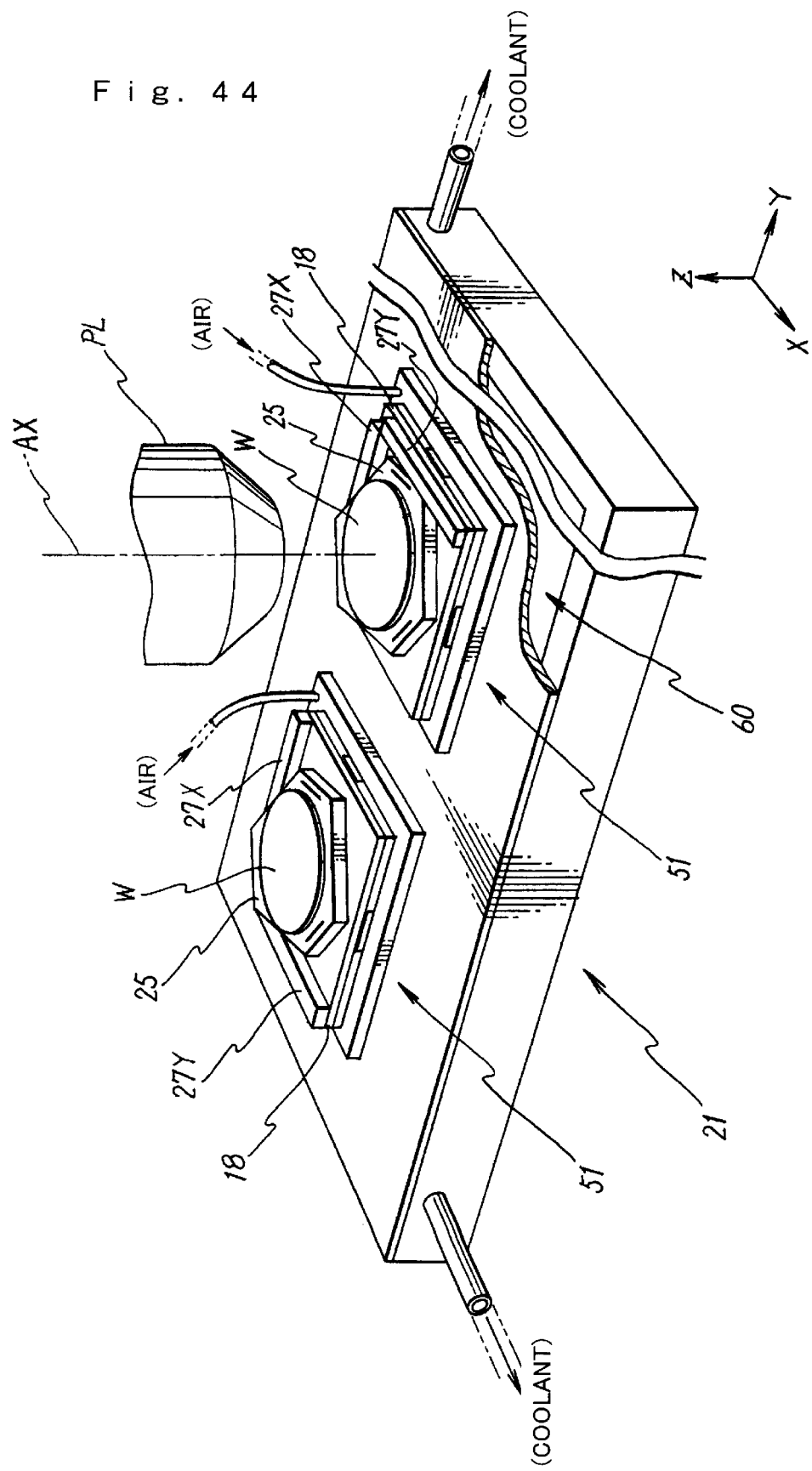
FIG. 44 is a perspective diagram illustrating a modification of the planar motor having two movers.

Additionally, the number of the movers arranged on the stator is not limited to 1. For instance, as illustrated in FIG. 44, two movers 51 may be arranged on a stator 60, in which the movers are driven independently so that exposure can be performed by using one of the movers 51, whereas the delivery of the wafer is performed by the other mover 51.

Also, in the embodiment above, the planar motor and the stage device of the present invention are used for positioning control of the wafer, however, the planar motor and the stage device of the present invention may be used for positioning control of the reticle.

Furthermore, the present invention can be applied to all of wafer exposure apparatuses, such as a reduced projection exposure apparatus using ultraviolet light as a light source, a reduced projection exposure apparatus light in the soft X-ray region which is 10 nm or so in wavelength as a light source, a reduced projection exposure apparatus using X-rays of 1 nm or so in wavelength as a light source, an exposure apparatus using EB (Electron Beams) or ion beams, and an exposure apparatus for liquid crystal displays. Furthermore, the present invention may be applied to the step-and-repeat type apparatus, step-and-scan type apparatus, and step-and-stitch type apparatus. However, in the case when this invention is applied to a reduced projection exposure apparatus light in the soft X-ray region which is 10 nm or so in wavelength as a light source, a reduced projection exposure apparatus using X-rays of 1 nm or so in wavelength as a light source, an exposure apparatus using EB (Electron Beams) or ion beams, where the surrounding environment of the wafer and the like need to be in vacuum, it is preferable to employ the magnetic levitation mechanism.

Further, the planar motor device and the stage device of the present invention can be suitably applied to the apparatus other than exposure apparatus, for example, to inspection apparatus and substrate transferring apparatus.

As described, the planar motor device of the present invention is suitable for generating a high thrust in any direction within a two-dimensional plane, while ensuring high controllability and high thrust linearity.

And, the stage device of the present invention drives the mover by using the planar motor device of the present invention, and thus has excellent controllability, thrust linearity, and positioning ability, and is suitable for moving the mover at a high speed with high thrust.

And, since the exposure apparatus of the present invention performs high precision positioning of the wafer at a high speed by using the stage of the present invention, exposure with high accuracy can be performed while improving the throughput. Consequently, the exposure apparatus of the present invention is suitable for manufacturing devices, which have fine patterns.

While the above-described embodiments of the present invention are the presently preferred embodiments thereof, those skilled in the art of lithography systems will readily recognize that numerous additions, modifications and substitutions may be made to the above-described embodiments without departing from the spirit and scope thereof. It is intended that all such modifications, additions and substitutions fall within the scope of the present invention, which is best defined by the claims appended below.

What is claimed is:

1. A planar motor device comprising:
    an armature unit including a plurality of armature coils arranged in a matrix shape along a guide surface, which have a rectangular current path; and
    a magnetic pole unit arranged opposing said armature unit with respect to said guide surface, which has a plurality of thrust generating magnets having a rectangular magnetic pole surface with a side length longer than an arrangement period of said armature coil and is not equal to an integral multiple of said arrangement period, said plurality of thrust generating magnets arranged in a matrix shape in an arrangement period of an integral multiple of said arrangement period of said armature coils and having a different adjacent polarity of said magnetic pole surface in a row direction and a column direction, and
    said armature unit and said magnetic pole unit relatively move in a direction along the guide surface.

2. A planar motor device according to claim 1, said magnetic pole unit further comprising an interpolating magnet arranged on a magnetic flux path formed on a magnetic pole surface side of said thrust generating magnet opposing said armature unit, said path formed between said thrust generating magnets which are adjacent in said row direction and said column direction, said interpolating magnet being a part of a magnetic circuit, and reinforcing a magnetomotive force.

3. A planar motor device according to claim 1, wherein said thrust generating magnets are arranged in a shape of a two-by-two matrix.

4. A planar motor device according to claim 1, wherein an external shape of a surface of said armature coil which opposes said magnetic pole unit is a square, and said magnetic pole surface of said thrust generating magnets is of a square shape.

5. A planar motor device according to claim 4, wherein
    a current path length on an outer side of said armature coil is respectively around 3 times longer than a current path on an inner side,
    a magnetic pole surface length of one side of said thrust generating magnets is respectively 4 to 5 times longer than said current path on the inner side, and
    said arrangement period of said thrust generating magnets is around 6 times longer than said current path on the inner side.

6. A planar motor device according to claim 1, further comprising a first magnetic member to support said armature coils at a side opposite to said magnetic pole unit.

7. A planar motor device according to claim 1, further comprising a second magnetic member to support said thrust generating magnets at a side opposite to said armature unit.

8. A planar motor device according to claim 1, further comprising at least one guide member arranged between said armature unit and said magnetic pole unit which is made of a material non-magnetic and non-conductive and forms the guide surface.

9. A planar motor device according to claim 8, further comprising a supporting member attached to said magnetic pole unit and has a first vent portion to exhaust a pressurized gas to said guide surface, said supporting member being adapted to support said magnetic pole unit by air levitation via a predetermined air gap.

10. A planar motor device according to claim 9, further comprising a base which includes said guide member and forms a closed space in its interior where said plurality of armature coils are arranged.

11. A planar motor device according to claim 10, further comprising a cooling device which supplies a coolant to said closed space and cools said armature coils.

12. A planar motor device according to claim 9, further comprising a plurality of cases which respectively house said plurality of armature coils.

13. A planar motor device according to claim 12, further comprising a cooling device to respectively cool an interior of said plurality of cases.

14. A planar motor device according to claim 12, wherein an upper surface of said cases respectively structure said guide surface.

15. A planar motor device according to claim 8, further comprising a base which includes said guide member and forms a closed space in its interior where said plurality of armature coils are arranged.

16. A planar motor device according to claim 15, further comprising a cooling device which supplies a coolant to said closed space and cools said armature coils.

17. A planar motor device according to claim 8, further comprising a plurality of cases which respectively house said plurality of armature coils.

18. A planar motor device according to claim 17, further comprising a cooling device to respectively cool an interior of said plurality of cases.

19. A planar motor device according to claim 17, wherein an upper surface of said cases respectively structure said guide surface.

20. A planar motor device comprising:
    an armature unit including a plurality of armature coils arranged in a matrix shape along a guide surface, which have a rectangular current path; and
    a magnetic pole unit arranged opposing said armature unit with respect to said guide surface including
        a plurality of thrust generating magnets which have a rectangular magnetic pole surface and are arranged so as to have a different polarity of an adjacent magnet pole surfaces alternately, and
        an interpolating magnet to reinforce a magnetomotive force, which is arranged on a magnetic flux path formed on a magnetic pole surface side of said thrust generating magnet opposing said armature unit, said path formed between said thrust generating magnets which are adjacent, and
    said armature unit and said magnetic pole unit relatively move in a direction along the guide surface.

21. A planar motor device according to claim 20, wherein an external shape of a surface of said armature coil which opposes said magnetic pole unit is a square, and said magnetic pole surface of said thrust generating magnets is of a square shape.

22. A planar motor device according to claim 21, wherein
   a current path length on an outer side of said armature coil is respectively around 3 times longer than
   a current path on an inner side, a magnetic pole surface length of one side of said thrust generating magnets is respectively 4 to 5 times longer than said current path on the inner side, and
   said arrangement period of said thrust generating magnets is around 6 times longer than said current path on the inner side.

23. A planar motor device according to claim 20, further comprising a first magnetic member to support said armature coils at a side opposite to said magnetic pole unit.

24. A planar motor device according to claim 20, further comprising a second magnetic member to support said thrust generating magnets at a side opposite to said armature unit.

25. A planar motor device according to claim 20, further comprising at least one guide member arranged between said armature unit and said magnetic pole unit which is made of a material non-magnetic and non-conductive and forms the guide surface.

26. A planar motor device according to claim 25, further comprising a supporting member attached to said magnetic pole unit and has a first vent portion for exhausting a pressurized gas to said guide surface, said supporting member being adapted to support said magnetic pole unit by air levitation via a predetermined air gap.

27. A planar motor device according to claim 25, further comprising a base which includes said guide member and forms a closed space in its interior where said plurality of armature coils are arranged.

28. A planar motor device according to claim 27, further comprising a cooling device which supplies a coolant to said closed space and cools said armature coils.

29. A planar motor device according to claim 25, further comprising a plurality of cases which respectively house said plurality of armature coils.

30. A planar motor device according to claim 29, further comprising a cooling device to respectively cool an interior of said plurality of cases.

31. A planar motor device according to claim 29, wherein an upper surface of said cases respectively structure said guide surface.

32. A planar motor device comprising:
   a magnetic pole unit which has at least one magnet and moves along a predetermined guide surface in two-dimensional directions;
   a supporting member attached to said magnetic pole unit and has a first vent portion to exhaust a pressurized gas to said guide surface, said supporting member being adapted to support said magnetic pole unit by air levitation via a predetermined gap;
   a stator including a plurality of armature coils arranged at a side opposite to said magnetic pole unit in respect to a guide surface in two-dimensional directions along said guide surface;
   an interferometer system configured to detect a position of said magnetic pole unit; and
   a controller connected to said plurality of armature coils and said interferometer system to move said magnetic pole unit in a first linear direction and a second linear direction, said controller controlling said plurality of armature coils in accordance with the detected position of said magnetic pole unit so as to prevent a movement of said magnetic pole unit in a rotative direction on its axis of said magnetic pole unit.

33. A planar motor device according to claim 32, wherein said magnetic pole unit is freely attachable to and detachable from and said supporting member.

34. A planar motor device according to claim 33, wherein said supporting member has an attachment/detachment mechanism to have said magnetic pole unit attached and detached.

35. A planar motor device according to claim 34, wherein said supporting member comprises a second vent portion which exhausts a pressurized gas to said magnetic pole unit so as to support said magnetic pole unit by air levitation against a downward force when said magnetic pole unit is attached to said supporting member, said downward force acting in a direction of gravity and is a sum of a magnetic attraction force of said magnetic pole unit, said armature coil, and said stator and a weight of said magnetic pole unit itself.

36. A planar motor device according to claim 35, wherein said supporting member further comprises a switching mechanism which switches an exhaustion of a gas between an exhaustion of a pressurized gas from said first vent portion and an exhaustion of a pressurized gas from said second vent portion.

37. A planar motor device according to claim 32, wherein said supporting member further comprises a suction portion to vacuum chuck said supporting member to said guide surface, said supporting member being able to control a dimension of said predetermined air gap by adjusting an exhaustion pressure of said pressurized gas released from said first vent portion and a vacuum suction force of said suction portion.

38. A planar motor device according to claim 32, further comprising a base which forms said guide surface as well as form a closed space in its interior where said plurality of armature coils are arranged.

39. A planar motor device according to claim 38, further comprising a cooling device which supplies a coolant to said closed space and cools said armature coils.

40. A planar motor device according to claim 32, further comprising a plurality of cases which respectively house said plurality of armature coils.

41. A planar motor device according to claim 40, further comprising a cooling device to respectively cool an interior of said plurality of cases.

42. A planar motor device according to claim 40, wherein an upper surface of said cases respectively structure said guide surface.

43. A planar motor device comprising:
   a magnetic pole unit which has at least one magnet and moves along a predetermined guide surface in two-dimensional directions;
   a base which forms said guide surface and has a closed space formed in its interior;
   an armature unit including a plurality of armature coils housed in said closed space of said base which are arranged in two-dimensional directions along said guide surface at predetermined intervals; and
   a cooling device which supplies a coolant into said closed space to respectively cool said armature coils, wherein said closed space formed within said base is divided into a plurality of small chambers which respectively house said armature coils,
      said plurality of small chambers respectively have an inlet opening and an outlet opening to supply said coolant from said cooling device, said small chambers were respectively structured of a plate-shaped member arranged at a side opposite to said guide surface of said plurality of armature coils, and a plurality of box-shaped cases which respectively have an opening on a surface opposing said plate-shaped member and have an opposite side of said surface formed as the guide surface, and an inlet opening and an outlet opening to respectively supply a coolant to said small chambers are formed in said plate-like member in respect to said plurality of cases.

44. A planar motor device according to claim 43, wherein said closed space is divided by a dividing member arranged on an opposite side to said guide surface of said plurality of armature coils into a first chamber where said plurality of armature coils are housed, and a second chamber formed by a remaining space, and an inlet opening and an outlet opening are respectively formed in said dividing member, and a coolant path is formed in said base in which a coolant supplied from said cooling device flows into said first chamber via said inlet opening and then flows out to said second chamber via said outlet opening.

45. A planar motor device according to claim 44, further comprising secondary cooling fins respectively made of a high thermal conductive material and arranged on said path of said coolant which flows out through said outlet opening.

46. A planar motor device according to claim 43, further comprising a plate-shaped non-magnetic member which serves as said guide surface and is arranged so as to cover said plurality of small chambers.

47. A planar motor device according to claim 43, wherein terminals of said armature coils are exposed from an open end of said case, and a socket portion where said terminal is fitted is provided in a corresponding part of said plate-shaped member.

48. A planar motor device according to claim 43, wherein an additional chamber is arranged in an opposite side to said guide surface of said small chambers within said base, and a coolant path is formed in said base in which a coolant supplied from said cooling device flows into said case respectively via said inlet opening and then flows out to said additional chamber via said outlet opening.

49. A planar motor device according to claim 43, further comprising secondary cooling fins respectively made of a high thermal conductive material and arranged on said path of said coolant which flows out through said outlet opening.

50. A planar motor device according to claim 43, wherein said armature coils are respectively a ring-shaped coil with a space formed in its central portion, and said cooling device supplies said coolant to each of said armature coils via said space formed in its central portion from an opposite side of said guide surface of said armature coils.

51. A planar motor device according to claim 50, further comprising straightening fins to regulate a path of said coolant which flows from said space formed in its central portion to its surroundings.

52. A planar motor device according to claim 43, wherein said base has a plurality of coolant injecting joints and at least one coolant discharging joint attached, and said cooling device has an end respectively connected said coolant injecting joint via a coolant supplying pipe, and also has another end connected to said coolant discharging joint via a coolant discharging pipe.

53. A planar motor device comprising:

a magnetic pole unit which has at least one magnet and moves along a predetermined guide surface in two-dimensional directions;

a plurality of armature coils arranged with respect to said guide surface at predetermined intervals in two-dimensional directions along the guide surface at a side opposing said magnetic pole unit;

a plurality of cases which individually house said plurality of armature coils;

an interferometer system configured to detect a position of said magnetic pole unit; and a controller connected to said plurality of armature coils and said interferometer system to move said magnetic pole unit in a first linear direction and a second linear direction, said controller controlling said plurality of armature coils in accordance with the position of said magnetic pole unit so as to prevent a movement of said magnetic pole unit in a rotative direction on its axis of said magnetic pole unit.

54. A planar motor device according to claim 53, further comprising a cooling device to respectively cool an interior of said plurality of cases.

55. A planar motor device according to claim 53, wherein an upper surface of said cases respectively structure said guide surface.

56. A stage device comprising:

a planar motor device, including, an armature unit including a plurality of armature coils arranged in a matrix shape along a guide surface which have a rectangular current path, and a magnetic pole unit arranged opposing said armature unit with respect to said guide surface, which has a plurality of thrust generating magnets having a rectangular magnetic pole surface with a side length longer than an arrangement period of said armature coil and is not equal to an integral multiple of said arrangement period, said plurality of thrust generating magnets arranged in a matrix shape in an arrangement period of an integral multiple of said arrangement period of said armature coils and having a different adjacent polarity of said magnetic pole surface in a row direction and a column direction, wherein said armature unit and said magnetic pole unit relatively move in a direction along the guide surface;

a movable body which moves integrally with one of said magnetic pole unit and said armature unit; and a controller which controls at least one of an amount and direction of electric current supplied respectively to said armature coils of said armature unit.

57. A stage device according to claim 56, further comprising:

a position detecting system which detects a positional relationship between said magnetic pole unit and said armature unit; and said controller controls at least one of said amount and direction of electric current supplied respectively to said armature coils of said armature unit according to a detecting result of said position detecting system.

58. A stage device according to claim 57, wherein said controller specifies respectively an intersection area between a magnetic flux path due to said magnetic unit and said armature coils based on said detection result of said position detecting system, and controls at least one of said amount and direction of electric current supplied respectively to said armature coils according said specified intersection area.

59. An exposure apparatus comprising:

an illumination system which emits an energy beam for exposure; and a stage device which mounts an object to be arranged on a path of the energy beams, wherein said stage device comprises:
  a planar motor device, including,
    an armature unit including a plurality of armature coils arranged in a matrix shape along a guide surface, which have a rectangular current path, and
    a magnetic pole unit arranged opposing said armature unit with respect to said guide surface, which has a plurality of thrust generating magnets having a rectangular magnetic pole surface with a side length longer than an arrangement period of said armature coil and is not equal to an integral multiple of said arrangement period, said plurality of thrust generating magnets arranged in a matrix shape in an arrangement period of an integral multiple of said arrangement period of said armature coils and having a different adjacent polarity of said magnetic pole surface in a row direction and a column direction,
    wherein said armature unit and said magnetic pole unit relatively move in a direction, along the guide surface;
  a movable body which moves integrally with one of said magnetic pole unit and said armature unit; and
  a controller which controls at least one of an amount and direction of electric current supplied respectively to said armature coils of said armature unit.

60. An exposure apparatus according to claim 59, wherein said object is a substrate onto which a predetermined pattern is transferred by exposing said energy beams.

61. A method of making an exposure apparatus, the method comprising:
  providing a planar motor device, including,
    an armature unit including a plurality of armature coils arranged in a matrix shape along a guide surface which have a rectangular current path, and
    a magnetic pole unit arranged opposing said armature unit with respect to said guide surface, which has a plurality of thrust generating magnets having a rectangular magnetic pole surface with a side length longer than an arrangement period of said armature coil and is not equal to an integral multiple of said arrangement period, said plurality of thrust generating magnets arranged in a matrix shape in an arrangement period of an integral multiple of said arrangement period of said armature coils and having a different adjacent polarity of said magnetic pole surface in a row direction and a column direction,
    wherein said armature unit and said magnetic pole unit relatively move in a direction along the guide surface;
  providing a movable body which moves integrally with one of a magnetic pole unit and an armature unit; and
  providing a controller which controls at least one of said amount and direction of electric current supplied respectively to said armature coils of said armature unit.

62. A making method of an exposure apparatus according to claim 61, further comprising:
  providing a position detecting system which detects a positional relationship between said magnetic pole unit and said armature unit.

63. A device manufactured by using an exposure apparatus including:
  an illumination system which emits an energy beam for exposure; and
  a stage device which mounts an object to be arranged on a path of the energy beams, wherein said stage device comprises:
  a planar motor device, including,
    an armature unit including a plurality of armature coils arranged in a matrix shape along a guide surface, which have a rectangular current path, and
    a magnetic pole unit arranged opposing said armature unit with respect to said guide surface, which has a plurality of thrust generating magnets having a rectangular magnetic pole surface with a side length longer than an arrangement period of said armature coil and is not equal to an integral multiple of said arrangement period, said plurality of thrust generating magnets arranged in a matrix shape in an arrangement period of an integral multiple of said arrangement period of said armature coils and having a different adjacent polarity of said magnetic pole surface in a row direction and a column direction,
    wherein said armature unit and said magnetic pole unit relatively move in a direction along the guide surface;
  a movable body which moves integrally with one of said magnetic pole unit and said armature unit; and
  a controller which controls at least one of an amount and direction of electric current supplied respectively to said armature coils of said armature unit.

64. A device manufacturing method including a lithographic process,
wherein said lithographic process uses said exposure apparatus made by a method of making an exposure apparatus, the method of making said exposure apparatus comprising:
  providing a planar motor device, including,
    an armature unit including a plurality of armature coils arranged in a matrix shape along a guide surface, which have a rectangular current path, and
    a magnetic pole unit arranged opposing said armature unit with respect to said guide surface, which has a plurality of thrust generating magnets having a rectangular magnetic pole surface with a side length longer than an arrangement period of said armature coil and is not equal to an integral multiple of said arrangement period, said plurality of thrust generating magnets arranged in a matrix shape in an arrangement period of an integral multiple of said arrangement period of said armature coils and having a different adjacent polarity of said magnetic pole surface in a row direction and a column direction,
    wherein said armature unit and said magnetic pole unit relatively move in a direction along the guide surface;
  providing a movable body which moves integrally with one of a magnetic pole unit and an armature unit; and
  providing a controller which controls at least one of said amount and direction of electric current supplied respectively to said armature coils of said armature unit.

* * * * *